United States Patent
Shinkai et al.

(10) Patent No.: US 10,282,041 B2
(45) Date of Patent: May 7, 2019

(54) SENSOR DEVICE, INPUT DEVICE, AND ELECTRONIC APPARATUS

(71) Applicant: Sony Corporation, Tokyo (JP)

(72) Inventors: Shogo Shinkai, Kanagawa (JP); Hiroto Kawaguchi, Kanagawa (JP); Hiroshi Mizuno, Kanagawa (JP); Taizo Nishimura, Kanagawa (JP); Fumihiko Iida, Kanagawa (JP); Kei Tsukamoto, Kanagawa (JP); Hayato Hasegawa, Kanagawa (JP); Tomoko Katsuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/661,368

(22) Filed: Mar. 18, 2015

(65) Prior Publication Data

US 2015/0277626 A1 Oct. 1, 2015

(30) Foreign Application Priority Data

Mar. 28, 2014 (JP) .................................. 2014-068427

(51) Int. Cl.
*G06F 3/044* (2006.01)
*G06F 1/16* (2006.01)
(Continued)

(52) U.S. Cl.
CPC .......... *G06F 3/044* (2013.01); *G06F 3/04886* (2013.01); *H03K 17/9622* (2013.01); *G06F 2203/04102* (2013.01)

(58) Field of Classification Search
CPC ................. G06F 3/044; G06F 3/04886; G06F 2203/04102; H03K 17/9622
(Continued)

(56) References Cited

U.S. PATENT DOCUMENTS

| 4,687,885 A | 8/1987 | Talmage, Jr. et al. |
| 5,815,141 A | 9/1998 | Phares |

(Continued)

FOREIGN PATENT DOCUMENTS

| EP | 2 544 081 A2 | 1/2013 |
| JP | 63-121219 A | 5/1988 |

(Continued)

OTHER PUBLICATIONS

U.S. Appl. No. 14/644,666, filed Mar. 11, 2015, Katsuhara et al.
(Continued)

*Primary Examiner* — Vinh T Lam
(74) *Attorney, Agent, or Firm* — Wolf, Greenfield & Sacks, P.C.

(57) ABSTRACT

Provided is a sensor device, including: a deformable first surface; a second surface facing the first surface; an electrode board between the first surface and the second surface, the electrode board including a plurality of capacitive elements arranged in a matrix; a support including a first support layer and a second support layer, the first support layer including a plurality of first columns, the second support layer being layered on the first support layer, the support being deformable following deformation of the first surface, the support connecting at least one of the first surface and the second surface to the electrode board; and a conductor layer supported by the support.

20 Claims, 48 Drawing Sheets

(51) Int. Cl.
*G06F 3/041* (2006.01)
*H03K 17/96* (2006.01)
*G06F 3/0488* (2013.01)

(58) Field of Classification Search
USPC ............... 345/173–184; 178/18.01–20.04
See application file for complete search history.

(56) References Cited

U.S. PATENT DOCUMENTS

| | | | |
|---|---|---|---|
| 6,094,981 | A | 8/2000 | Hochstein |
| 6,708,564 | B2 | 3/2004 | Ishikawa et al. |
| 6,979,873 | B2 | 12/2005 | Fujii |
| 7,249,509 | B2 | 7/2007 | Hirano |
| 7,513,154 | B2 | 4/2009 | Ino |
| 7,603,903 | B2 | 10/2009 | Ohta |
| 8,063,886 | B2 | 11/2011 | Serban et al. |
| 8,225,660 | B2 | 7/2012 | Sakai et al. |
| 8,256,288 | B2 | 9/2012 | Matsunaga |
| 8,826,734 | B2 | 9/2014 | Ohkoshi et al. |
| 8,913,031 | B2 | 12/2014 | Honda et al. |
| 9,310,200 | B2 | 4/2016 | Kabasawa et al. |
| 9,785,297 | B2 | 10/2017 | Kawaguchi et al. |
| 9,811,226 | B2 | 11/2017 | Itaya et al. |
| 10,055,067 | B2 | 8/2018 | Shinkai et al. |
| 10,115,543 | B2 | 10/2018 | Katsuhara et al. |
| 2003/0127308 | A1 | 7/2003 | Chen et al. |
| 2003/0154787 | A1 | 8/2003 | Yoshiuchi et al. |
| 2004/0096594 | A1 | 5/2004 | Takeuchi et al. |
| 2005/0217373 | A1 | 10/2005 | Ishikawa et al. |
| 2006/0147701 | A1 | 7/2006 | Lockridge |
| 2007/0044557 | A1 | 3/2007 | Takemasa et al. |
| 2007/0229464 | A1 | 10/2007 | Hotelling et al. |
| 2008/0180585 | A1 | 7/2008 | Kubota et al. |
| 2008/0202251 | A1 | 8/2008 | Serban et al. |
| 2009/0122026 | A1 | 5/2009 | Oh |
| 2009/0231305 | A1* | 9/2009 | Hotelling ............... G06F 3/0414 345/174 |
| 2009/0256825 | A1* | 10/2009 | Klinghult ............... G06F 3/0412 345/179 |
| 2010/0026659 | A1* | 2/2010 | Long ............... B32B 17/10036 345/174 |
| 2010/0307242 | A1 | 12/2010 | Sakai et al. |
| 2011/0025631 | A1 | 2/2011 | Han |
| 2011/0069036 | A1 | 3/2011 | Anno |
| 2011/0074728 | A1 | 3/2011 | Liu |
| 2011/0090175 | A1 | 4/2011 | Mamba et al. |
| 2011/0115738 | A1* | 5/2011 | Suzuki ............... G01L 1/205 345/173 |
| 2011/0175845 | A1 | 7/2011 | Honda et al. |
| 2011/0181548 | A1 | 7/2011 | Sekiguchi |
| 2011/0212661 | A1 | 9/2011 | Lee et al. |
| 2011/0240989 | A1 | 10/2011 | Sekine et al. |
| 2012/0038583 | A1 | 2/2012 | Westhues et al. |
| 2012/0070614 | A1 | 3/2012 | Takahashi et al. |
| 2012/0086666 | A1 | 4/2012 | Badaye et al. |
| 2012/0098783 | A1 | 4/2012 | Badaye et al. |
| 2012/0098788 | A1 | 4/2012 | Sekiguchi |
| 2012/0113071 | A1 | 5/2012 | Kawaguchi et al. |
| 2012/0218221 | A1 | 8/2012 | Igeta |
| 2012/0235953 | A1* | 9/2012 | Kim ............... G06F 3/044 345/174 |
| 2012/0298497 | A1 | 11/2012 | Maeda et al. |
| 2013/0033450 | A1* | 2/2013 | Coulson ............... G06F 3/044 345/174 |
| 2013/0076994 | A1 | 3/2013 | Kawaura |
| 2013/0234734 | A1 | 9/2013 | Iida et al. |
| 2014/0007682 | A1 | 1/2014 | Kabasawa et al. |
| 2014/0210490 | A1* | 7/2014 | Hayakawa ............... G06F 3/044 324/658 |
| 2014/0299360 | A1 | 10/2014 | Yoshida |
| 2015/0212633 | A1* | 7/2015 | Yamagishi ............... G06F 3/044 345/174 |
| 2015/0241908 | A1* | 8/2015 | Ozyilmaz ............... H01L 41/193 345/174 |
| 2015/0270076 | A1 | 9/2015 | Katsuhara et al. |
| 2015/0280708 | A1 | 10/2015 | Goto et al. |
| 2015/0346839 | A1 | 12/2015 | Kawaguchi et al. |
| 2015/0363023 | A1 | 12/2015 | Kawaguchi et al. |
| 2016/0011691 | A1 | 1/2016 | Shinkai et al. |
| 2016/0023444 | A1 | 1/2016 | Uejukkoku et al. |
| 2016/0026297 | A1 | 1/2016 | Shinkai et al. |
| 2016/0188039 | A1* | 6/2016 | Yoon ............... G06F 3/044 345/174 |
| 2016/0202800 | A1 | 7/2016 | Itaya et al. |
| 2016/0294388 | A1 | 10/2016 | Kawaguchi et al. |
| 2017/0364182 | A1 | 12/2017 | Kawaguchi et al. |
| 2018/0088709 | A1 | 3/2018 | Itaya et al. |

FOREIGN PATENT DOCUMENTS

| | | |
|---|---|---|
| JP | 03-020832 A | 2/1991 |
| JP | 04-125722 A | 4/1992 |
| JP | 2007-272898 A | 10/2007 |
| JP | 2008-181438 A | 8/2008 |
| JP | 2009-123106 A | 6/2009 |
| JP | 2009-169523 A | 7/2009 |
| JP | 2009-211531 A | 9/2009 |
| JP | 2011-065515 A | 3/2011 |
| JP | 2011-154512 A | 8/2011 |
| JP | 2011-170659 A | 9/2011 |
| JP | 2011-175528 A | 9/2011 |
| JP | 2012-133580 A | 7/2012 |
| JP | 2012-178093 A | 9/2012 |
| JP | 2013-015976 A | 1/2013 |
| JP | 2013-105275 A | 5/2013 |
| WO | WO 97/040482 A1 | 10/1997 |
| WO | WO 2013/132736 A1 | 9/2013 |
| WO | WO 2014/125539 A1 | 8/2014 |

OTHER PUBLICATIONS

U.S. Appl. No. 13/069,669, filed Mar. 23, 2011, Sekine et al.
U.S. Appl. No. 13/286,487, filed Nov. 1, 2011, Kawaguchi et al.
U.S. Appl. No. 13/608,048, filed Sep. 10, 2012, Kawaura.
U.S. Appl. No. 13/927,299, filed Jun. 26, 2013, Kabasawa et al.
U.S. Appl. No. 14/665,063, filed Mar. 23, 2015, Goto et al.
U.S. Appl. No. 14/914,405, filed Feb. 25, 2016, Itaya et al.
U.S. Appl. No. 15/694,688, filed Sep. 1, 2017, Kawaguchi et al.
U.S. Appl. No. 16/043,756, filed Jul. 24, 2018, Itaya et al.

* cited by examiner

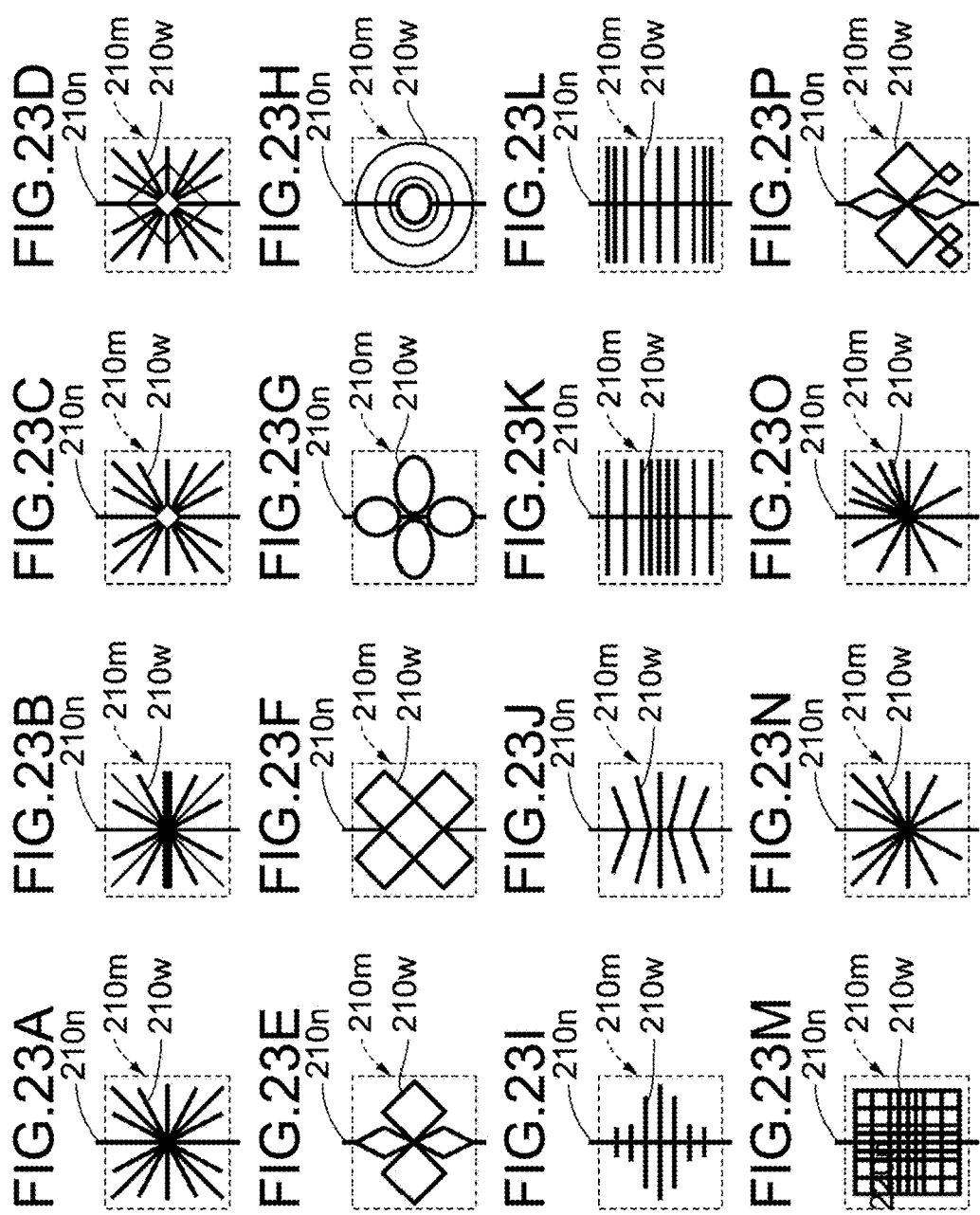

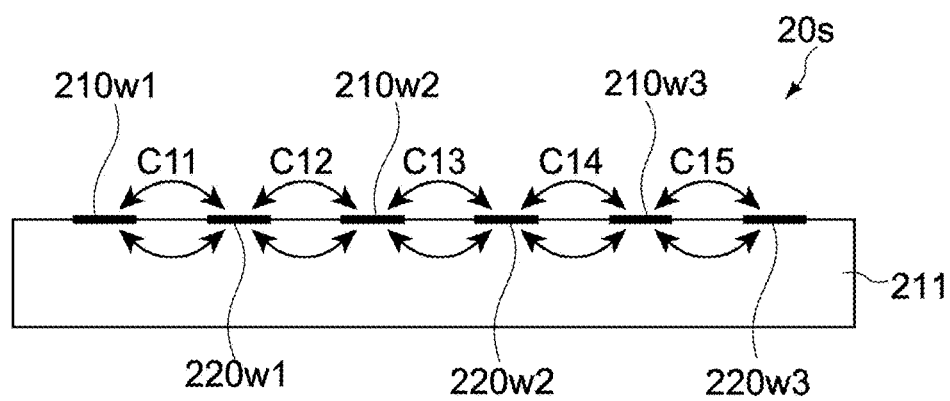
FIG.31
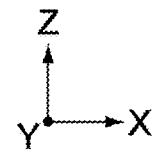

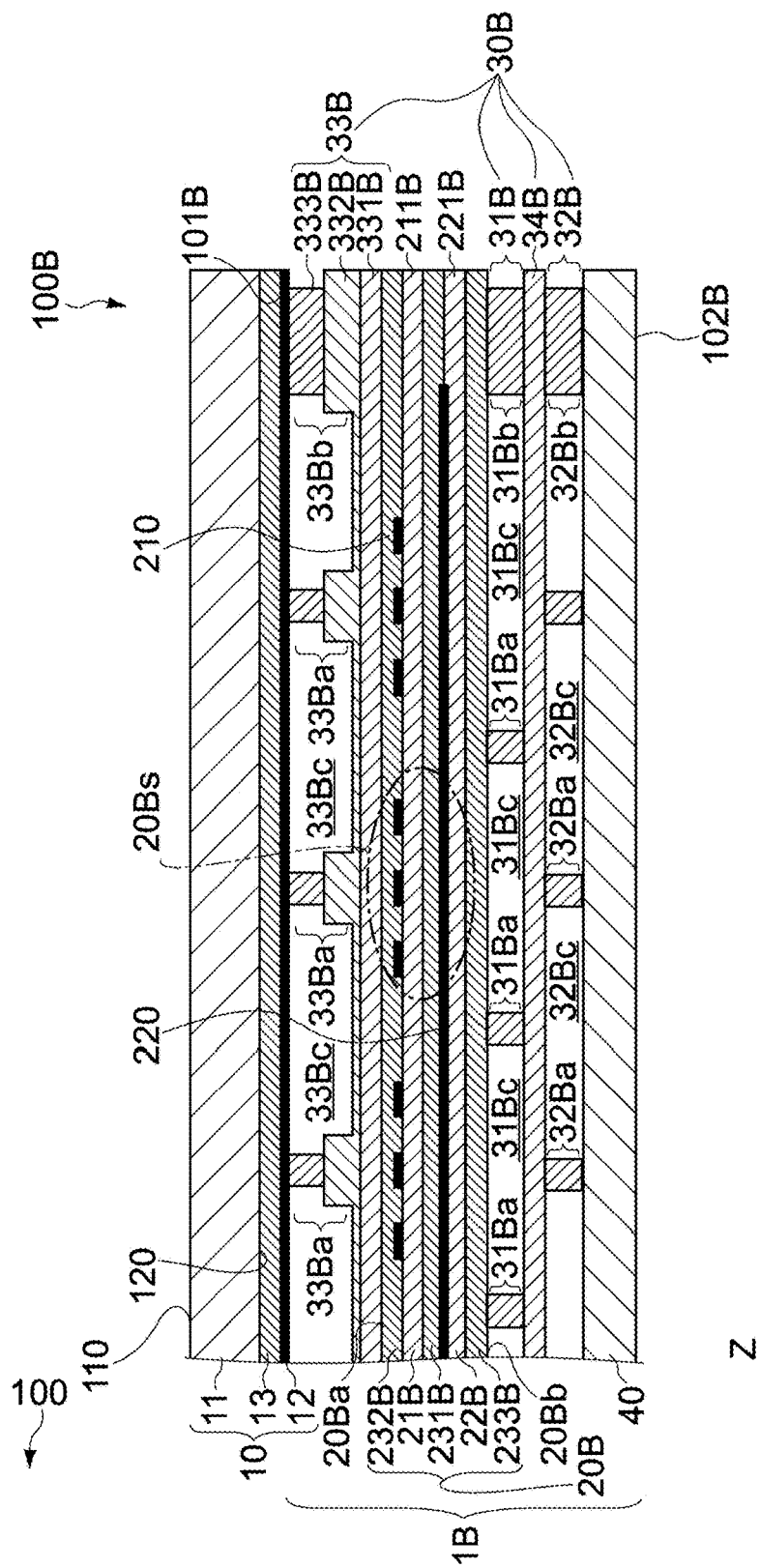

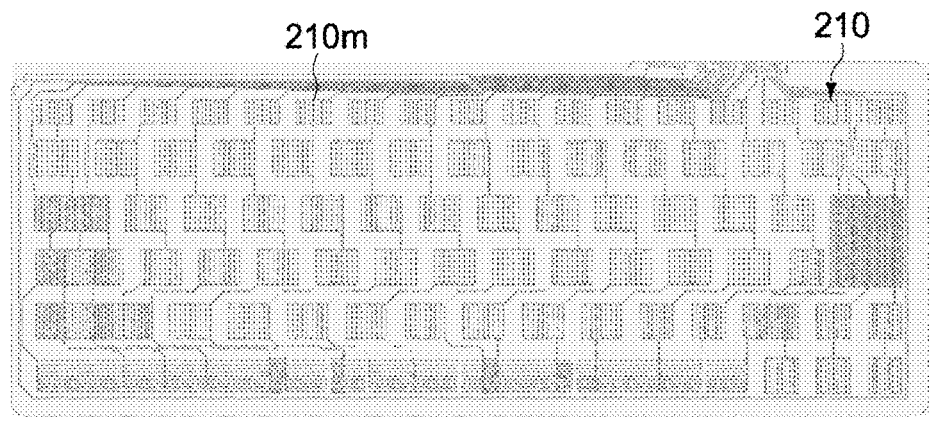
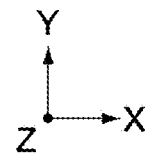
FIG.46A
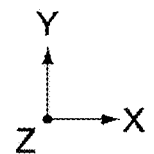
FIG.46B

SENSOR DEVICE, INPUT DEVICE, AND ELECTRONIC APPARATUS

CROSS REFERENCE TO RELATED APPLICATIONS

This application claims the benefit of Japanese Priority Patent Application JP 2014-068427 filed Mar. 28, 2014, the entire contents of which are incorporated herein by reference.

BACKGROUND

The present technology relates to a sensor device including capacitive elements. The present technology further relates to an input device and an electronic apparatus.

For example there is known a sensor device for an electronic apparatus including a capacitive element. When a stylus inputs operation on an operation input surface, the sensor device is capable of detecting the pressed position and the pressing force (for example see International Publication No. WO2013/132736 and Japanese Patent Application Laid-open No. 2011-170659).

SUMMARY

According to a recent user-friendly input method, a user makes gestures by moving his fingers to thereby input operation. If it is possible to detect touch operation, press (push) operation, curvature and distortion of an apparatus due to external forces, and the like with a higher degree of accuracy, a larger variety of input operation may be allowed.

In view of the above-mentioned circumstances, it is desirable to provide a sensor device, an input device, and an electronic apparatus capable of detecting deformation due to external forces with a higher degree of accuracy.

According to an embodiment of the present technology, there is provided a sensor device, including:

a deformable first surface;

a second surface facing the first surface;

an electrode board between the first surface and the second surface, the electrode board including a plurality of capacitive elements arranged in a matrix;

a support including a first support layer and a second support layer, the first support layer including a plurality of first columns, the second support layer being layered on the first support layer, the support being deformable following deformation of the first surface, the support connecting at least one of the first surface and the second surface to the electrode board; and a conductor layer supported by the support.

According to this structure, the support is deformable following deformation of the first surface. Because of this, the distance between a conductive stylus on the first surface, the conductor layer, or the like, and the electrode board may be changed. As a result, the electrode board is capable of detecting deformation of the first surface due to external forces by detecting the amount of change of electrostatic capacitance by using the plurality of capacitive elements. Further, the first support layer includes the first columns. With this structure, external forces applied to the first surface may be transmitted to the second support layer. The support may follow deformation of the first surface better. As a result, the sensor device is capable of detecting deformation of the first surface accurately.

The support may be on the electrode board.

According to this structure, the support is capable of connecting one of the first surface and the second surface, and the electrode board.

Specifically, the support may connect the first surface and the electrode board.

According to this structure, the support is deformable following deformation of the first surface. With this structure, the electrode board is capable of detecting deformation of the first surface easily.

The conductor layer may be deformable.

According to this structure, the conductor layer is deformed following deformation of the first surface. As a result, the distance between the conductor layer and the capacitive elements of the electrode board may be changed. As a result, the electrode board is capable of detecting deformation of the first surface. Further, even if the distance between a stylus or the like, which applies an external force to the first surface, and the first surface is large, or even if an insulator is provided therebetween, the electrode board is capable of detecting deformation of the first surface. As a result, an electronic apparatus or the like including the sensor device has a high degree of freedom for its structure, and operability may be increased.

Further, the conductor layer may include the first surface.

According to this structure, the conductor layer includes the first surface. With this structure, the electrode board is capable of detecting deformation of the first surface accurately.

Alternatively, the conductor layer may be between the first support layer and the second support layer.

According to this structure, the distance between the conductor layer and the capacitive element may be reduced. The electrostatic capacitance thereof may be increased. As a result, sensor sensitivity of the electrode board may be increased.

Further, the sensor device may further include a conductor layer including the second surface, the support may connect the second surface to the electrode board, and the electrode board may be deformable.

According to this structure, the electrode board and the support are deformable following deformation of the first surface. As a result, the distance between the conductor layer and the electrode board may be changed when the first surface is deformed. With this structure, the electrode board is capable of detecting deformation of the first surface.

Further, the second support layer may include a plurality of second columns between the plurality of first columns.

According to this structure, if the first surface above a first column is deformed, the second support layer may be deformed easily. If the second surface above the second column is deformed, the first support layer may be deformed easily. With this structure, the in-plane uniformity of sensor sensitivity may be increased.

Further, the second support layer may include an elastically-deformable portion made of an elastic material.

According to this structure, the second support layer may be deformed easily when an external force is applied to the first surface.

The second support layer may include a structural material and a plurality of holes, the structural material including the plurality of holes.

According to this structure, the second support layer is deformable because of the plurality of holes.

Further, the structural material may be made of a conductive material.

According to this structure, the structural material may have a shield effect. As a result, it is possible to prevent electromagnetic waves from entering the sensor device from the outside and leaking to the outside of the sensor device.

The first support layer and the second support layer may be on the electrode board, the electrode board may be deformable, and the support further may include a third support layer, the third support layer facing the first support layer and the second support layer, the electrode board being interposed between the third support layer and the first and second support layers, the support connecting the first and second surfaces and the electrode board.

According to this structure, the support connects the first and second surfaces and the electrode board. With this structure, when the first surface is deformed, the distance between the first surface and the electrode board may be changed, and the distance between the second surface and the electrode board may be changed. As a result, the electrode board is capable of detecting change of those distances. Sensor sensitivity of the sensor device may be high.

The conductor layer may be between the first support layer and the second support layer, the conductor layer being deformable.

The third support layer may include a plurality of third columns, the plurality of third columns being capable of arranged between the plurality of first columns.

Further, the second support layer may include a plurality of second columns, the plurality of second columns being capable of arranged between the plurality of first columns.

Alternatively, the second support layer may include an elastically-deformable portion made of an elastic material.

Further, the second support layer may include a structural material and a plurality of holes, the structural material including the plurality of holes.

The electrode board may include the second support layer.

According to this structure, the thickness of the sensor device may be reduced.

According to an embodiment of the present technology, there is provided an input device, including:

an operated member including a first surface and a second surface, the first surface receiving operation from a user, the second surface being opposite to the first surface, the operated member being deformable, the operated member being a sheet;

a third surface facing the second surface;

an electrode board between the second surface and the third surface, the electrode board including a plurality of capacitive elements arranged in a matrix;

a support including a first support layer and a second support layer, the first support layer including a plurality of first columns, the second support layer being layered on the first support layer, the support connecting at least one of the second surface and the third surface to the electrode board, the support being deformable following deformation of the operated member; and a conductor layer supported by the support.

According to an embodiment of the present technology, there is provided an electronic apparatus, including:

an operated member including a first surface and a second surface, the first surface receiving operation from a user, the second surface being opposite to the first surface, the operated member being deformable, the operated member being a sheet;

a third surface facing the second surface;

an electrode board between the second surface and the third surface, the electrode board including a plurality of capacitive elements arranged in a matrix;

a support including a first support layer and a second support layer, the first support layer including a plurality of first columns, the second support layer being layered on the first support layer, the support connecting at least one of the second surface and the third surface to the electrode board, the support being deformable following deformation of the operated member;

a conductor layer supported by the support; and a controller including a control unit, the control unit being electrically connected to the electrode board, the control unit being capable of generating information on operation input in the operated member based on output from the electrode board.

As described above, according to the present technology, it is possible to provide a sensor device, an input device, and an electronic apparatus capable of detecting deformation due to external forces with a higher degree of accuracy.

Note that the present technology may not only have the above-mentioned effects but also any effect described in the disclosure.

These and other objects, features and advantages of the present disclosure will become more apparent in light of the following detailed description of best mode embodiments thereof, as illustrated in the accompanying drawings.

Figure 7A:
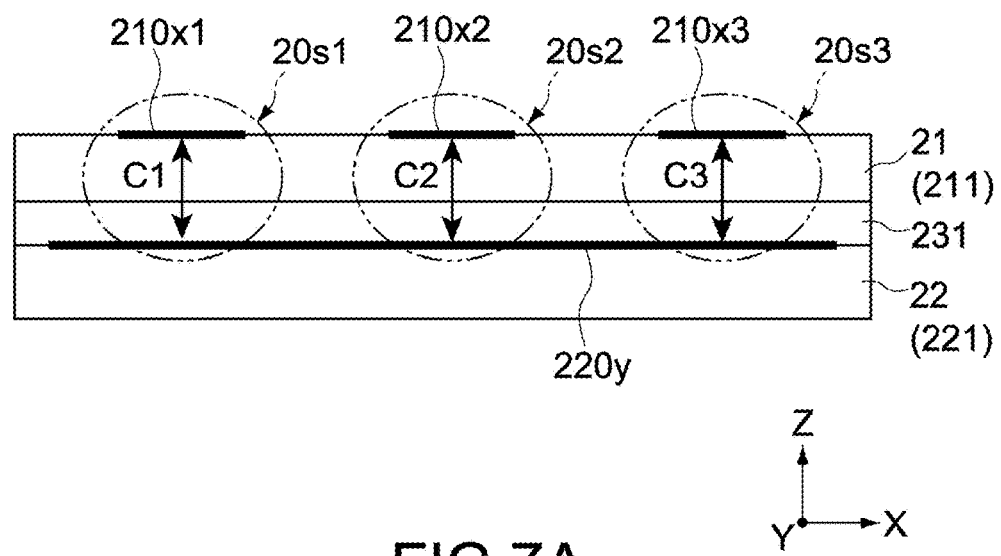
Figure 7B:
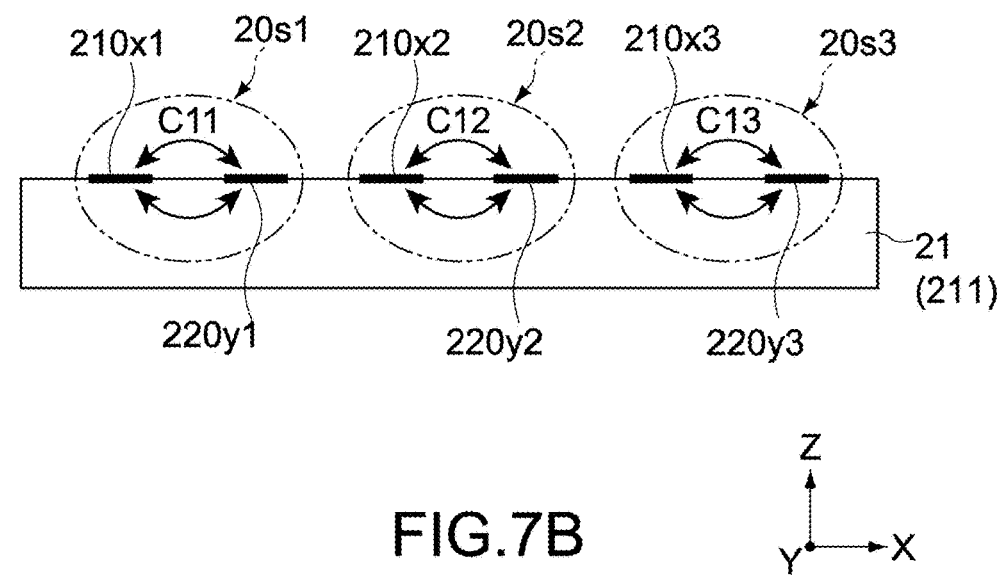
Figure 8:
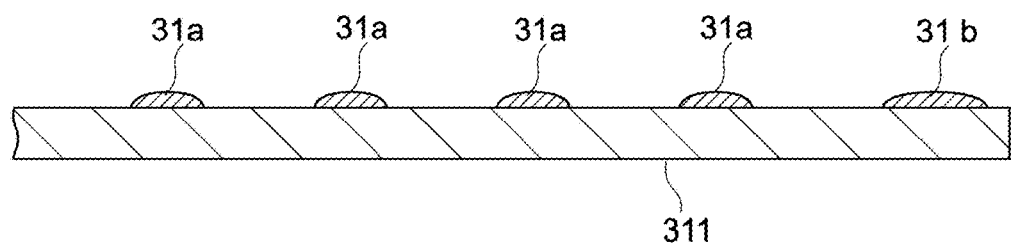
Figure 9A:
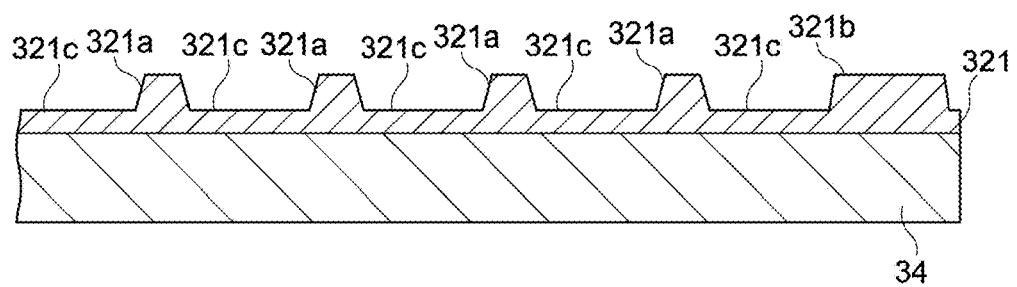
Figure 9B:
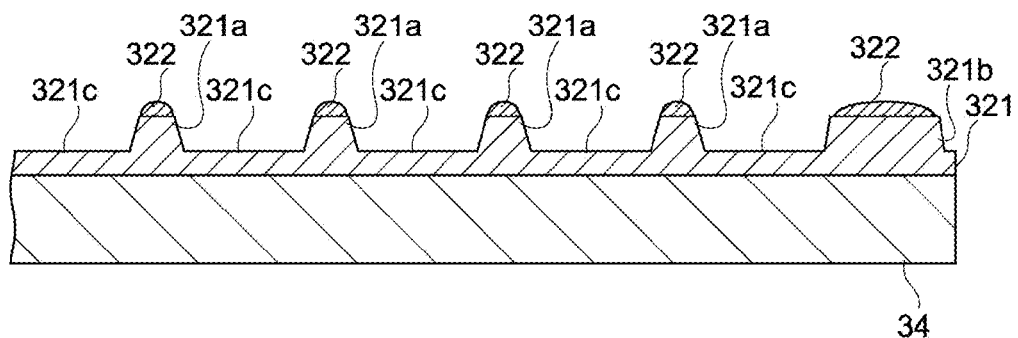
Figure 10A:
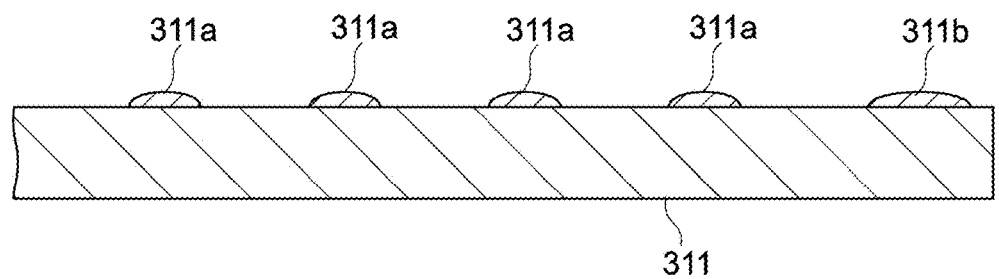
Figure 10B:
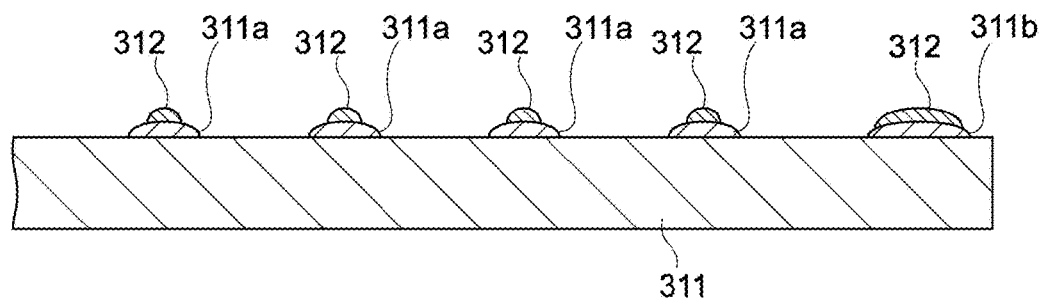
Figure 11A:
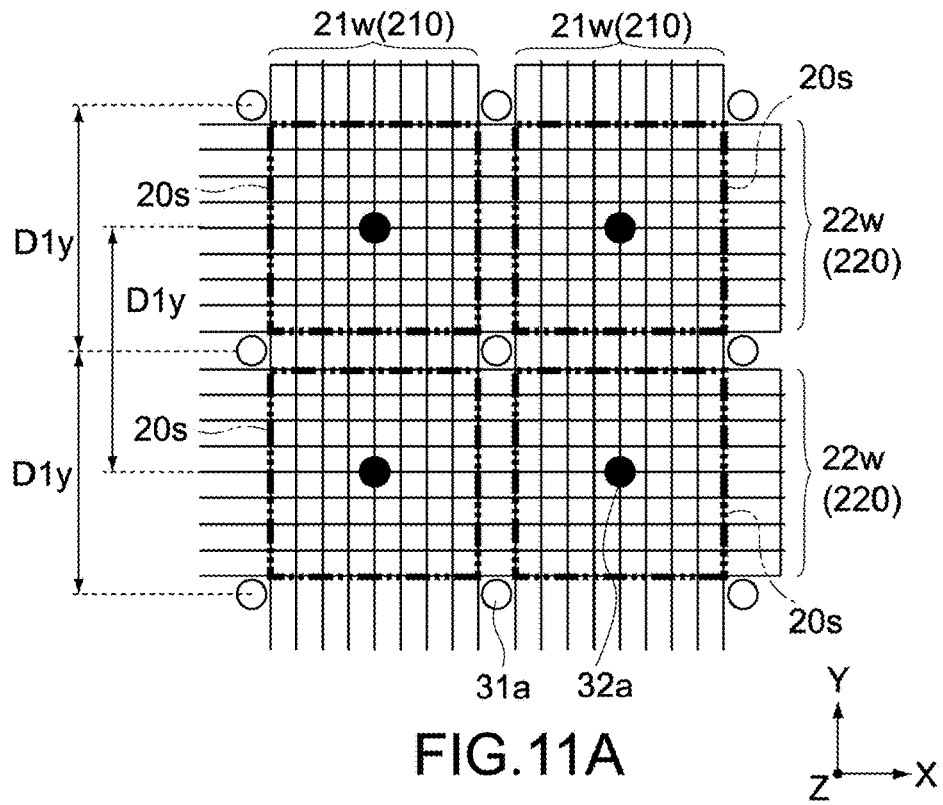
Figure 11B:
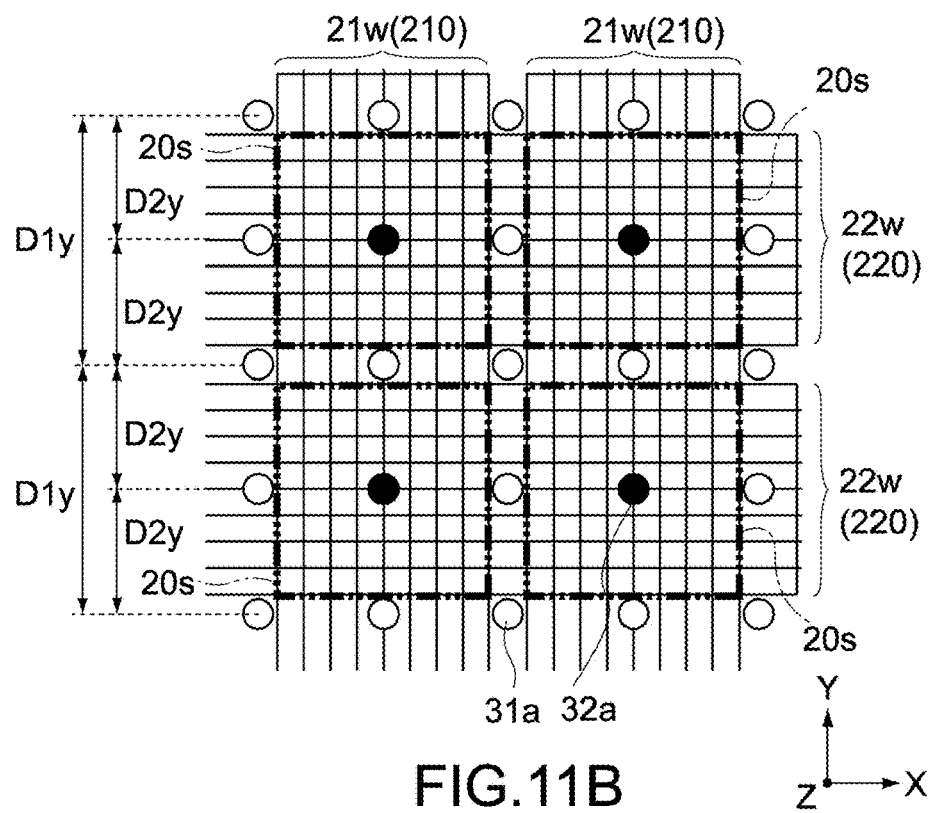
Figure 12A:
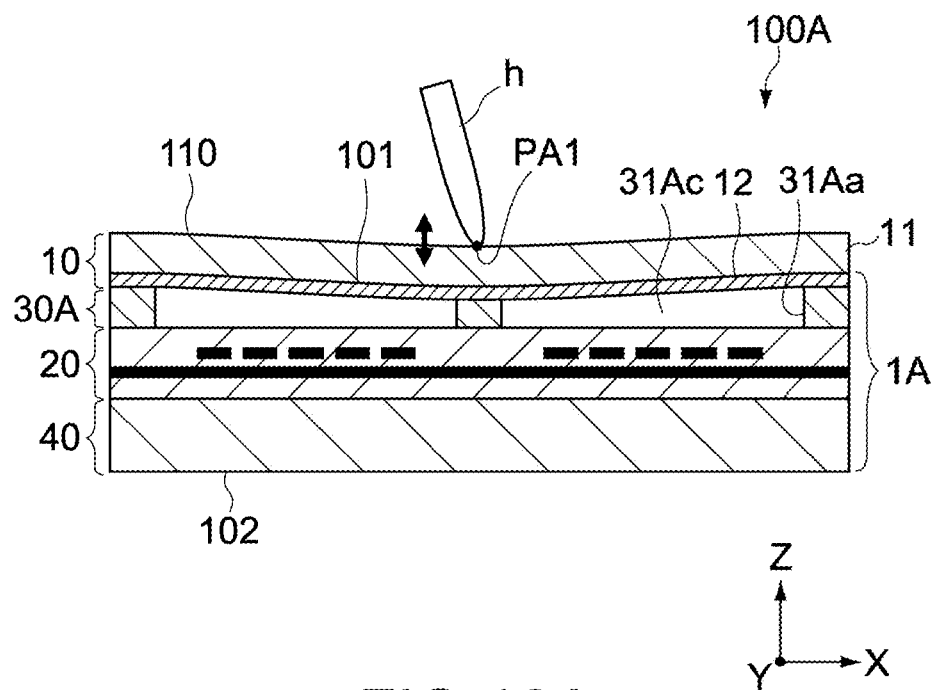
Figure 12B:
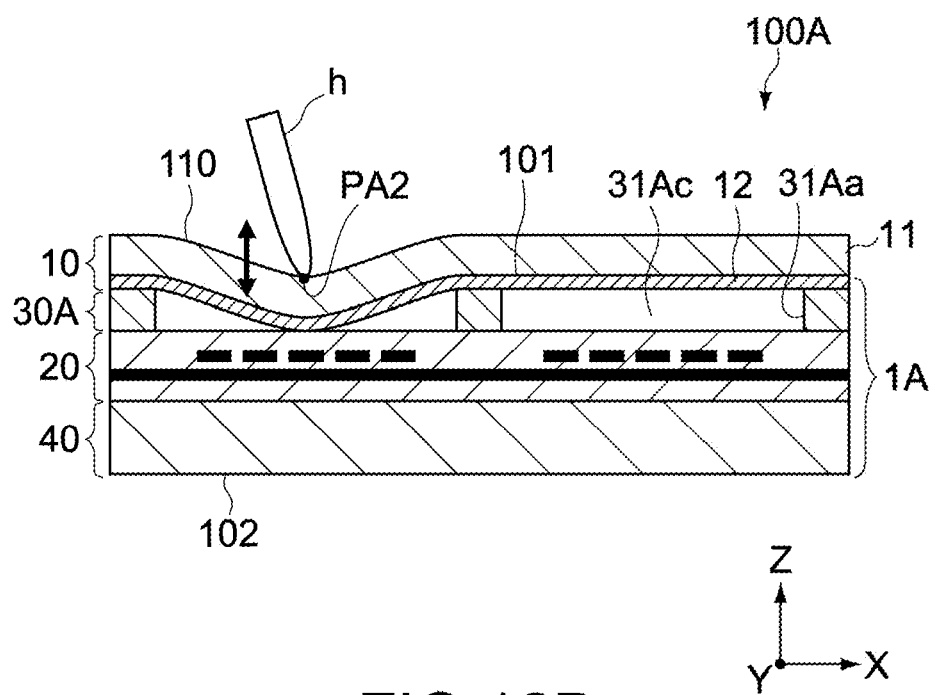
Figure 13A:
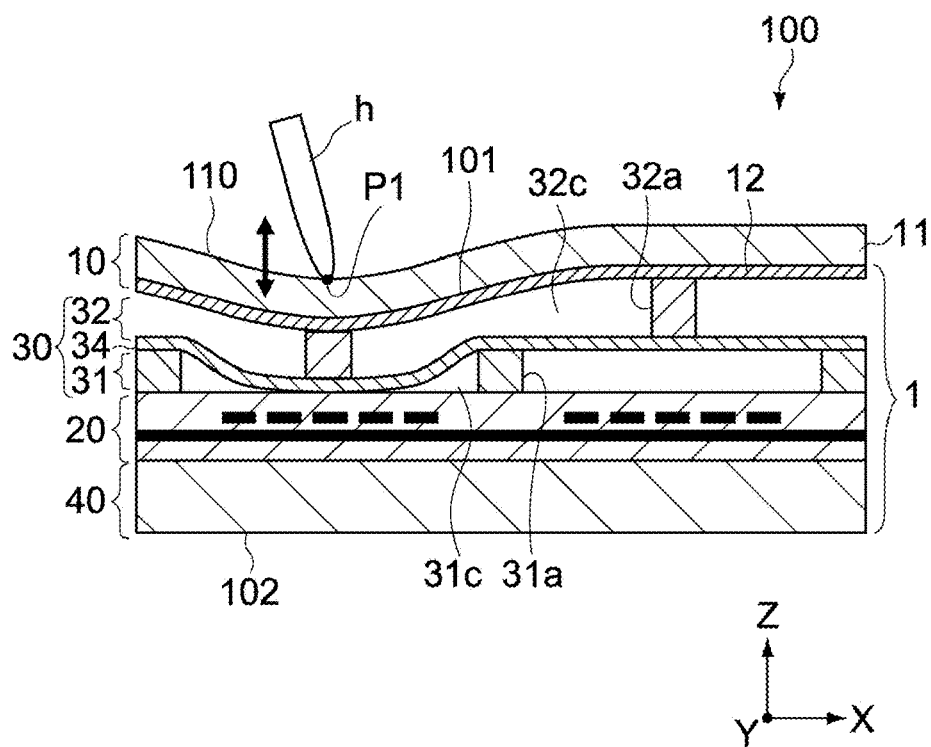
Figure 13B:
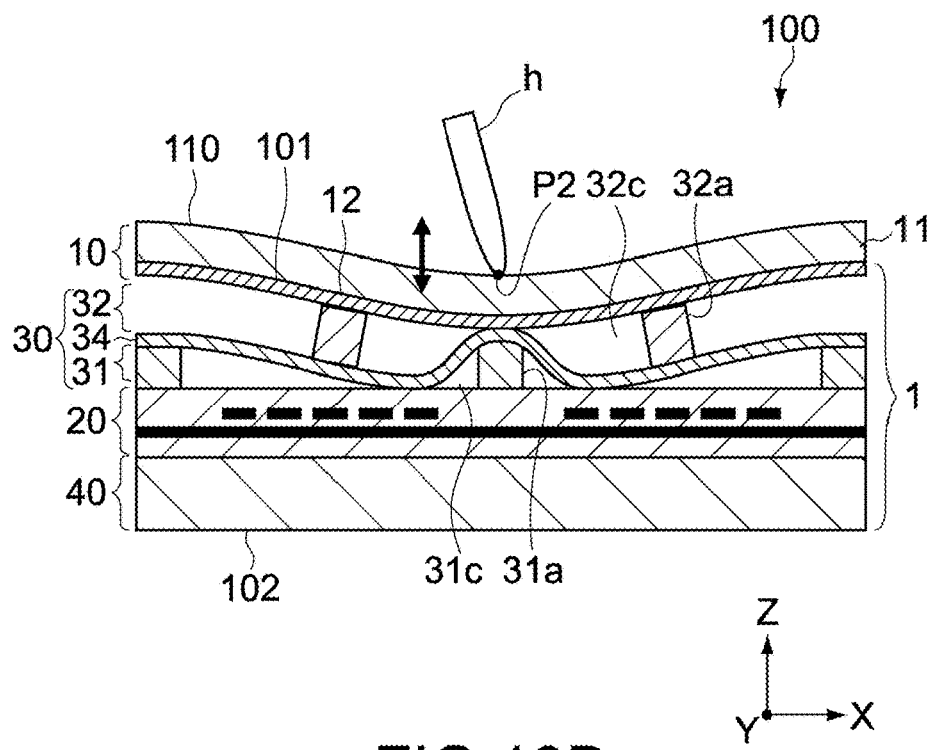
Figure 14A:
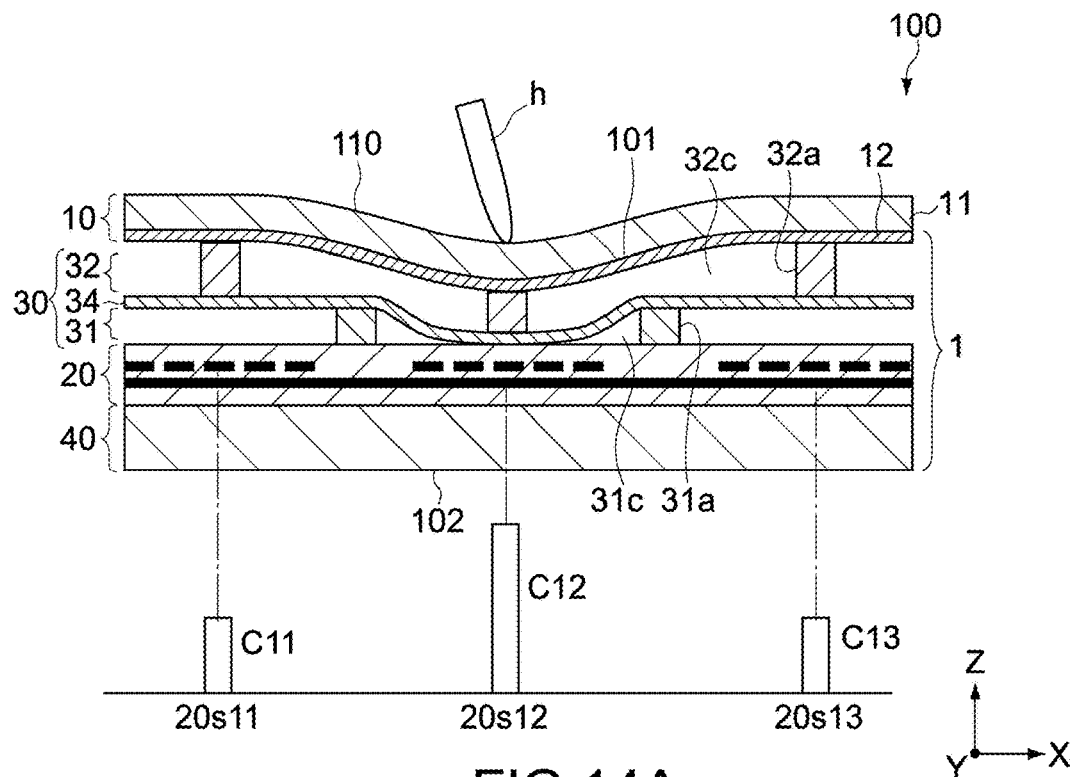
Figure 14B:
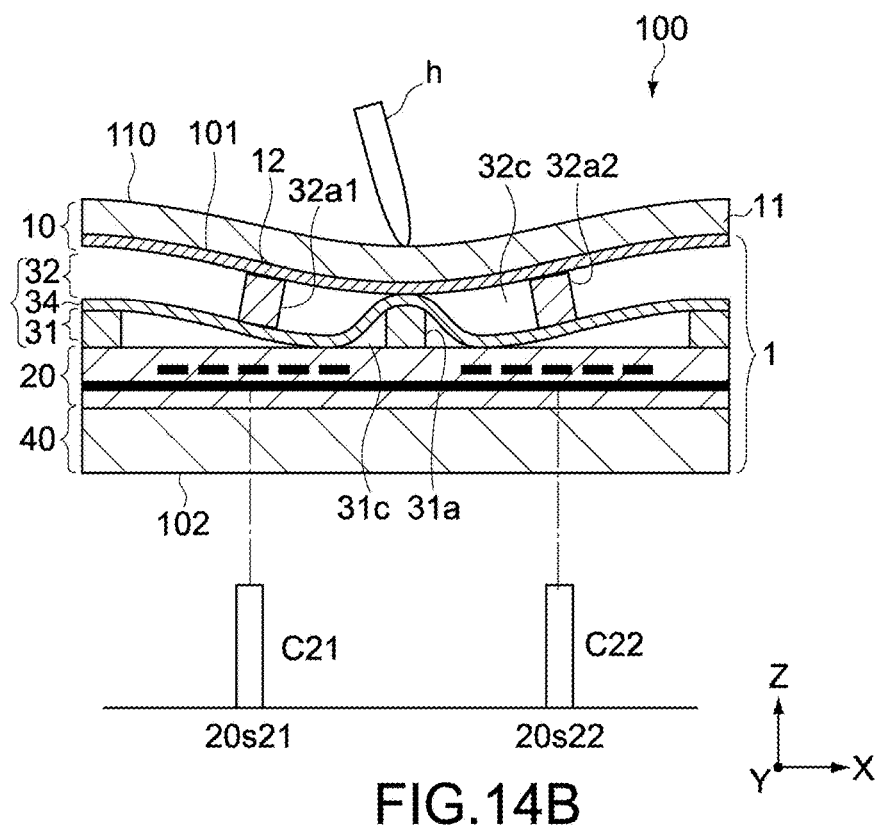
Figure 15A:
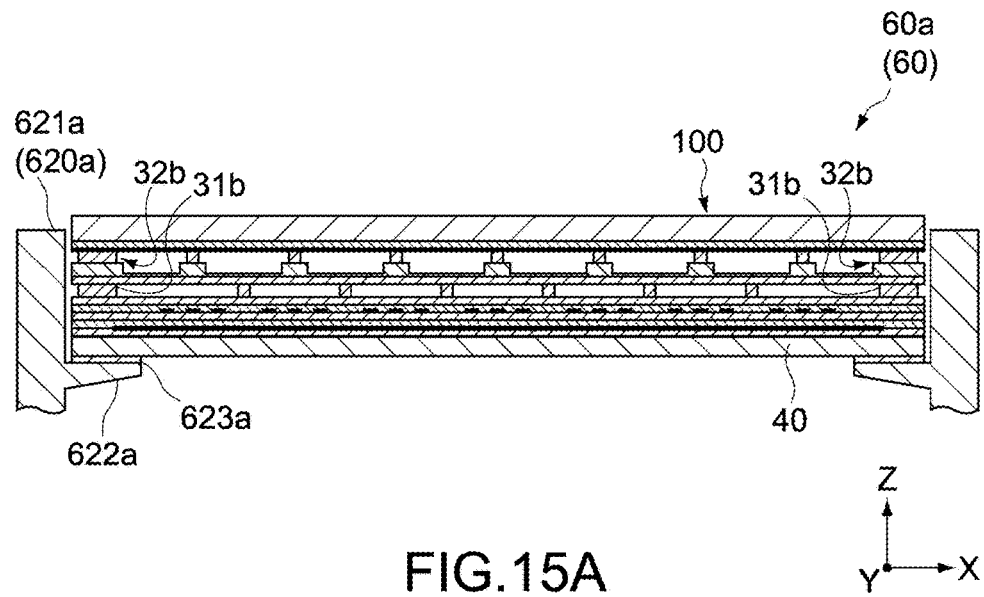
Figure 15B:
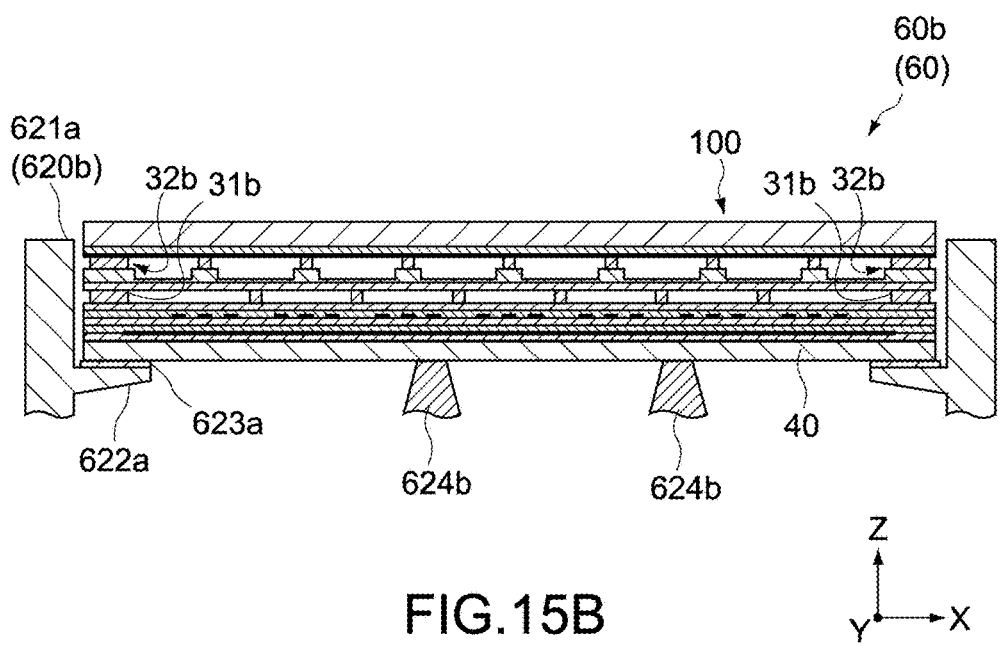
Figure 16A:
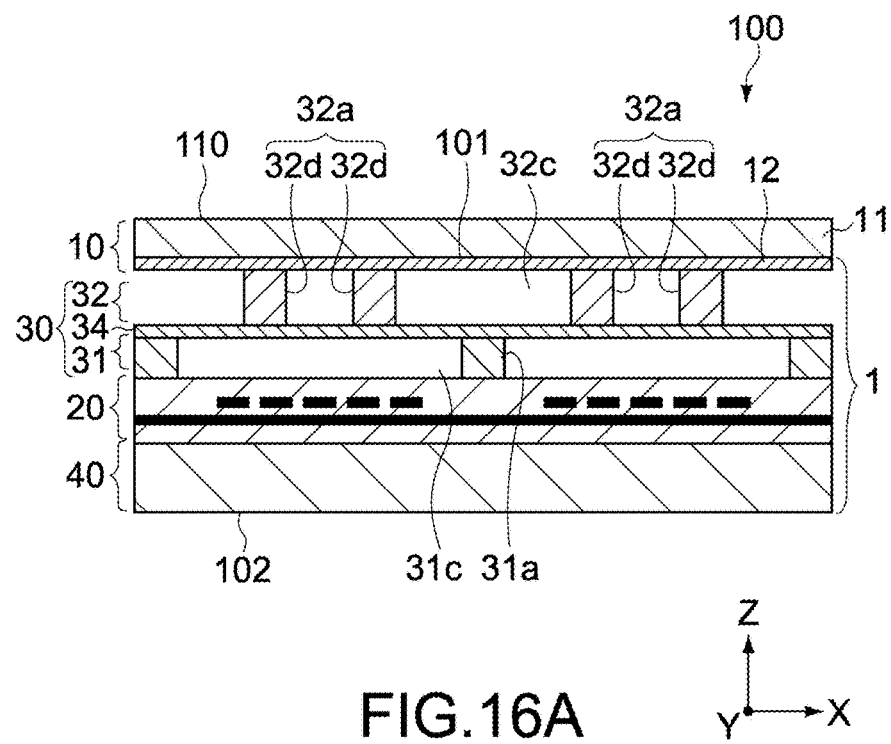
Figure 16B:
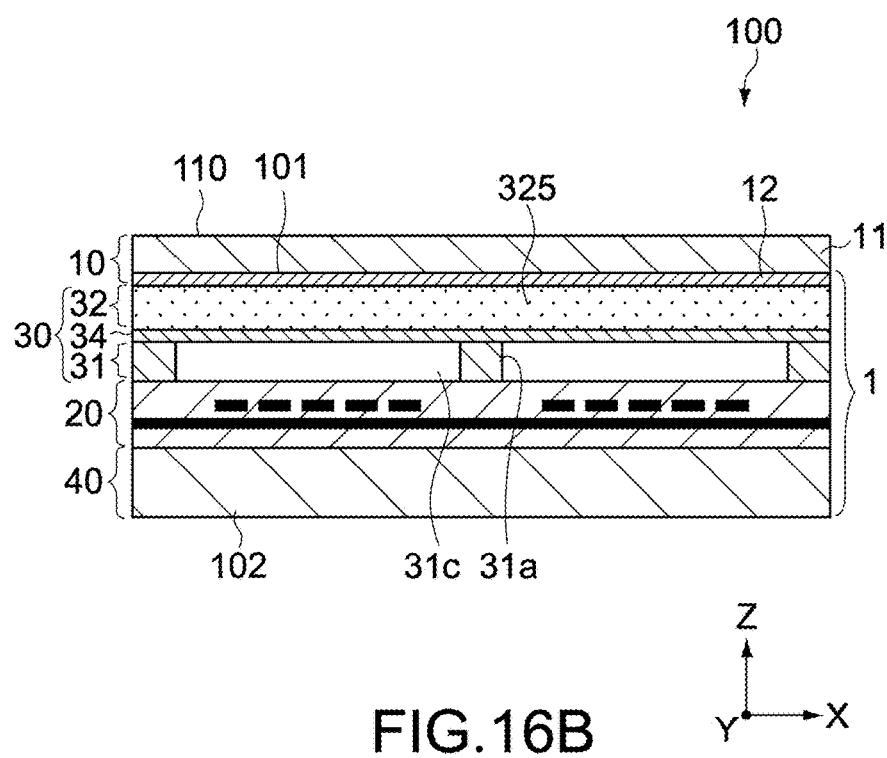
Figure 17:
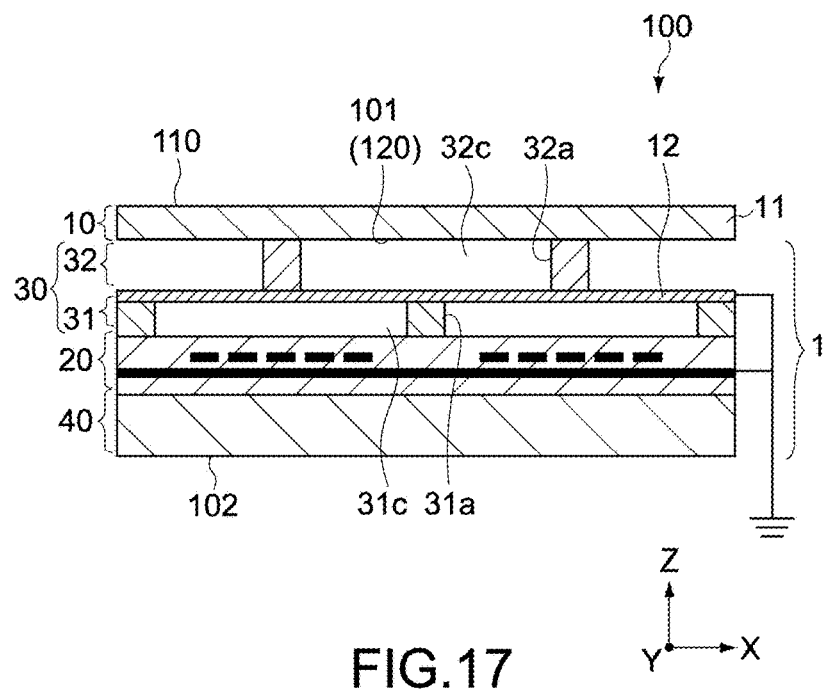
Figure 18:
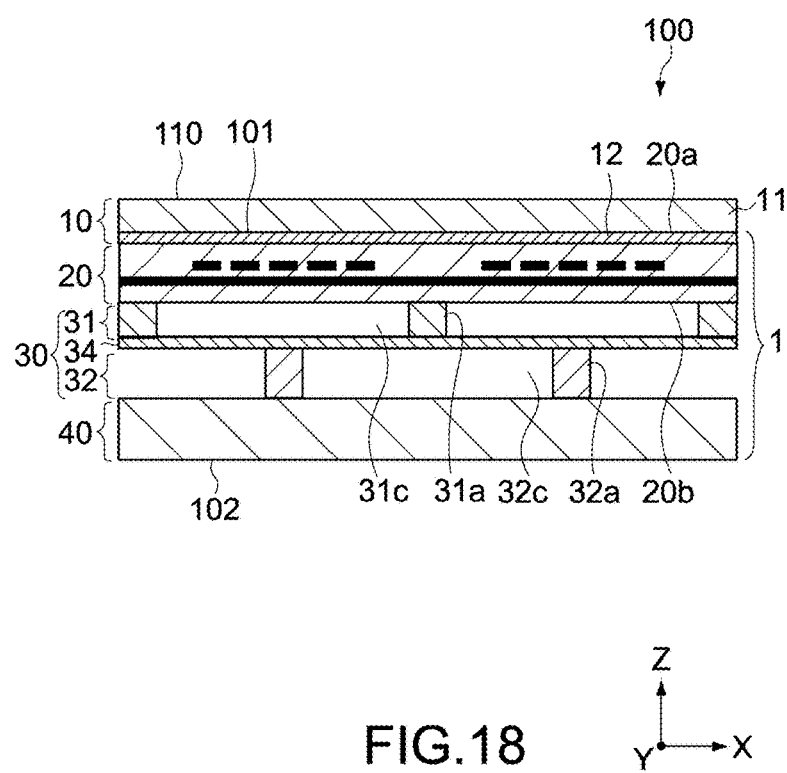
Figure 19A:
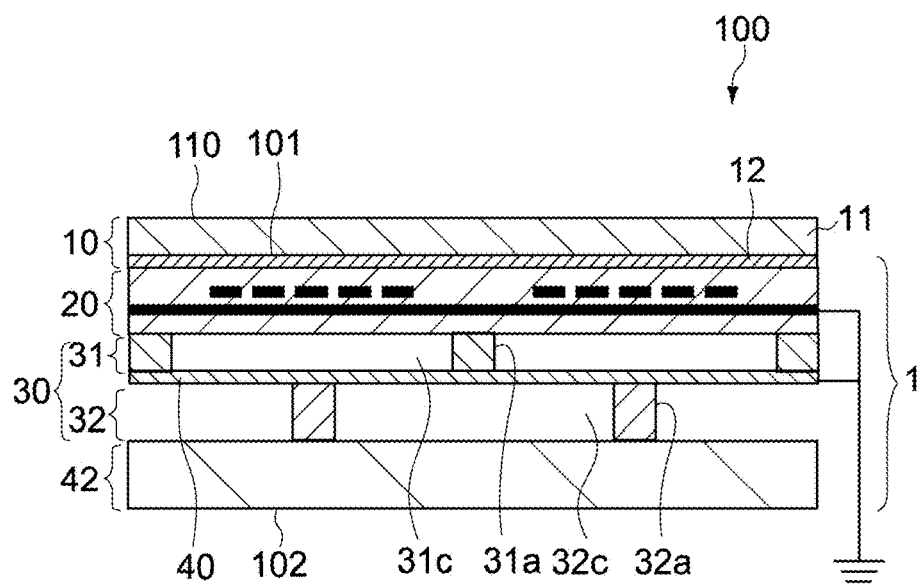
Figure 19B:
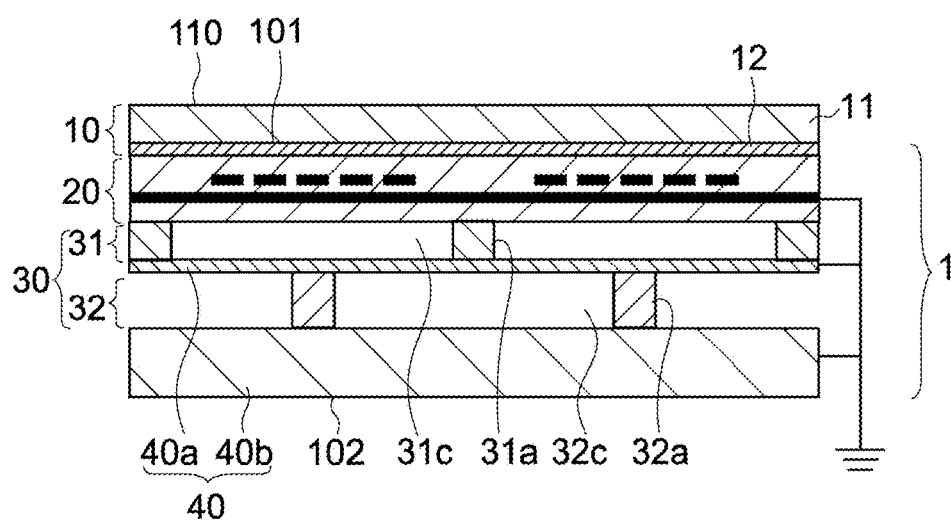
Figure 20A:
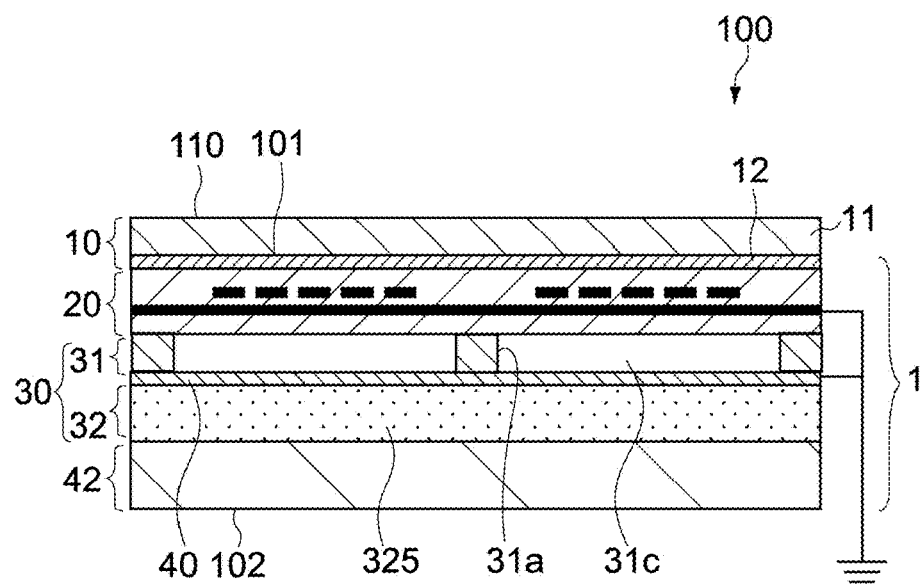
Figure 20B:
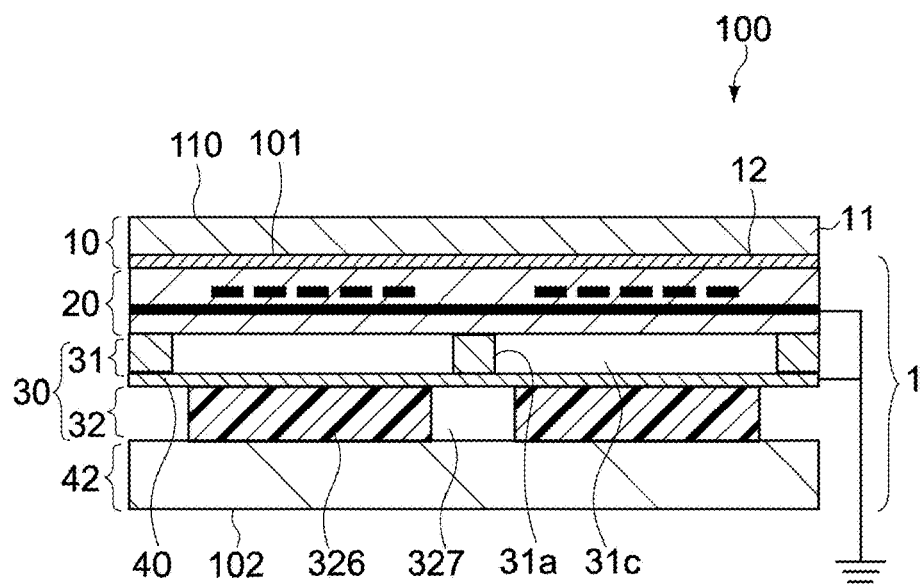
Figure 21A:
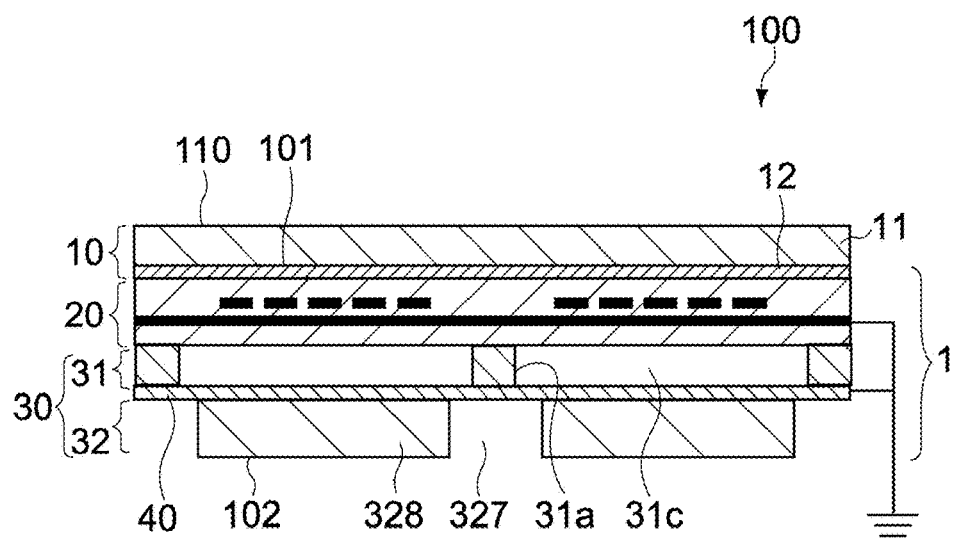
Figure 21B:
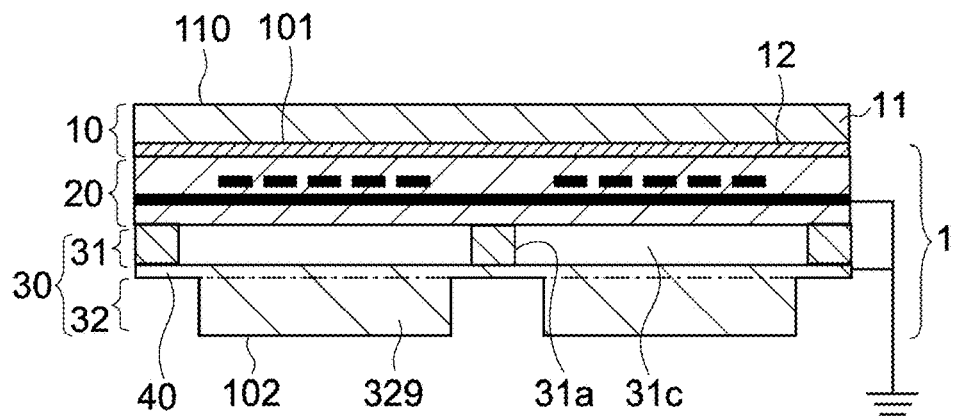
Figure 22A:
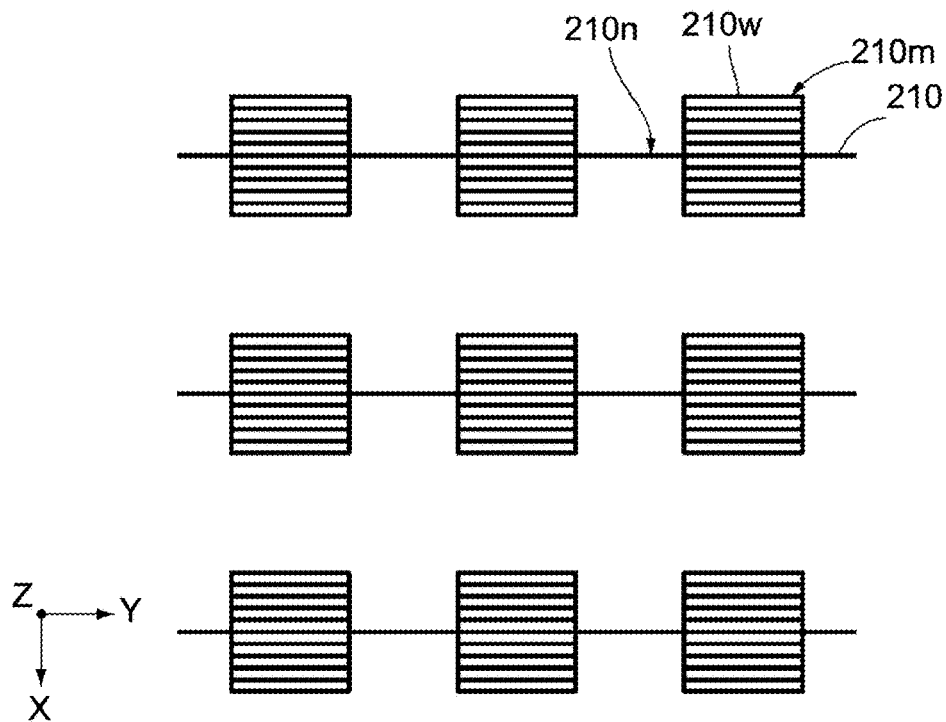
Figure 22B:
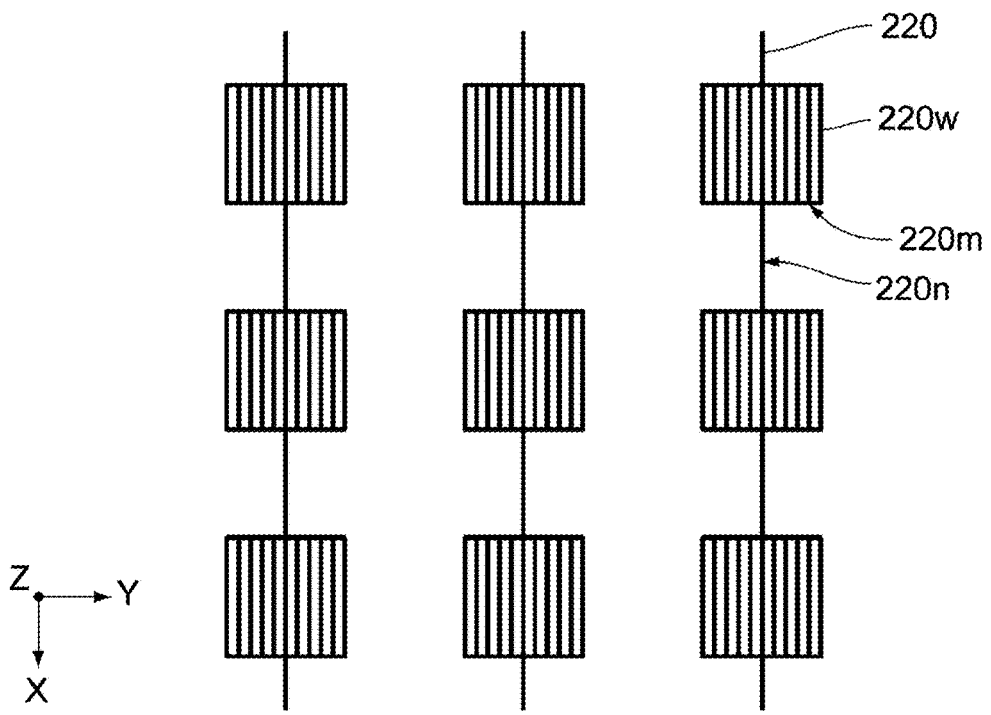
Figure 24:
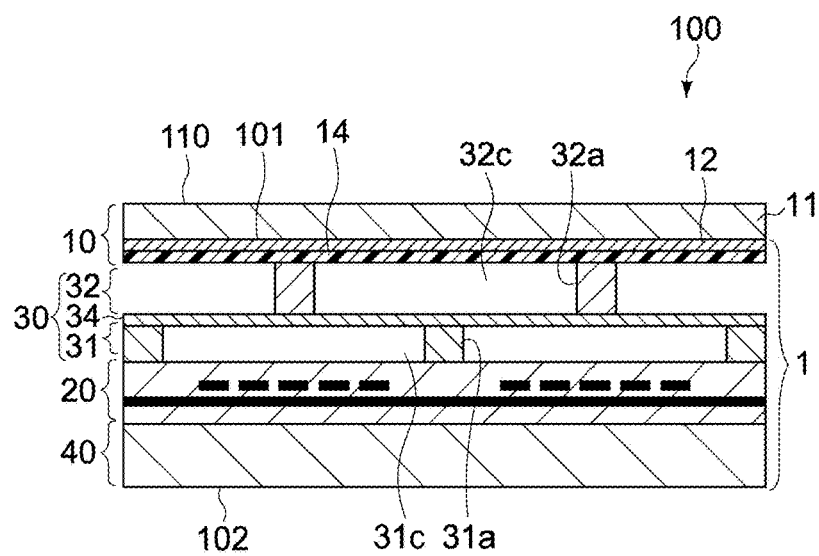
Figure 25:
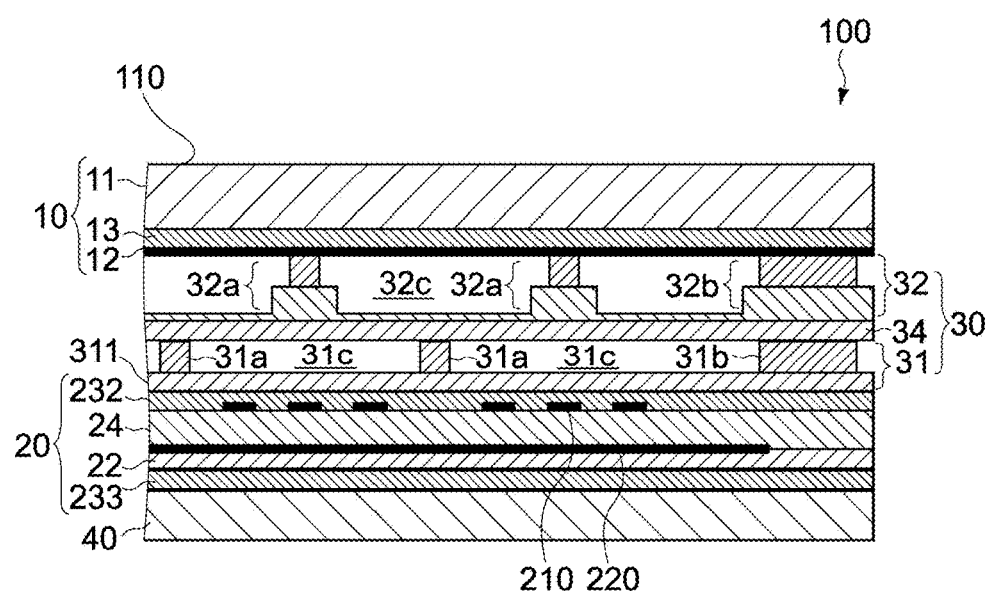
Figure 26A:
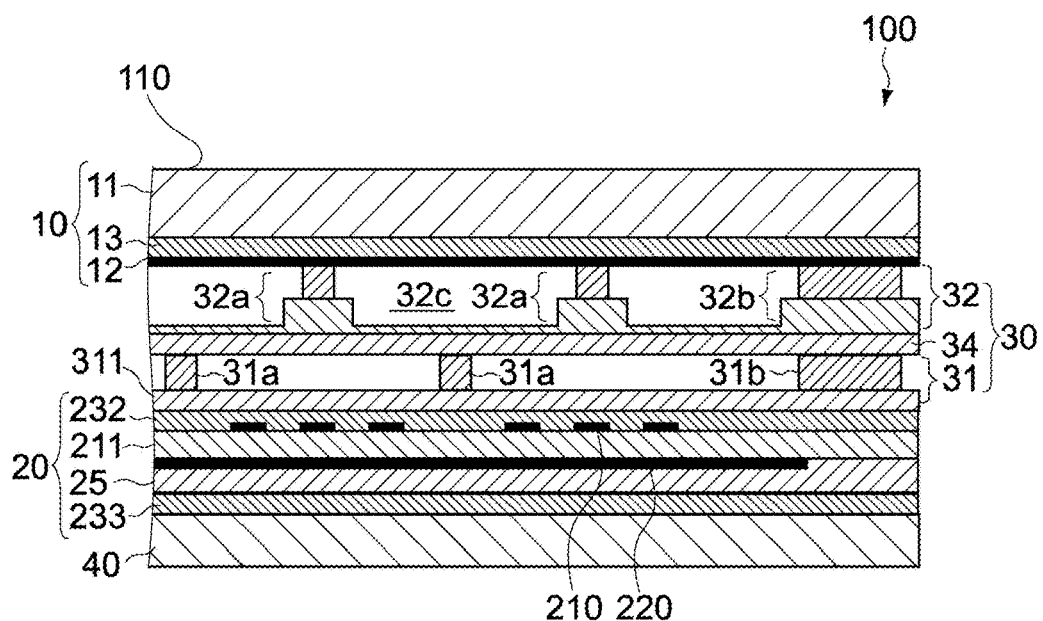
Figure 26B:
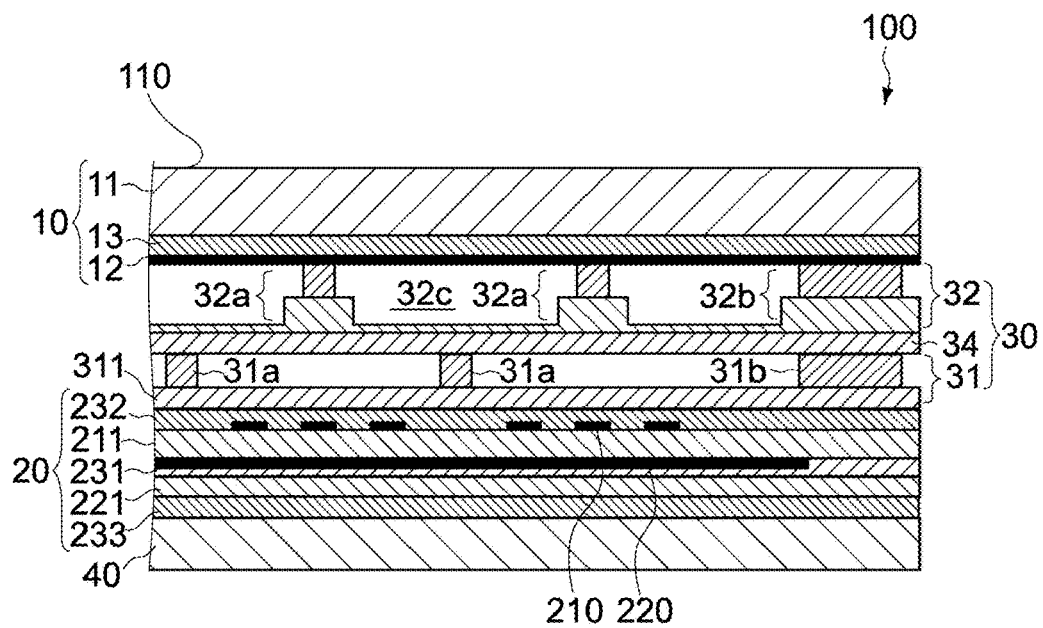
Figure 27A:
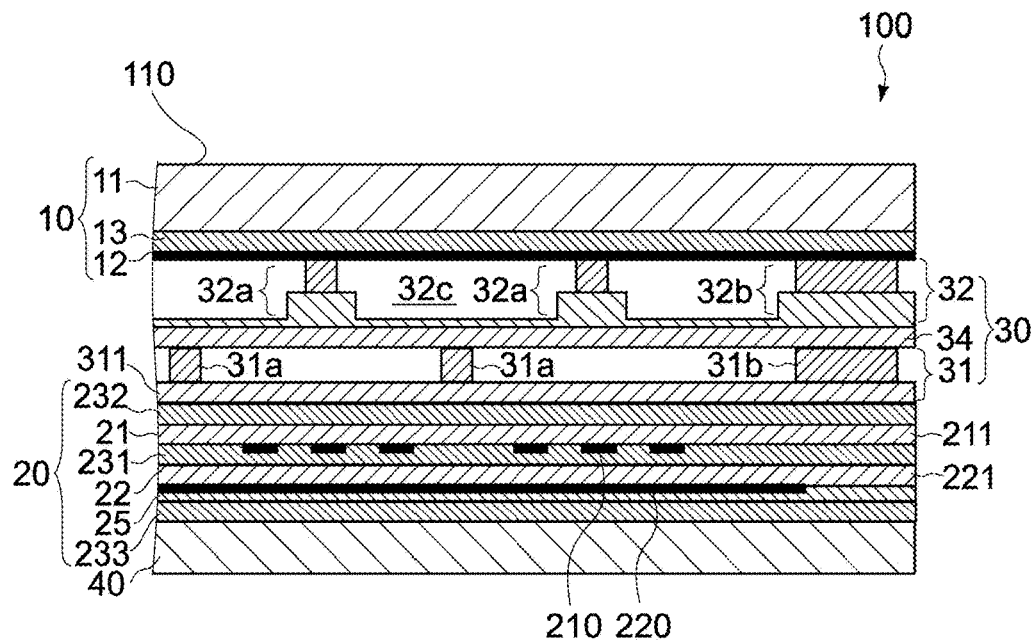
Figure 27B:
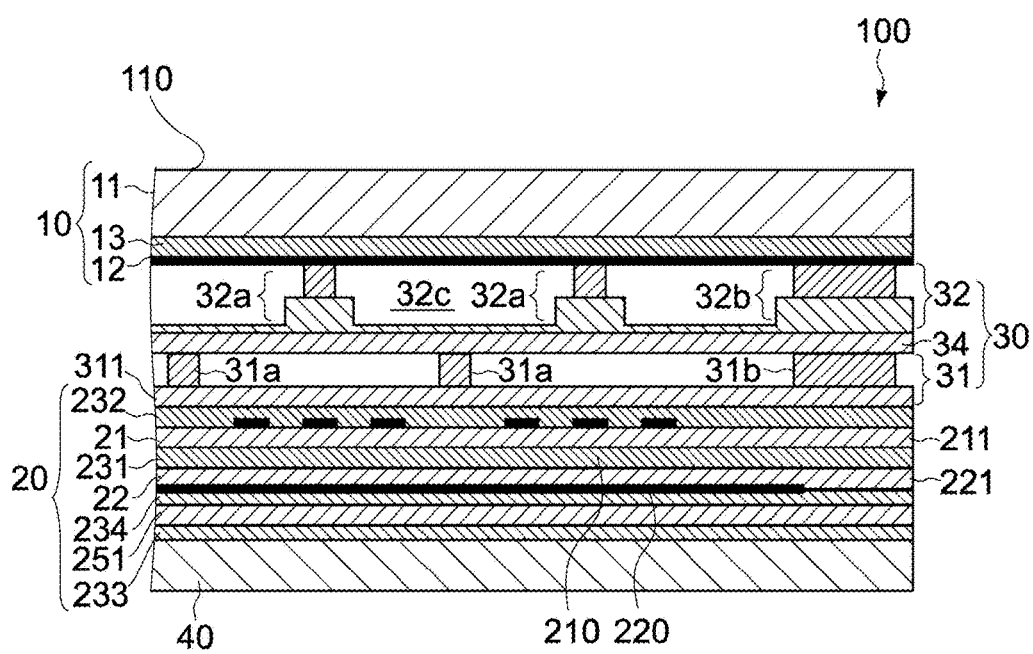
Figure 28:
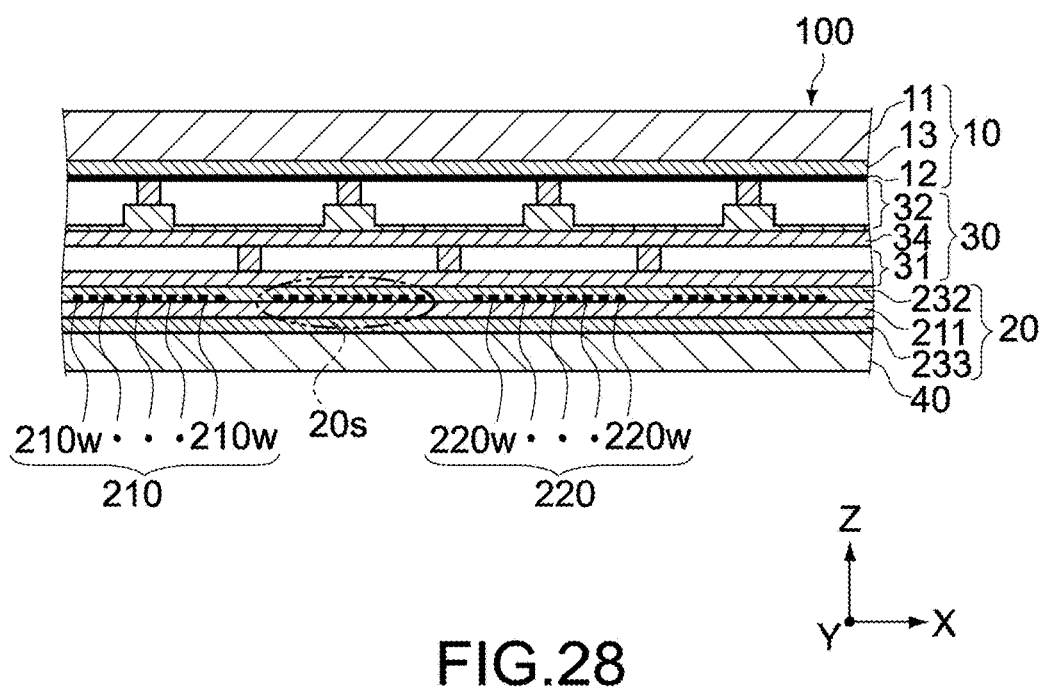
Figure 29A:
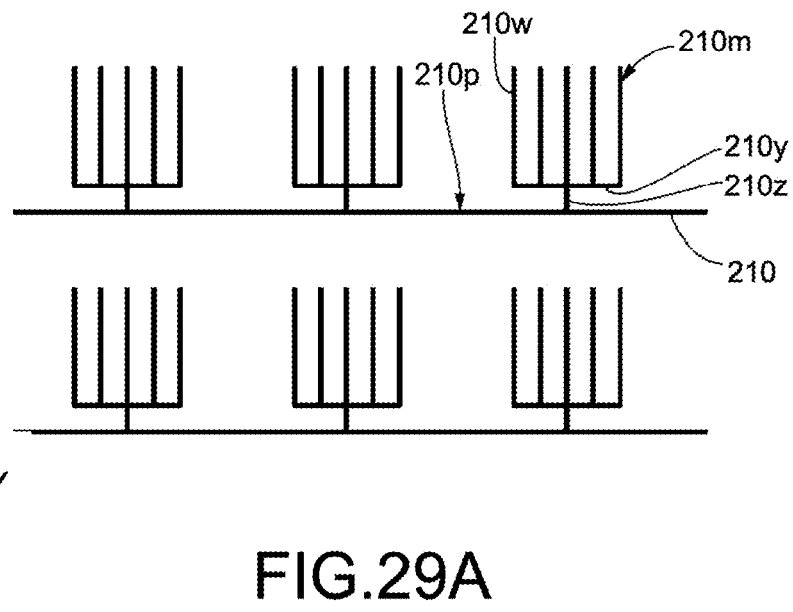
Figure 29B:
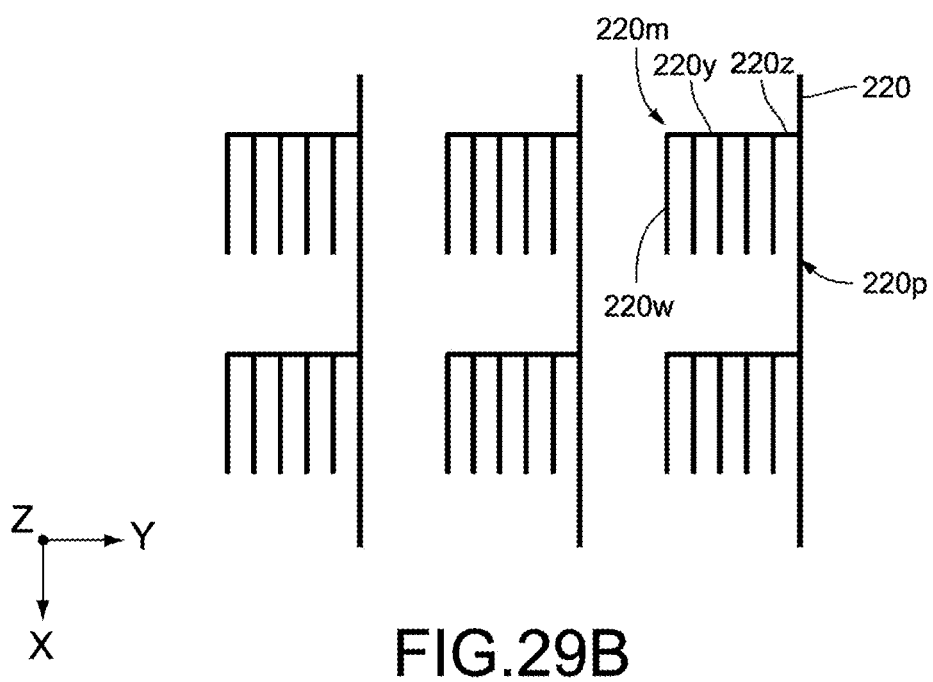
Figure 30A:
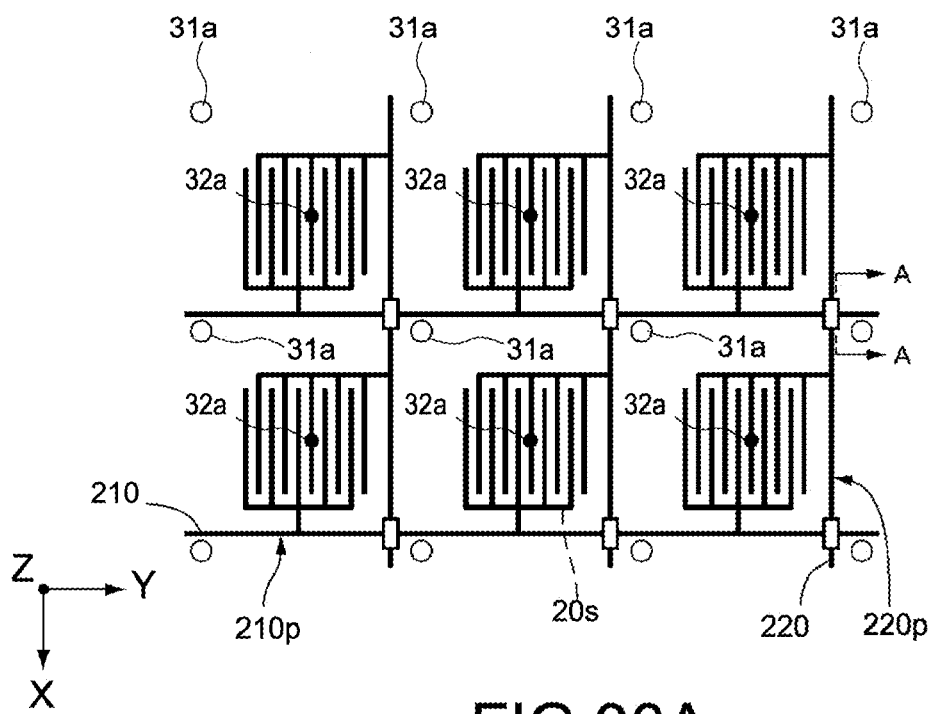
Figure 30B:
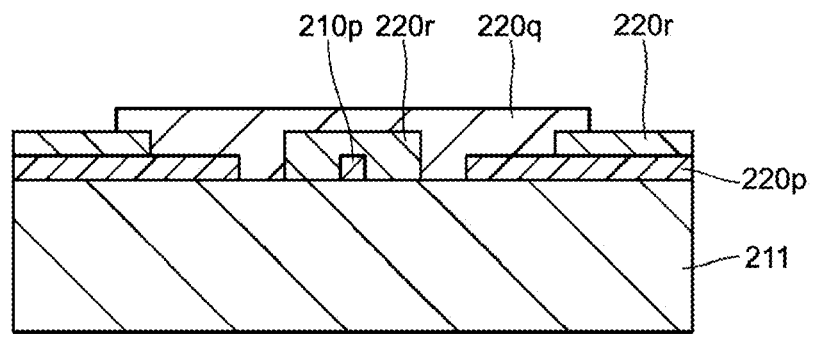
Figure 32A:
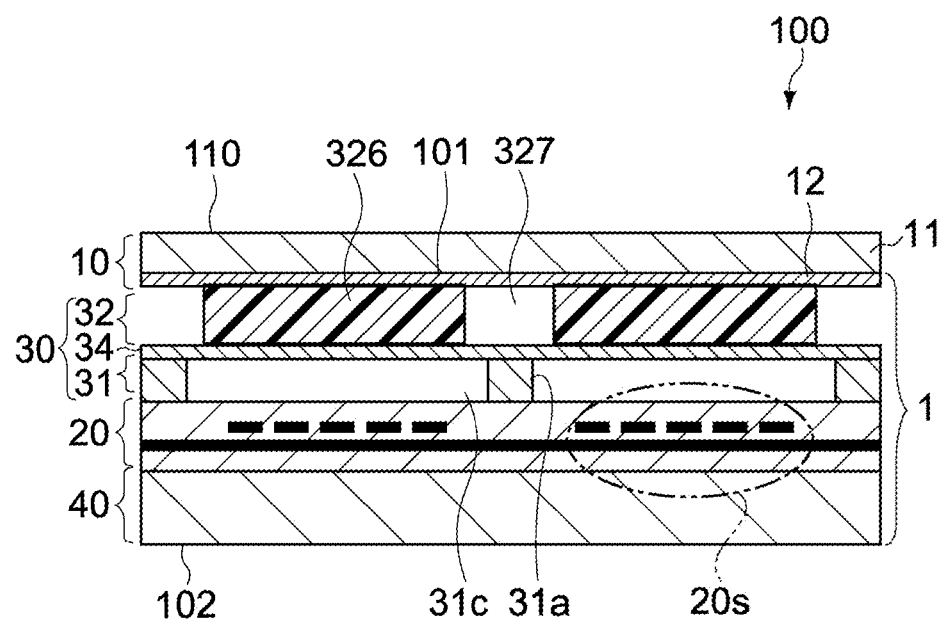
Figure 32B:
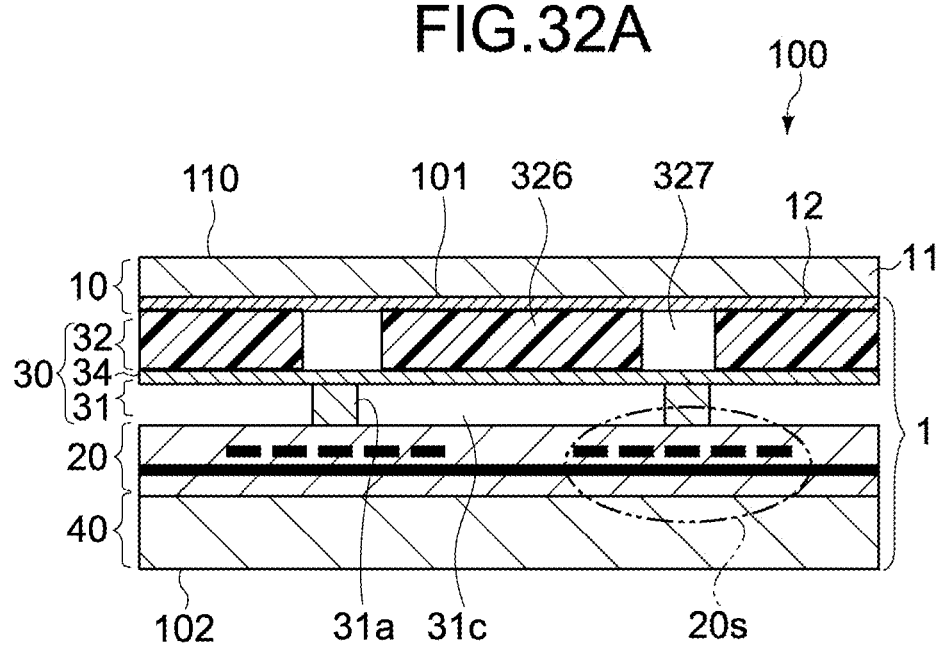
Figure 34A:
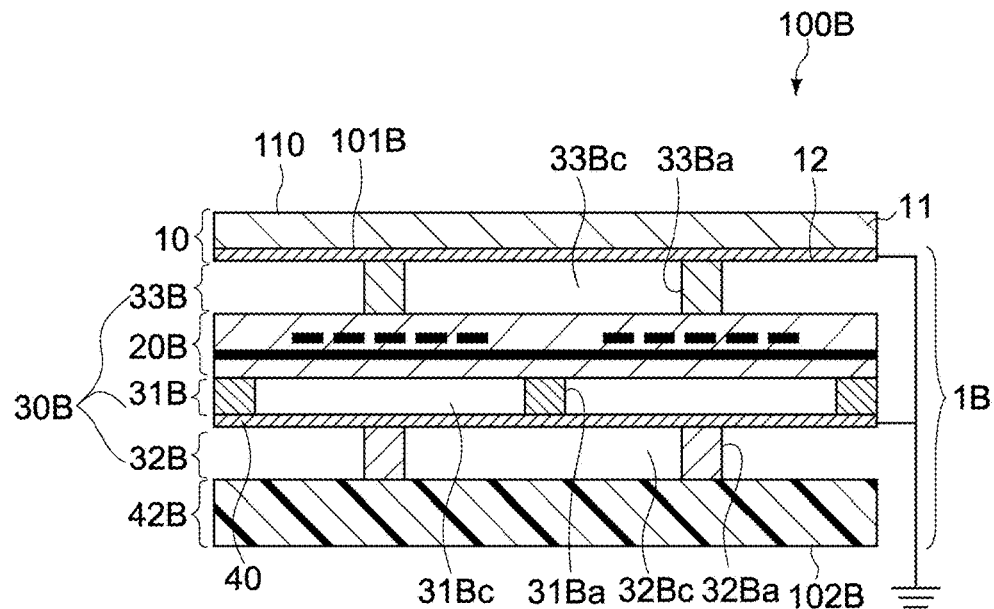
Figure 34B:
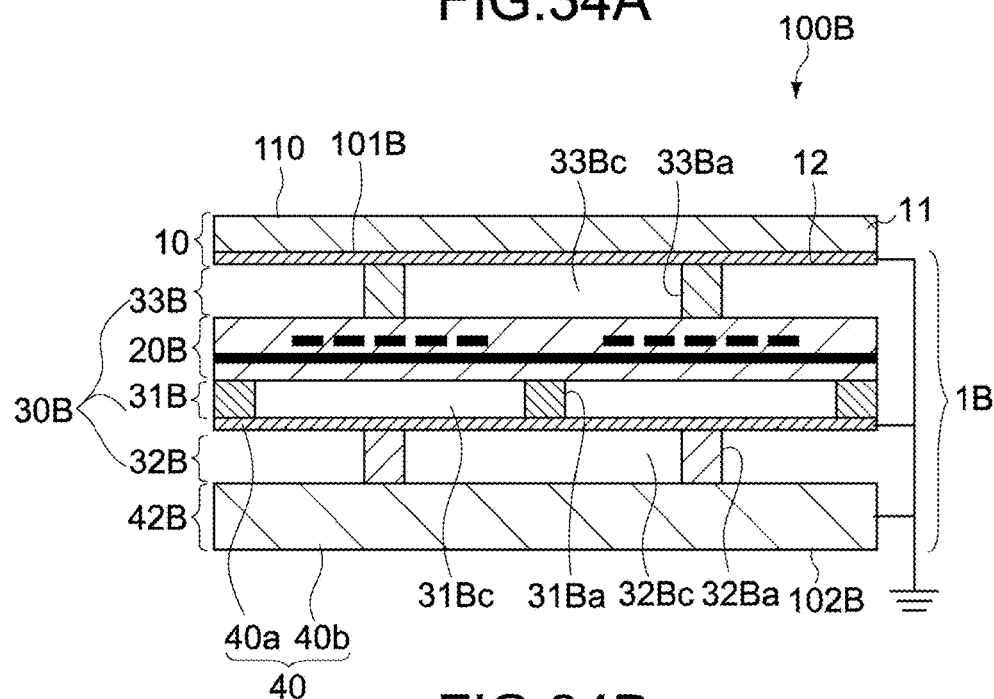
Figure 35A:
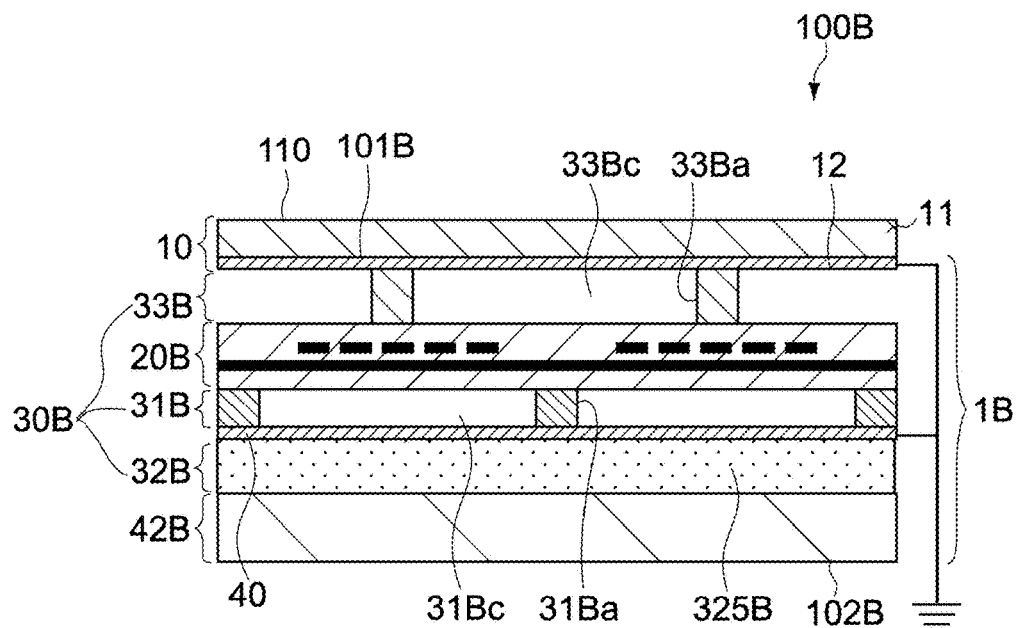
Figure 35B:
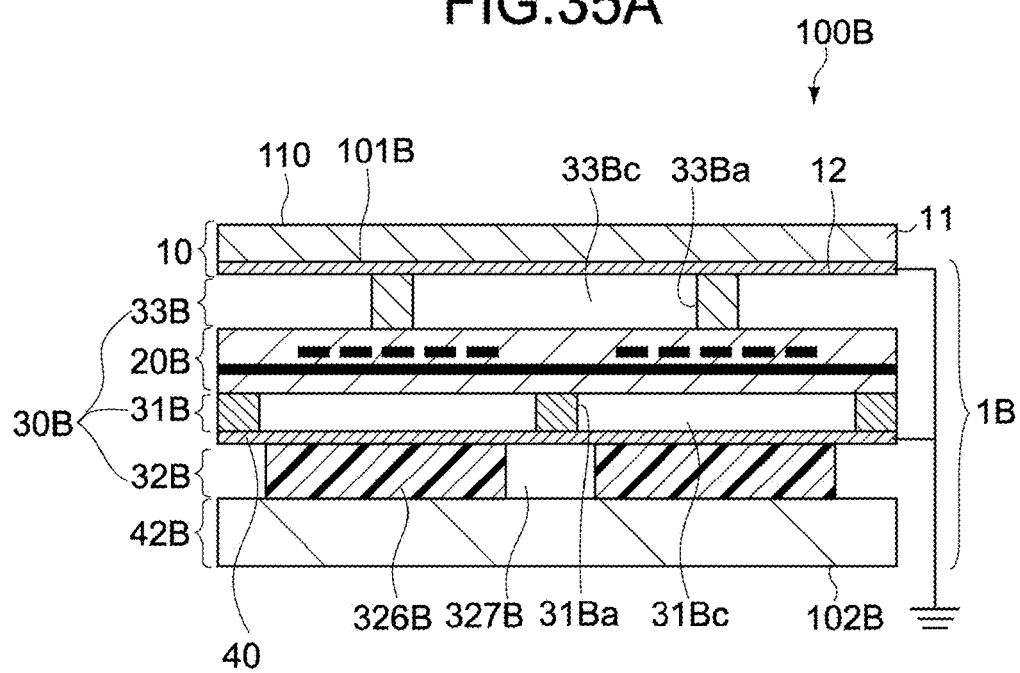
Figure 36A:
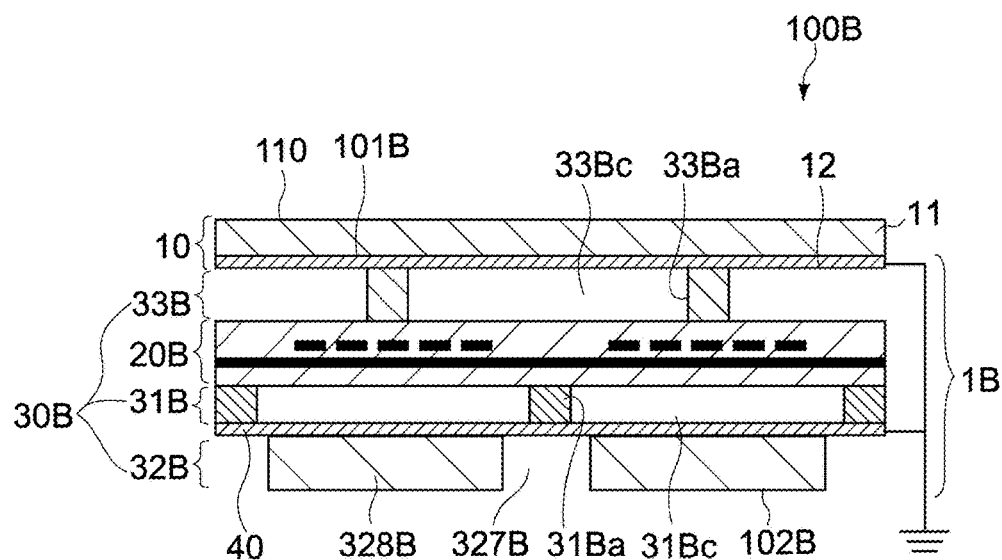
Figure 36B:
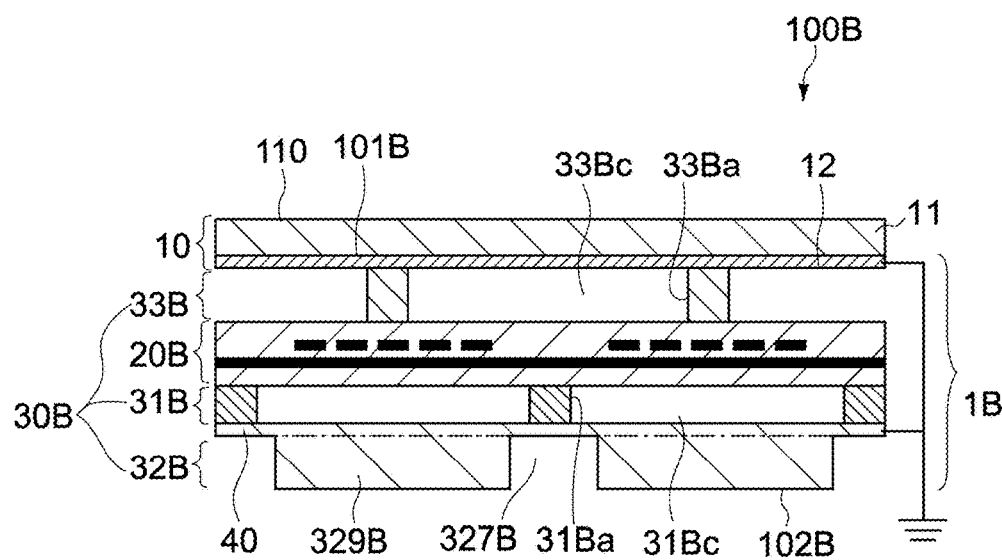
Figure 37:
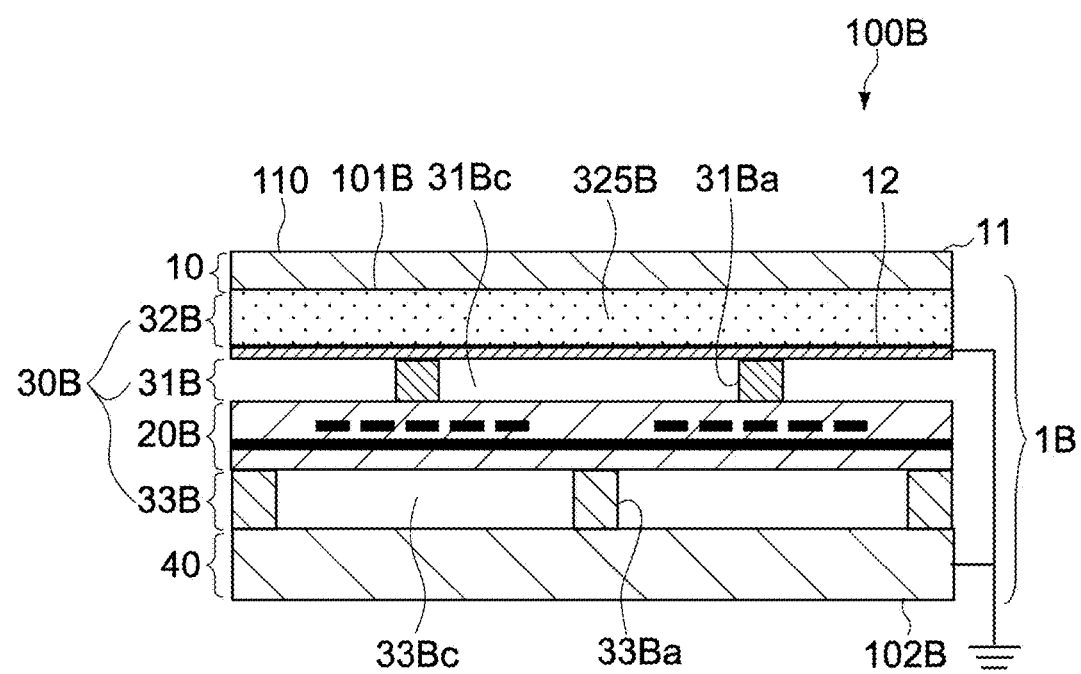
Figure 39A:
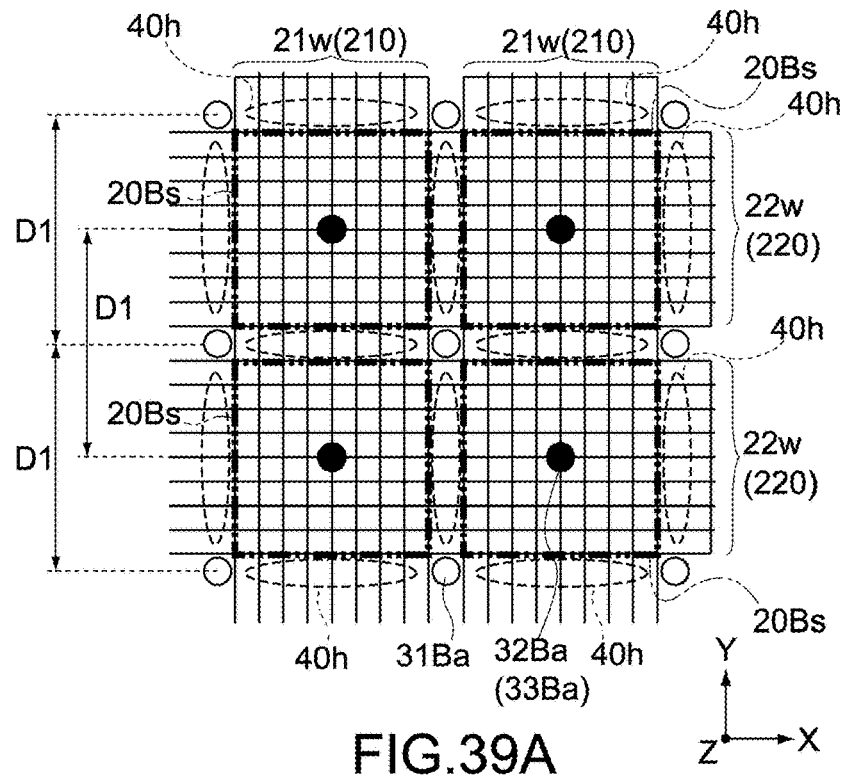
Figure 39B:
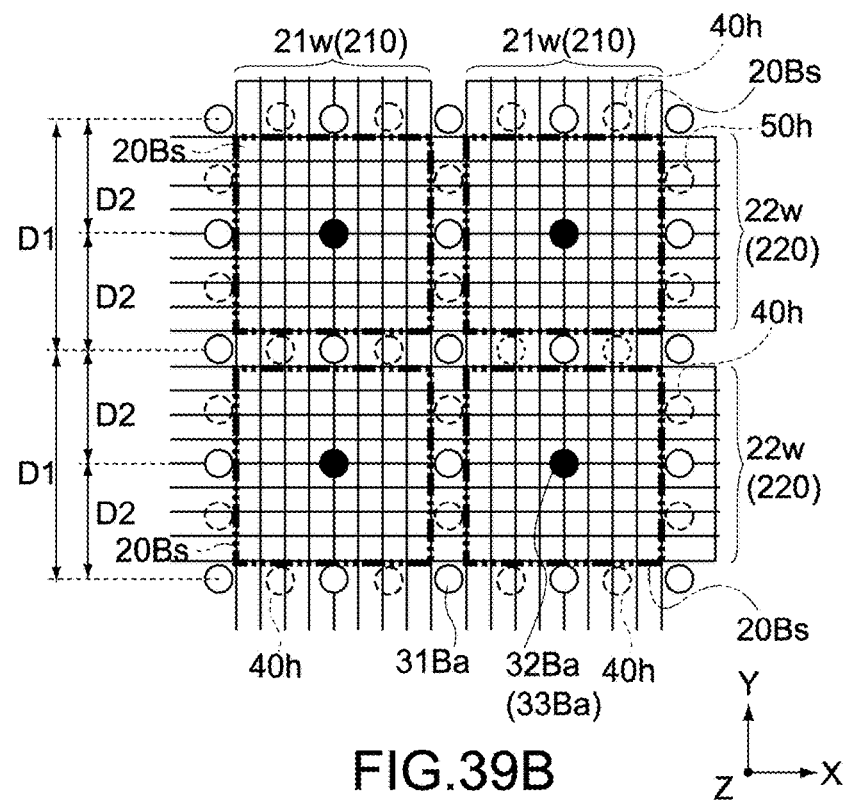
Figure 40:
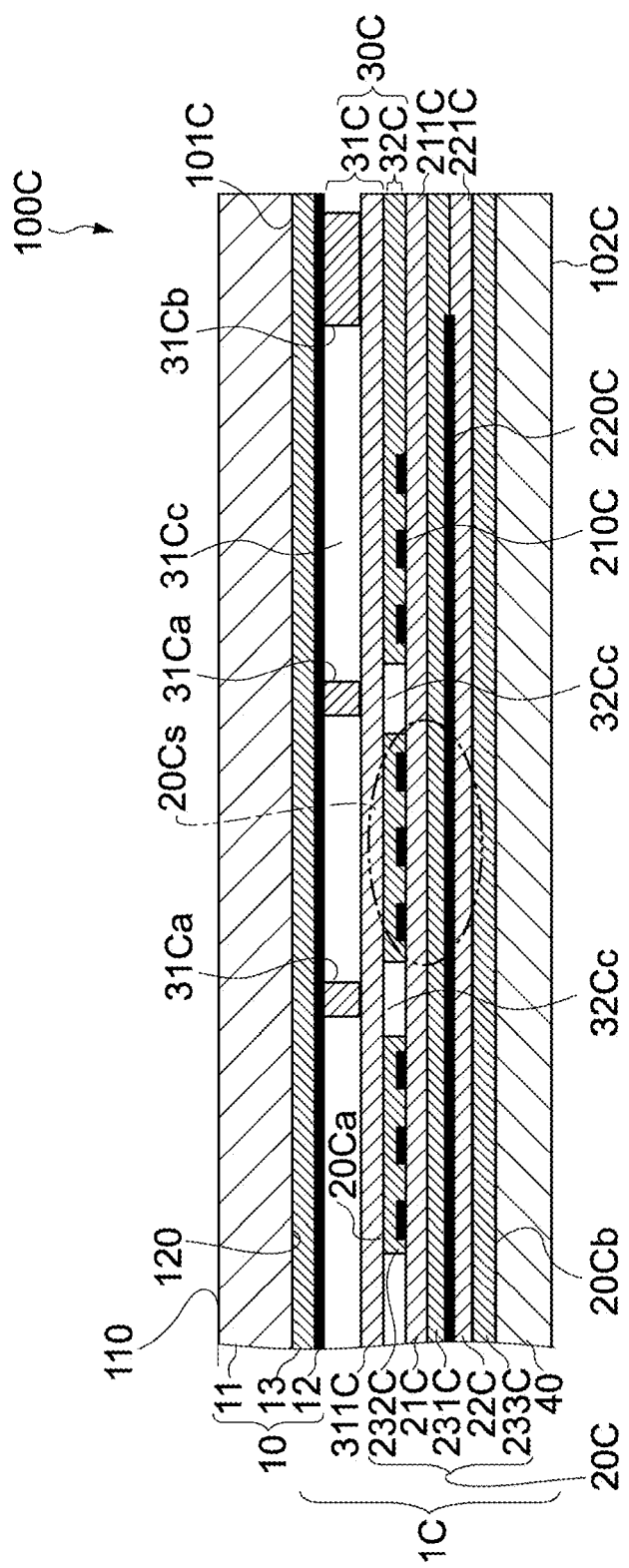
Figure 41:
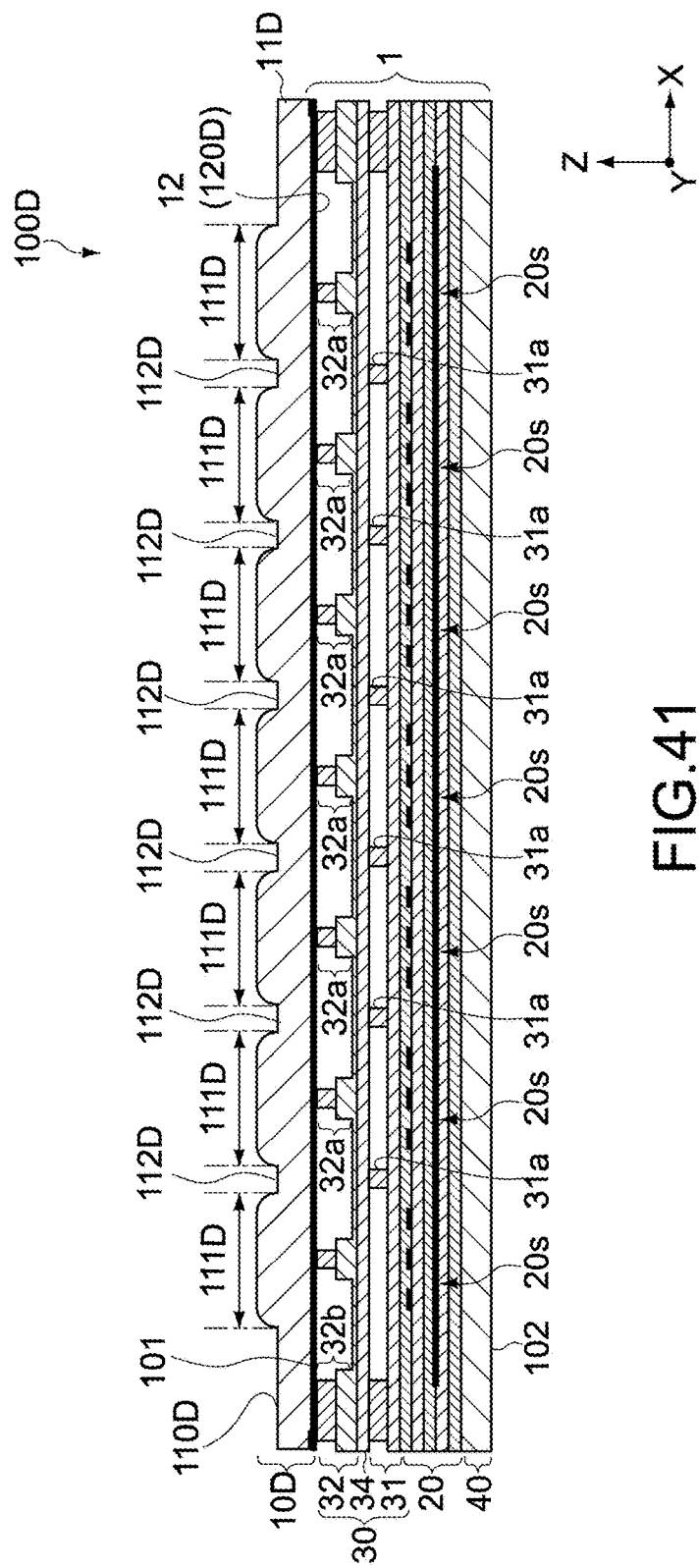
Figure 42A:
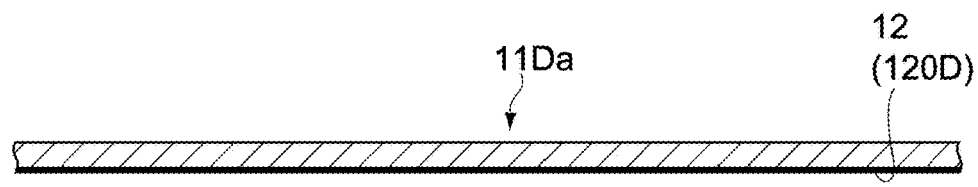
Figure 42B:
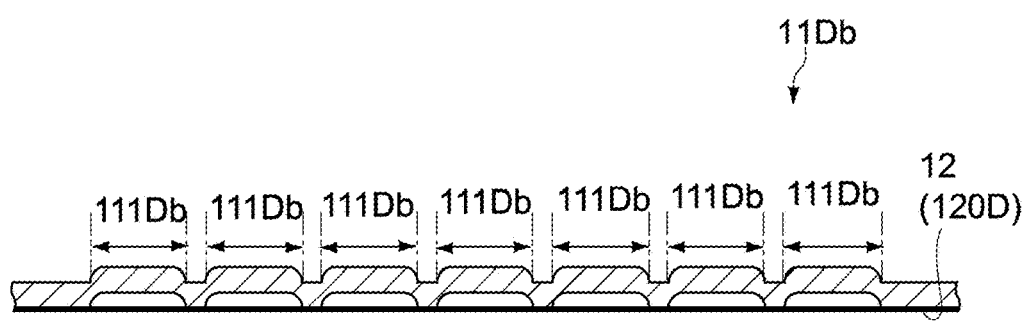
Figure 43:
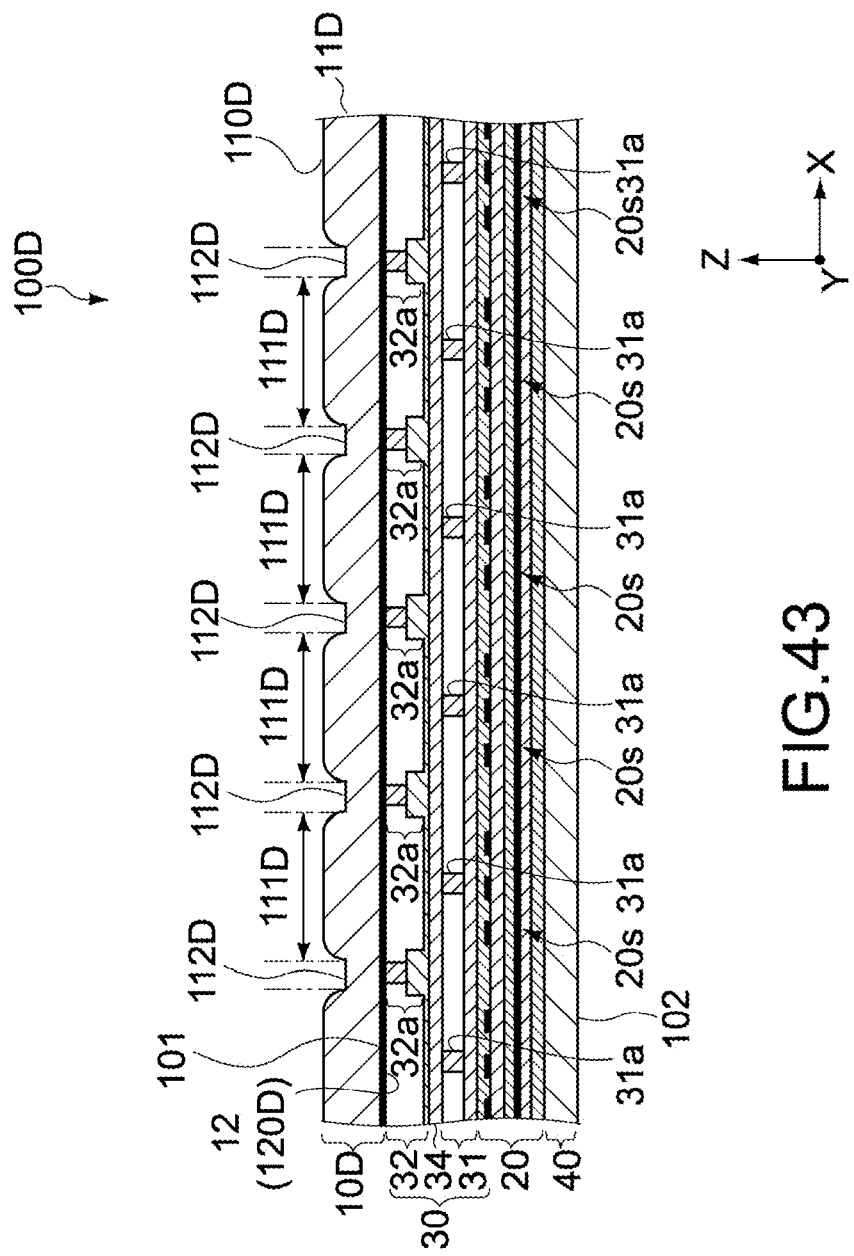
Figure 44:
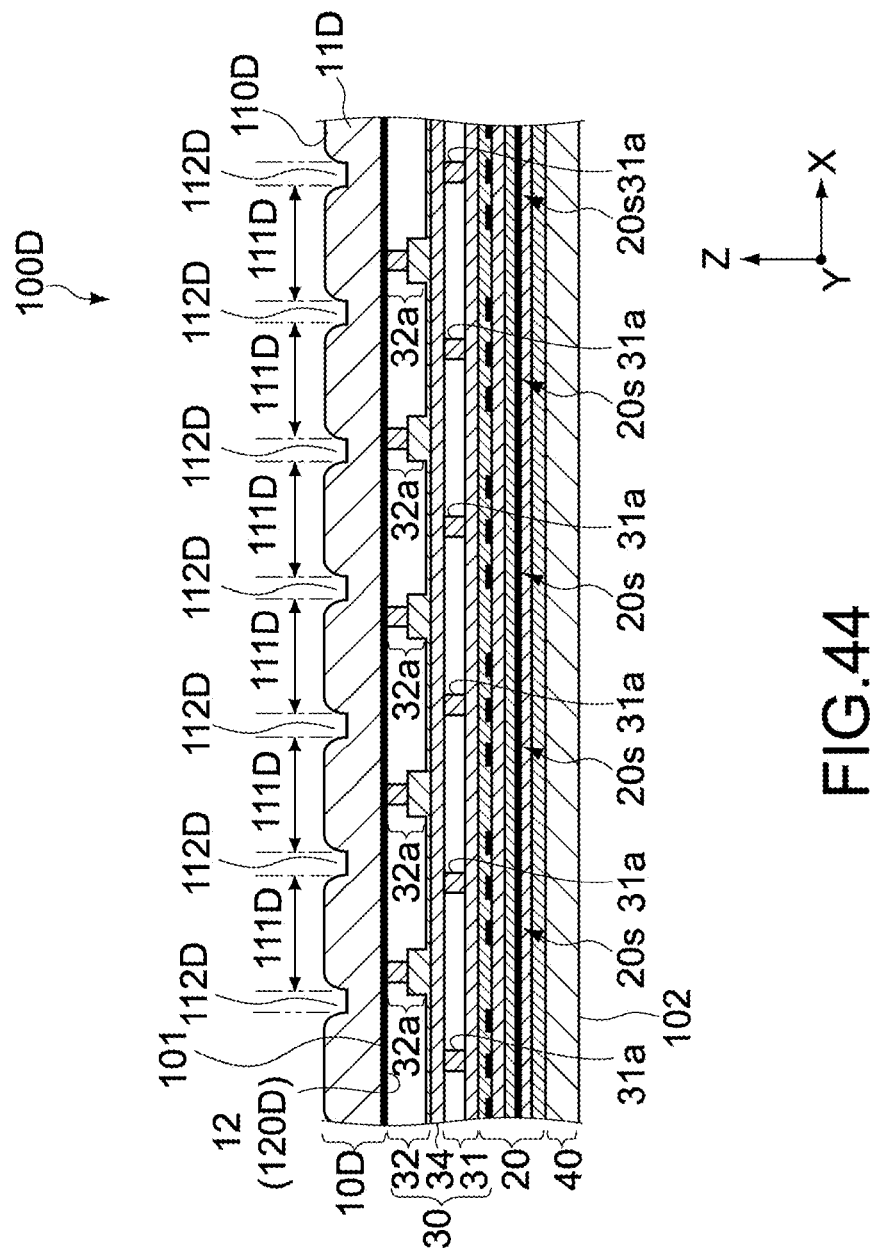
Figure 45A:
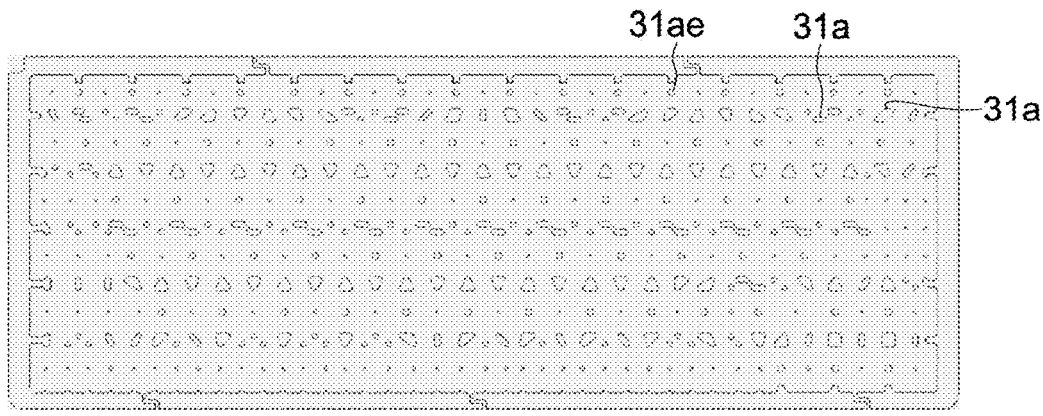
Figure 45B:
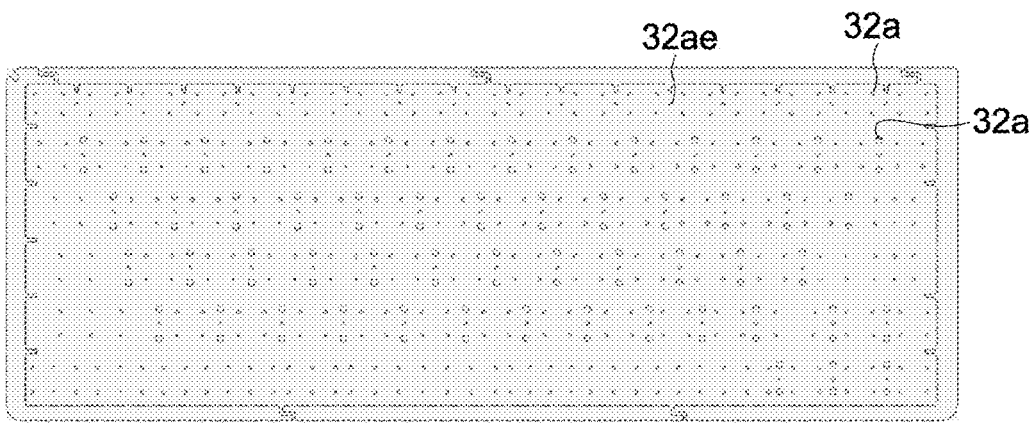
Figure 47:
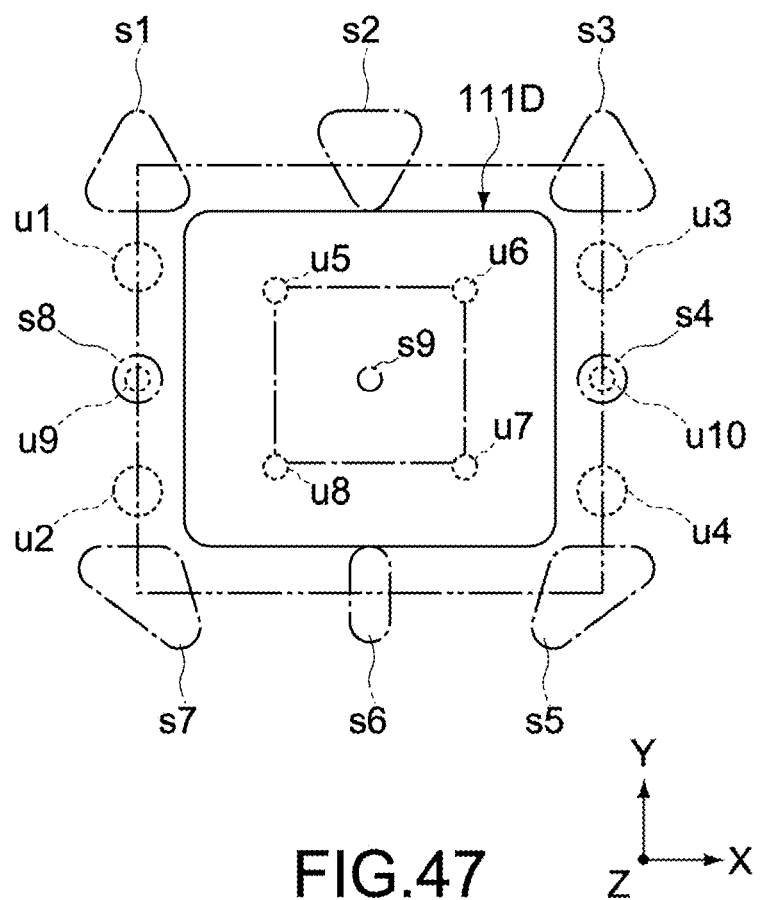
Figure 48:
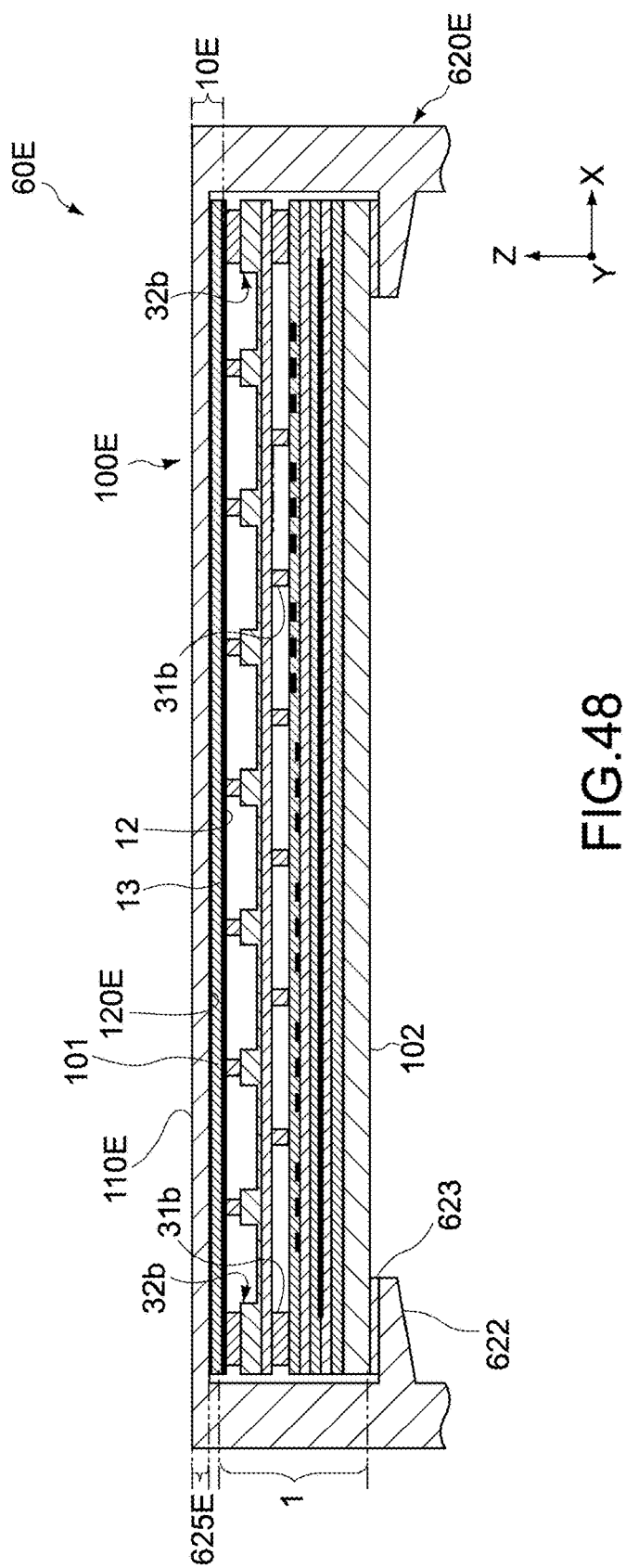
Figure 49A:
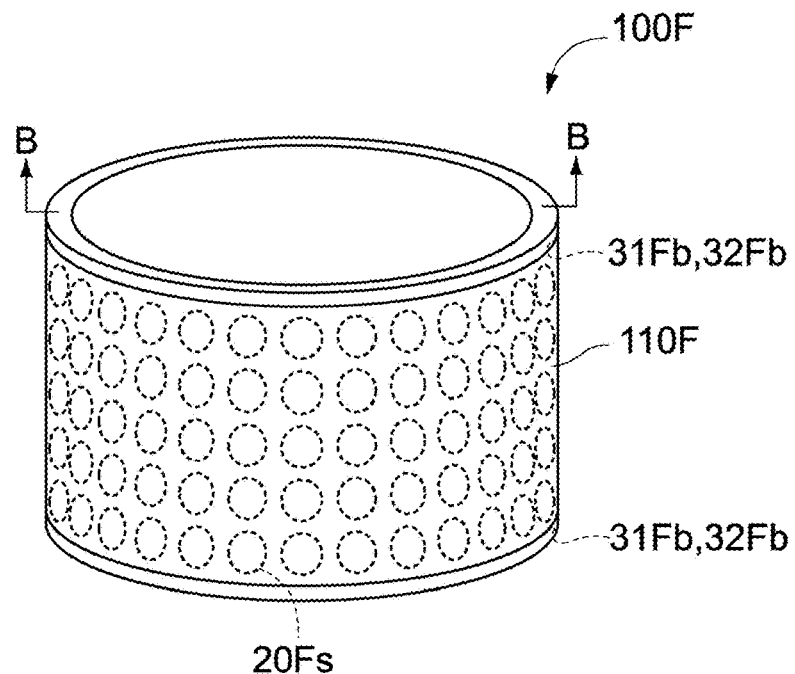
Figure 49B:
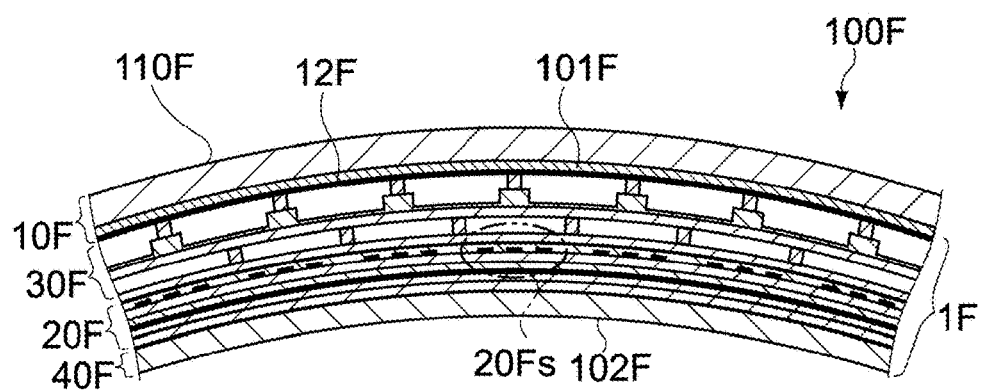
Figure 50A:
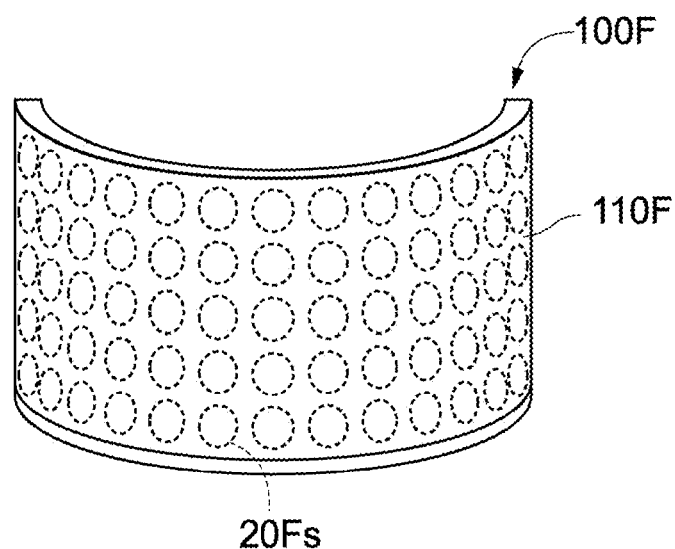
Figure 50B:
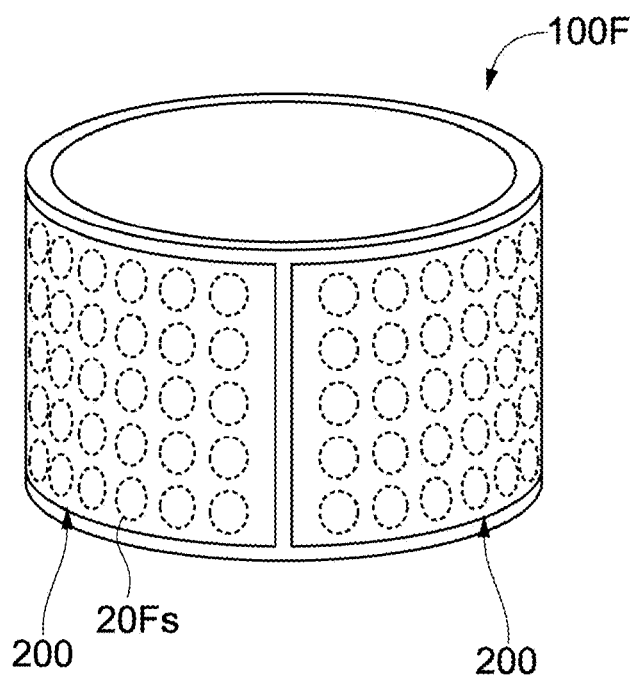

Each of FIGS. 7A and 7B is a cross-sectional view schematically illustrating the structure of the capacitive elements of the input device;

FIG. 8 is a cross-sectional view schematically and exemplarily showing a method of manufacturing the first support layer of the input device;

FIGS. 9A and 9B are cross-sectional views schematically and exemplarily showing a method of manufacturing the second support layer of the input device;

FIGS. 10A and 10B are cross-sectional views schematically showing a method of manufacturing the first or second support layer according to a modification example;

Each of FIGS. 11A and 11B is a plan view schematically and exemplarily showing arrangement of the first and second columns and the first and second electrode wires of the input device;

Each of FIGS. 12A and 12B is a cross-sectional view schematically illustrating behavior of an input device (sensor device) of a comparative example of the first embodiment;

Each of FIGS. 13A and 13B is a cross-sectional view schematically illustrating behavior of the input device (sensor device) of the first embodiment;

Each of FIGS. 14A and 14B include a partial cross-sectional view and a diagram exemplarily showing output signals, the partial cross-sectional view schematically showing the behavior of the input device when a point of the first surface of the sensor device above the second column is operated by a stylus, the latter diagram showing signals output from the capacitive elements at this time;

Each of FIGS. 15A and 15B is a diagram showing that the input device is mounted on the electronic apparatus;

Each of FIGS. 16A and 16B is a cross-sectional view schematically showing the input device (sensor device) of Modification Example 1-1 of the first embodiment;

FIG. 17 is a cross-sectional view schematically showing the input device (sensor device) of Modification Example 1-2 of the first embodiment;

FIG. 18 is a cross-sectional view schematically showing the input device (sensor device) of Modification Example 1-3 of the first embodiment;

Each of FIGS. 19A and 19B is a cross-sectional view schematically showing the input device (sensor device) of Modification Example 1-4 of the first embodiment;

Each of FIGS. 20A and 20B is a partial cross-sectional view schematically showing the second support layer 32 according to each structural example of Modification Example 1-4;

Each of FIGS. 21A and 21B is a partial cross-sectional view schematically showing the second support layer 32 according to each structural example of Modification Example 1-4;

FIG. 22A is a plan view schematically showing the structure of the first electrode wires of the input device of Modification Example 1-6 of the first embodiment, and FIG. 22B is a plan view schematically showing the structure of the second electrode wires thereof;

Each of FIGS. 23A-23P is a diagram schematically and exemplarily showing the shape of each electrode unit of the first and second electrode wires of FIGS. 22A and 22B;

FIG. 24 is a cross-sectional view schematically showing the input device (sensor device) of Modification Example 1-7 of the first embodiment;

FIG. 25 is a partial cross-sectional view schematically showing Structural Example 2 of Modification Example 1-8;

Each of FIGS. 26A and 26B is a partial cross-sectional view schematically showing Structural Example 3 of Modification Example 1-8;

Each of FIGS. 27A and 27B is a partial cross-sectional view schematically showing Structural Example 7 of Modification Example 1-8;

FIG. 28 is a partial cross-sectional view schematically showing the input device (sensor device) of Modification Example 1-9 of the first embodiment;

FIG. 29A is a plan view schematically showing the structure of the first electrode wires of the input device of FIG. 28, and FIG. 29B is a plan view schematically showing the structure of the second electrode wires thereof;

FIG. 30A is a plan view showing the arrayed first and second electrode wires of the input device of FIG. 28, and FIG. 30B is a cross-sectional view seen in the A-A direction of FIG. 30A;

FIG. 31 is a cross-sectional view schematically illustrating the structure of the capacitive elements of FIG. 28;

Each of FIGS. 32A and 32B is a partial cross-sectional view schematically showing the input device (sensor device) of Modification Example 1-11 of the first embodiment;

FIG. 33 is a partial cross-sectional view schematically showing the input device (sensor device) of a second embodiment of the present technology;

Each of FIGS. 34A and 34B is a partial cross-sectional view schematically showing the input device (sensor device) of Modification Example 2-1 of the second embodiment;

Each of FIGS. 35A and 35B is a partial cross-sectional view schematically showing the second support layer 32B according to each structural example of Modification Example 2-1;

Each of FIGS. 36A and 36B is a partial cross-sectional view schematically showing the second support layer 32B according to each structural example of Modification Example 2-1;

FIG. 37 is a partial cross-sectional view schematically showing the input device (sensor device) of Modification Example 2-4 of the second embodiment;

Each of FIGS. 38A-38E is a cross-sectional view schematically showing the second conductor layer according to each structural example of Modification Example 2-5;

Each of FIGS. 39A and 39B is a plan view schematically and exemplarily showing the arrangement of the openings of the second conductor layer, the first, second, and third columns, and the first and second electrode wires;

FIG. 40 is a partial cross-sectional view schematically showing the input device (sensor device) of a third embodiment of the present technology;

FIG. 41 is a partial cross-sectional view schematically showing the input device (sensor device) of a fourth embodiment of the present technology;

Each of FIGS. 42A and 42B is a diagram schematically showing the flexible sheet of the input device according to each modification example;

FIG. 43 is an enlarged cross-sectional view showing the structure of an input device according to a modification example of the fourth embodiment;

FIG. 44 is an enlarged cross-sectional view showing the structure of an input device according to a modification example of the fourth embodiment;

FIG. 45A is a plan view showing an arrangement example of the first columns of the input device of FIGS. 42A and 42B, and FIG. 45B is a plan view showing an arrangement example of the second columns 32a thereof;

FIG. 46A is a plan view showing a structural example of the plurality of first electrodes of the input device of FIGS. 42A and 42B, and FIG. 46B is a plan view showing a structural example of the plurality of second electrodes;

FIG. 47 is an enlarged plan view showing an arrangement example of the first and second columns of FIGS. 45A and 45B;

FIG. 48 is a cross-sectional view schematically showing the electronic apparatus, which includes the input device of a fifth embodiment of the present technology;

FIG. 49A is a perspective view exemplarily showing the input device of a sixth embodiment of the present technology, and FIG. 49B is an enlarged cross-sectional view of the input device seen in the B-B direction of FIG. 49A; and Each of FIGS. 50A and 50B is a perspective view exemplarily showing the structure according to a modification example of the input device of FIGS. 49A and 49B.

DETAILED DESCRIPTION OF EMBODIMENTS

Hereinafter, embodiments of the present technology will be described with reference to the drawings.

First Embodiment

Figure 1:
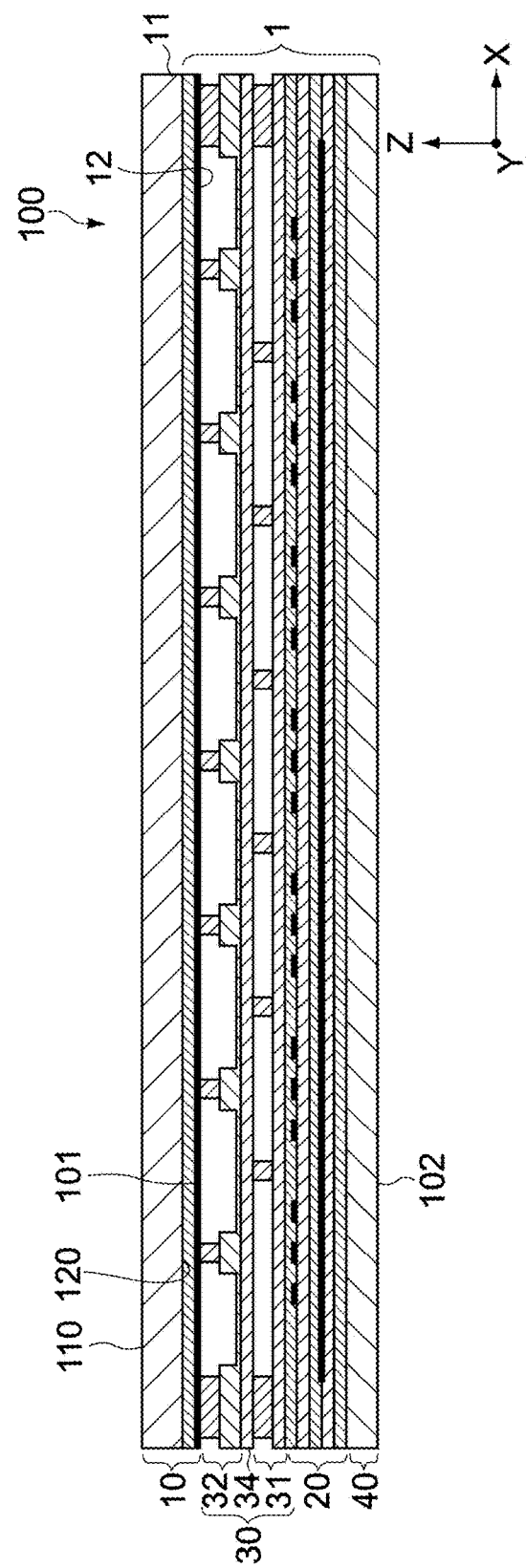
FIG. 1 is cross-sectional view schematically showing an input device according to a the first embodiment of the present technology.
Figure 2:
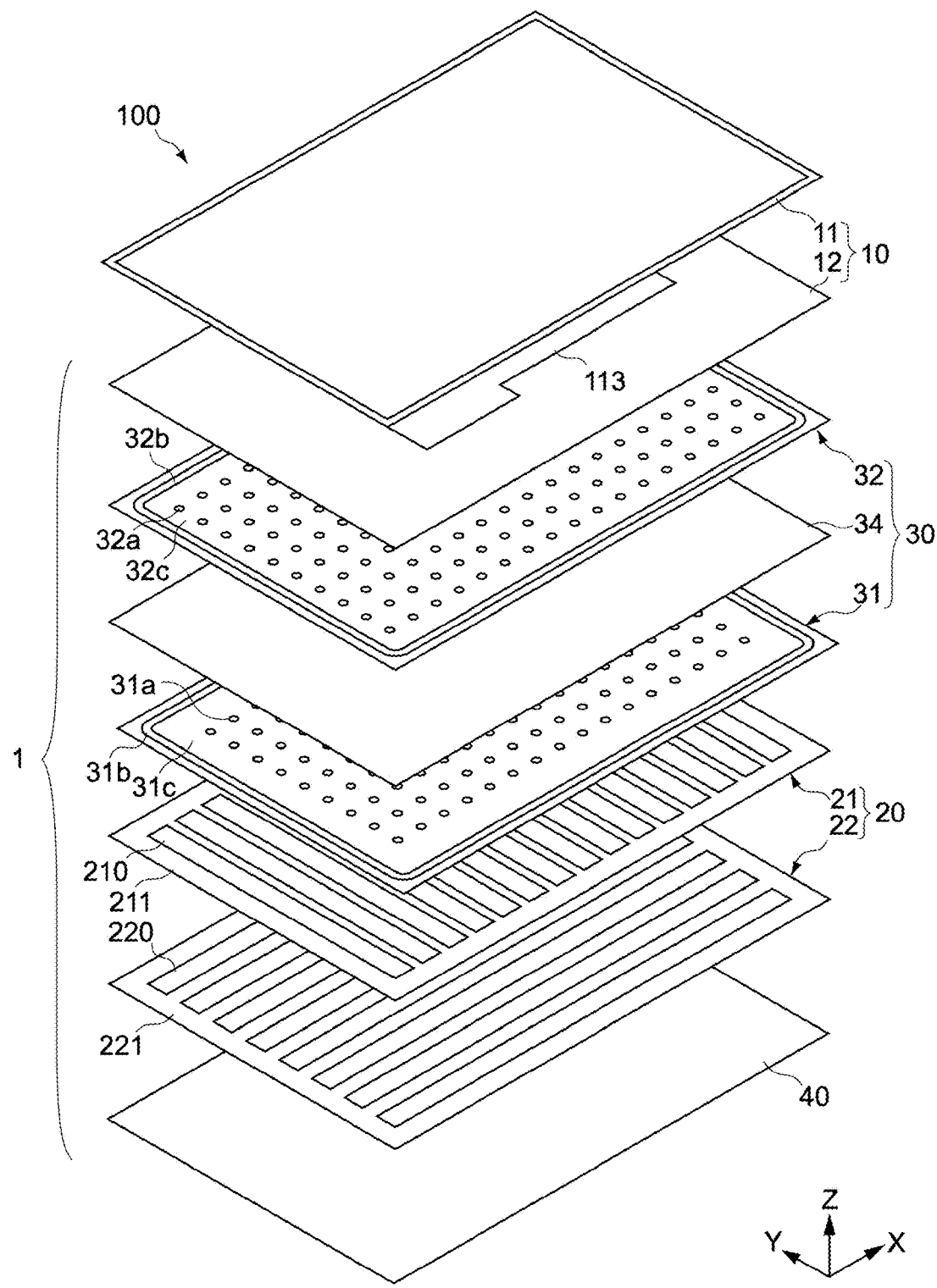
FIG. 2 is an exploded perspective view showing the input device.
Figure 3:
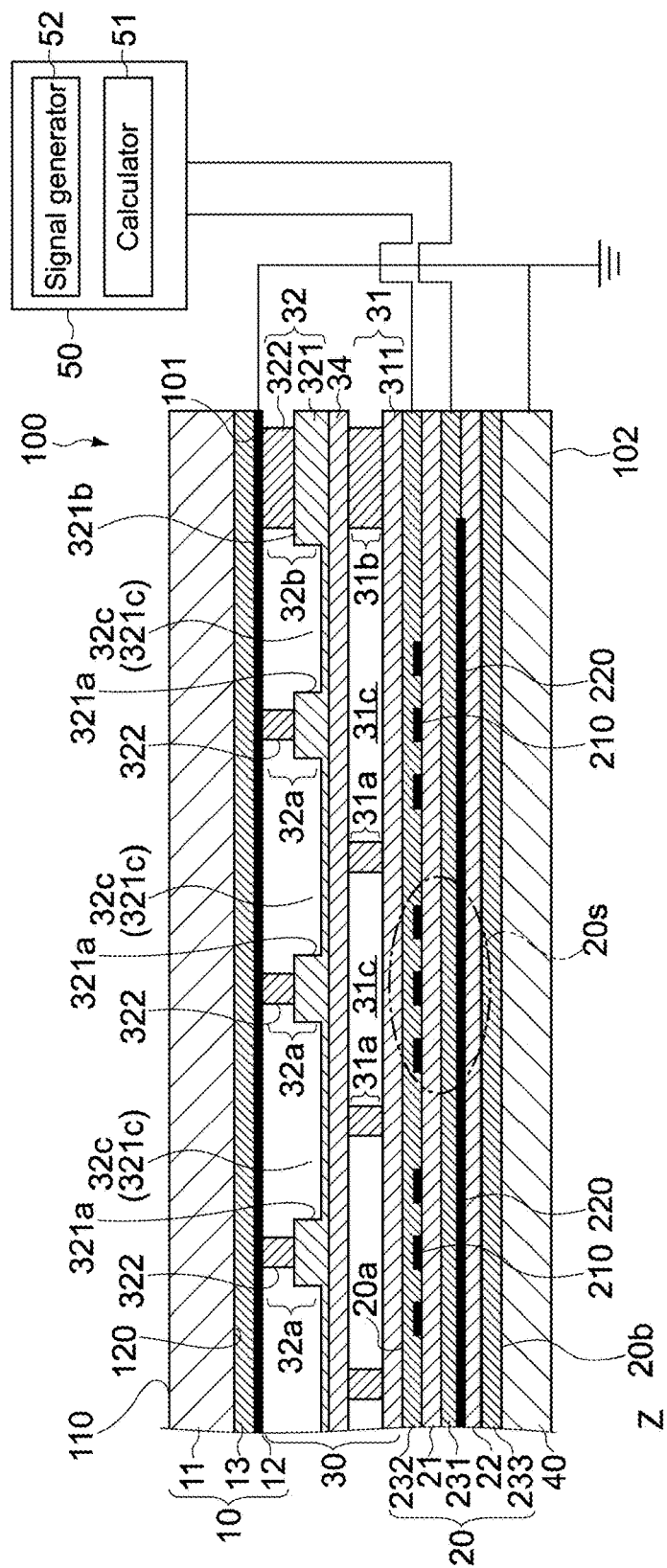
FIG. 3 is a cross-sectional view schematically showing the main part of the input device.
Figure 4:
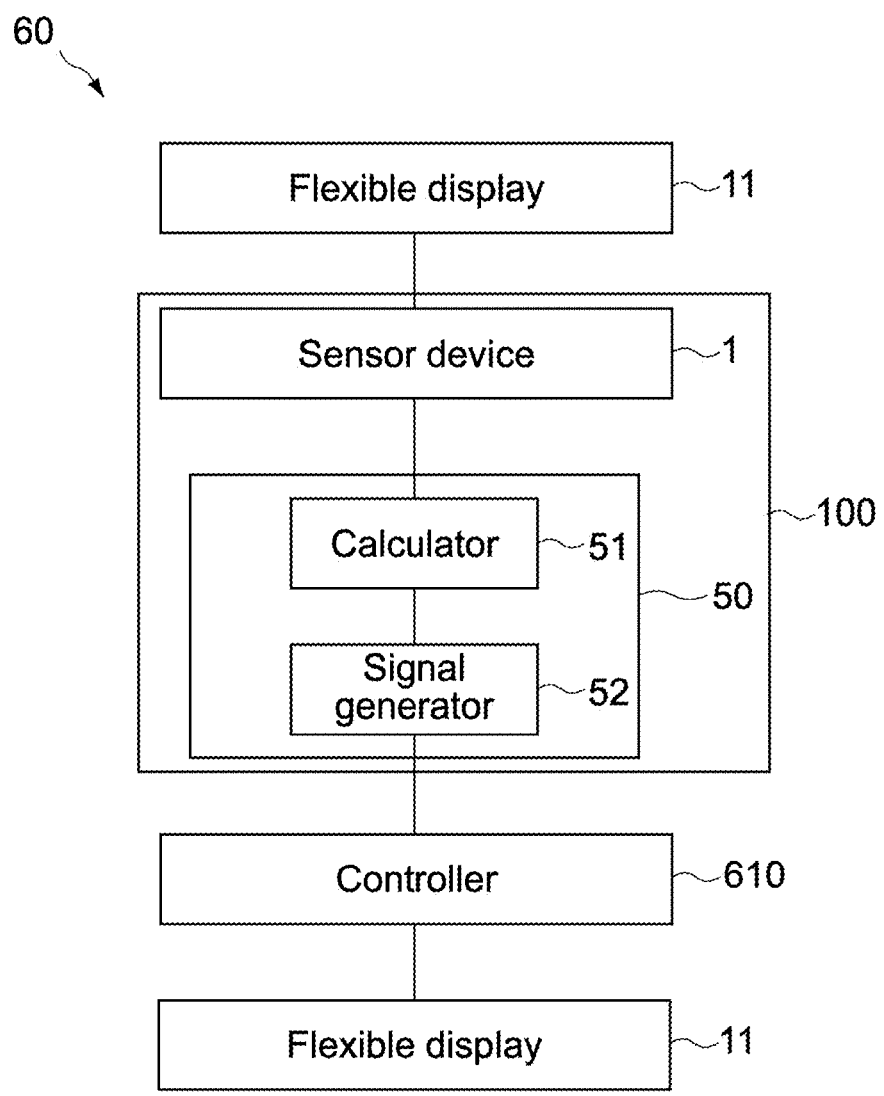
FIG. 4 is a block diagram showing an electronic apparatus including the input device.

FIG. 1 is a cross-sectional view schematically showing an input device 100 according to a first embodiment of the present technology. FIG. 2 is an exploded perspective view showing the input device 100. FIG. 3 is a cross-sectional view schematically showing the main part of the input device 100. FIG. 4 is a block diagram showing an electronic apparatus 60 including the input device 100. Hereinafter, the structure of the input device 100 of this embodiment will be described. Note that, in the drawings, the X axis and the Y axis show directions orthogonal to each other (directions on the surface of the input device 100), and the Z axis shows the direction orthogonal to the X axis and the Y axis (thickness direction of the input device 100, or vertical direction).

Input Device]

The input device 100 includes a flexible display 11 and a sensor device 1. The flexible display 11 receives operation input by a user. The sensor device 1 is configured to detect operation input by a user. The input device 100 is structured as for example a flexible touchscreen display, and built in the electronic apparatus (described later). Each of the sensor device 1 and the flexible display 11 is a plate extending in the directions orthogonal to the Z axis.

The flexible display 11 includes a front surface 110, and a back surface 120 behind the front surface 110. The flexible display 11 has both the function of an operation unit of the input device 100 and the function of a display unit. That is, the flexible display 11 causes the front surface 110 to function as an operation input surface and a display surface, and displays an image in the upper Z-axis direction in response to an operation input in the front surface 110 by a user. The front surface 110 displays for example an image corresponding to a keyboard, GUIs (Graphical User Interfaces), and the like. The flexible display 11 is operated with an operating member such as for example a finger or a stylus.

The specific structure of the flexible display 11 is not specifically limited. For example, the flexible display 11 may be a so-called electronic paper, an organic EL (electroluminescence) panel, an inorganic EL panel, a liquid crystal panel, or the like. Further, the thickness of the flexible display 11 is not specifically limited, and is for example about 0.1 mm to 1 mm.

The sensor device 1 includes a first surface 101, a second surface (third surface) 102, an electrode board 20, a support 30, a first conductor layer (conductor layer) 12, and a second conductor layer 40. The sensor device 1 is at the back surface 120 side of the flexible display 11.

The first surface 101 is deformable. The second surface 102 faces the first surface 101. The electrode board 20 is between the first surface 101 and the second surface 102. A plurality of capacitive elements 20s are arranged in a matrix in the electrode board 20. The support 30 includes a first support layer 31 and a second support layer 32. The first support layer 31 includes a plurality of first columns 31a. The second support layer 32 is layered on the first support layer 31. The support 30 is deformable following deformation of the first surface 101. The support 30 connects at least one of the first surface 101 and the second surface 102, and the electrode board 20.

In this embodiment, the sensor device 1 (input device 100) is characterized in that the support 30 is arranged on the electrode board 20, and in that the support 30 connects one of the first surface 101 and the second surface 102, and the electrode board 20. In the following, there will be firstly described the structure in which the support 30 connects the first surface 101 and the electrode board 20.

Operation is input in the front surface 110 of the flexible display 11. The sensor device 1 (input device 100) electrostatically detects the change of the distance between the first conductor layer 12 and the electrode board 20 due to the operation. The sensor device 1 (input device 100) thereby detects the input operation. The input operation is not only press (push) operation but also touch operation. Here, the press (push) operation means that a user consciously presses the front surface 110. In other words, the input device 100 is even capable of detecting a very small pressure force (for example about several tens of grams) applied due to general touch operation (described below). So the input device 100 is configured to detect touch operation similar to the touch operation that a normal touch sensor detects.

The input device 100 includes a control unit 50. The control unit 50 includes a calculator 51 and a signal generator 52. The calculator 51 detects operation input by a user based on change of electrostatic capacitance of the capacitive elements 20s. The signal generator 52 generates an operation signal based on the detection result of the calculator 51.

An electronic apparatus 60 of FIG. 4 includes a controller 610. The electronic apparatus 60 processes information based on an operation signal generated by the signal generator 52 of the input device 100. The controller 610 outputs the processed operation signal to the flexible display 11 as an image signal, for example. The flexible display 11 is connected to a driver circuit mounted on the controller 610 via a flexible wiring board 113 (see FIG. 2). The driver circuit may be mounted on the flexible wiring board 113.

In this embodiment, the flexible display 11 is part of the operated member 10 of the input device 100. In other words, the input device 100 includes the operated member 10, the second surface (third surface) 102, the electrode board 20, the support 30, and the second conductor layer 40. Hereinafter, those elements will be described.

(Operated Member)

The operated member 10 has a layer structure including the flexible display 11 and the first conductor layer 12. The flexible display 11 includes the front surface 110 and the back surface 120. In other words, the operated member 10 includes the front surface 110 and the back surface 120. The front surface 110 receives operation input by a user. The first conductor layer 12 is formed on the back surface 120. The back surface 120 is opposite to the front surface 110. The operated member 10 is a deformable sheet.

The first conductor layer 12 is supported by the support 30. The first conductor layer 12 is deformable. The first conductor layer 12 is a metal film. The metal film is a sheet deformable in response to deformation of the flexible display 11, and is a metal foil or a mesh member made of for example Cu (copper), Al (aluminum), stainless steel (SUS), or the like. The thickness of the first conductor layer 12 may not be specifically limited, and is for example several tens of nm to several tens of μm. The first conductor layer 12 is connected with a ground potential, for example. The first conductor layer 12 may not be metal as long as it functions as a conductive layer. For example, the first conductor layer 12 may be an oxide conductor such as ITO (indium tin oxide) or an organic conductor such as carbon nanotube. With this configuration, the first conductor layer 12 of the electronic apparatus 60 functions as an electromagnetic shield layer. In other words, for example, the first conductor layer 12 prevents electromagnetic waves from entering from other electronic components and the like mounted on the electronic apparatus 60. The first conductor layer 12 prevents electromagnetic waves from leaking from the input device 100. The electronic apparatus 60 is thereby capable of operating stably. Note that the first conductor layer 12 may include a plurality of layers each connected with the ground potential (see FIG. 6). With this configuration, the function of the electromagnetic shield layer is enhanced.

For example, as shown in FIG. 3, a metal foil is formed on an adhesive bond layer 13. The bond layer 13 is attached to the flexible display 11. The first conductor layer 12 is thereby formed. The adhesive material of the bond layer 13 is not limited. The bond layer 13 may be a resin film made of a resin material. Alternatively, the bond layer 13 may be a vapor-deposited film, a sputtered film, or the like directly formed on the flexible display 11. The bond layer 13 may be a coated film such as a conductive-paste film printed on the front surface of the flexible display 11. Further, a nonconductive film may be formed on the front surface of the first conductor layer 12. For example, a damage-proof hard coat layer, an anticorrosion antioxidant film, or the like may be formed as the nonconductive film.

(Second Conductor Layer 40)

The second conductor layer 40 is the lowermost layer of the input device 100, and faces the first conductor layer 12 in the Z-axis direction. Specifically, the second conductor layer 40 is below the electrode board 20. A bond layer 233 is provided between the second conductor layer 40 and the electrode board 20. The second conductor layer 40 may be a metal plate made of for example Al alloy, Mg (magnesium) alloy, and other metal materials, or may be a conductor plate made of carbon fiber-reinforced plastic or the like. Alternatively, the second conductor layer 40 may be a laminate, in which a conductor film is formed on an insulation layer made of a plastic material or the like. Examples of the conductor film include a plated film, a vapor-deposited film, sputtered film, a metal foil, and the like. Further, the thickness of the second conductor layer 40 is not specifically limited, and is for example about 0.3 mm.

(Method of Connecting First and Second Conductor Layers with Ground Potential)

Figure 5:
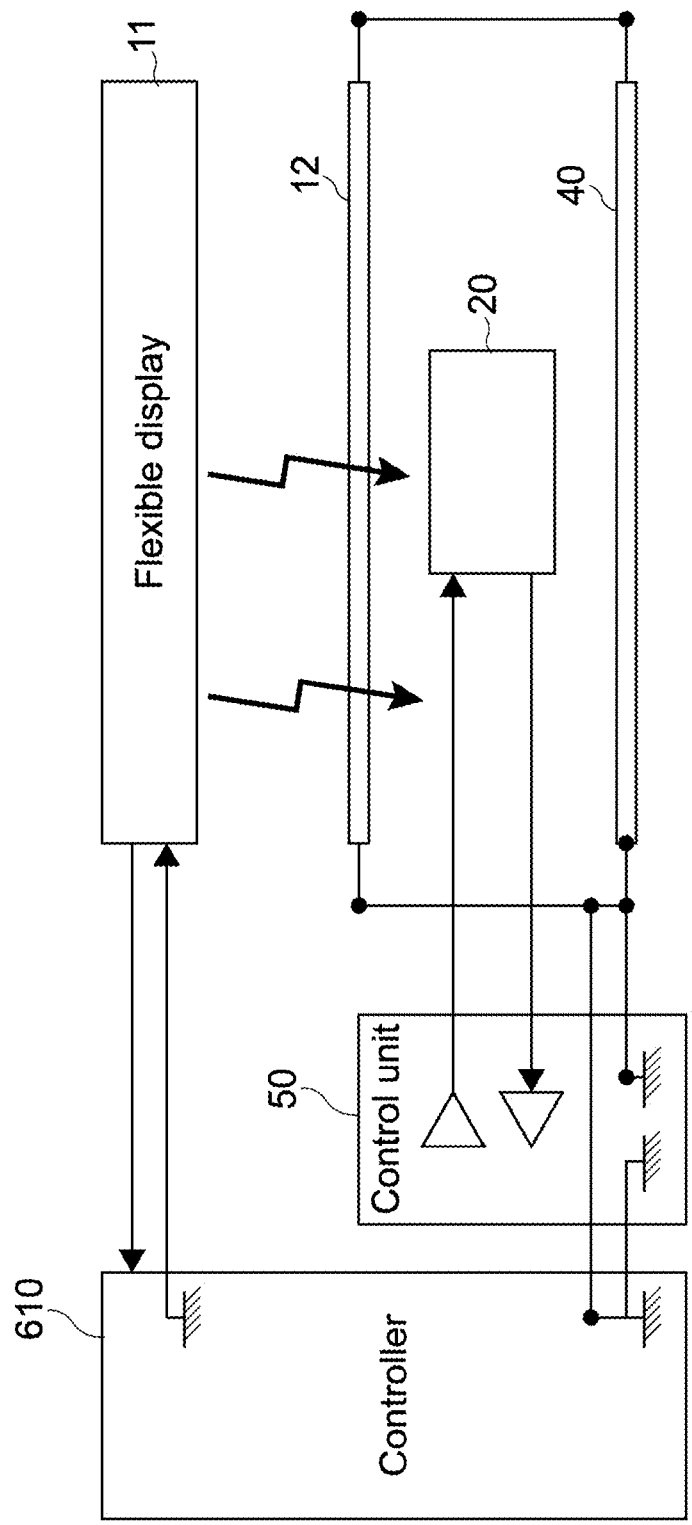
FIG. 5 is a diagram schematically illustrating a method of connecting the first conductor layer and the second conductor layer of the input device with the ground potential.

FIG. 5 is a diagram schematically illustrating a method of connecting the first conductor layer 12 and the second conductor layer 40 with the ground potential. As shown in FIG. 5, for example, the first conductor layer 12 and the second conductor layer 40 are connected with the ground of the control unit 50 of the input device 100 and with the ground of the controller 610 of the electronic apparatus 60.

Here, the flexible display 11 affects the detection sensitivity of the sensor device 1. If the first conductor layer 12 and the second conductor layer 40 are only connected with the ground of the control unit 50, the flexible display 11 may affect the ground potential of the control unit 50. The first conductor layer 12 may not exert the electromagnetic-shield effect enough. In view of this, the first conductor layer 12 and the second conductor layer 40 are connected with the ground of the controller 610, with which the flexible display 11 is connected. As a result, it is possible to maintain the ground potential more stably, and to improve the electromagnetic-shield effect. Further, as shown in FIG. 5, by connecting the first conductor layer 12 and the second conductor layer 40 at a larger number of contact points, the electromagnetic-shield effect may be improved.

Figure 6:
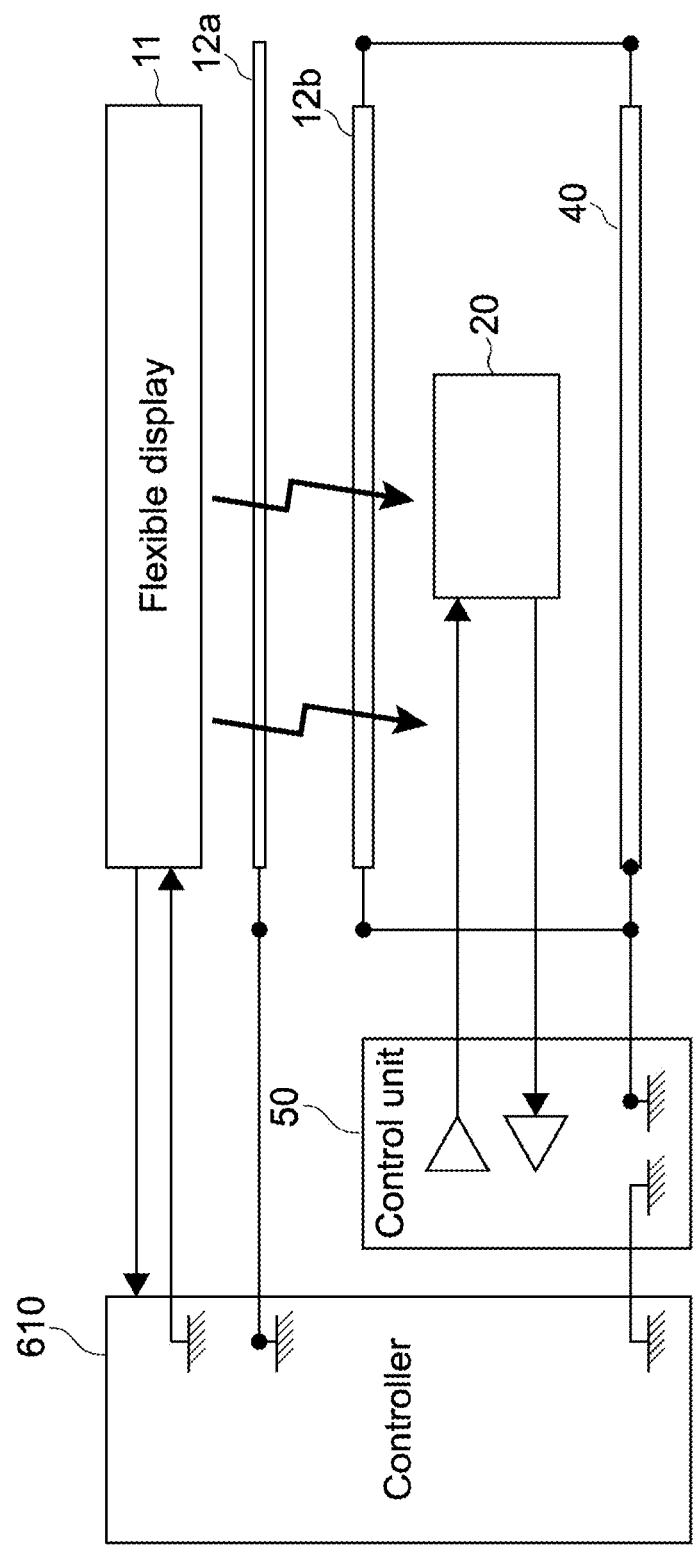
FIG. 6 is a diagram schematically illustrating a method of connecting the first conductor layer and the second conductor layer with the ground potential, according to a modification example.

Alternatively, as shown in FIG. 6, the first conductor layer 12 may include a plurality of layers. In the example of FIG. 6, the first conductor layer 12 includes a first conductor layer 12a at the flexible display 11 side, and a first conductor layer 12b at the electrode board 20 side. The first conductor layer 12b may not be layered on the first conductor layer 12a. Alternatively, the first conductor layer 12b may be between the first support layer 31 and the second support layer 32 (see Modification Example 1-2 (described below)). With this configuration, for example, the first conductor layer 12a may be connected with the ground of the controller 610, and the first conductor layer 12b may only be connected with the control unit 50. Alternatively, the first conductor layer 12b may be connected with both the control unit 50 and the controller 610. Also with this structure, the electromagnetic-shield effect may be improved.

(First Surface and Second Surface)

The first surface 101 is deformable, and may be one main surface of the sensor device 1. In other words, the first surface 101 is deformable due to operation input by a user, bending, distortion, and the like. In this embodiment, the first surface 101 of the sensor device 1 may be next to the flexible display 11. For example, the first surface 101 is formed on the first conductor layer 12.

The second surface 102 faces the first surface 101. The second surface 102 may be the other main surface of the sensor device 1, which is opposite to the first surface 101. In this embodiment, the second surface 102 is formed on the second conductor layer 40.

(Electrode Board)

The electrode board 20 is a laminate including a first wiring board 21 and a second wiring board 22. The first wiring board 21 includes the plurality of first electrode wires 210. The second wiring board 22 includes a plurality of second electrode wires 220. As a whole, the electrode board 20 is a board including a first main surface 20a and a second main surface 20b. The first main surface 20a faces the first surface 101, and may be formed on a bond layer 232 (described below). The second main surface 20b faces the second surface 102, and may be formed on the bond layer 233 (described below).

The first wiring board 21 includes a first base material 211 (see FIG. 2) and the plurality of first electrode wires (X electrodes) 210. The first base material 211 is for example a sheet material made of a resin material or the like, and is specifically an electric-insulation plastic sheet (film) or the like made of PET, PEN, PC, PMMA, polyimide, or the like. The thickness of the first base material 211 is not specifically limited, and is for example several tens of μm to several hundreds of μm.

The plurality of first electrode wires 210 are integrally formed on one surface of the first base material 211. The plurality of first electrode wires 210 are arrayed at predetermined intervals in the X-axis direction, and are formed approximately linearly in the Y-axis direction. The first electrode wires 210 are drawn to the rim of the first base material 211 or the like, and connected with different terminals, respectively. Further, the first electrode wires 210 are electrically connected with the control unit 50 via the terminals.

Note that each of the plurality of first electrode wires 210 may be a single electrode wire. Alternatively, the first electrode wire 210 may be an electrode group 21w (see FIG. 11) including a plurality of electrodes arrayed in the X-axis direction. Further, a plurality of electrode wires of each electrode group 21w may be connected to a common terminal, or connected to two or more different terminals separately.

Meanwhile, the second wiring board 22 includes a second base material 221 (see FIG. 2) and the plurality of second electrode wires (Y electrodes) 220. Similarly to the first base material 211, for example, the second base material 221 is made of a sheet material made of a resin material or the like. Specifically, the second base material 221 is made of an electrical-insulative plastic sheet (film) or the like such as PET, PEN, PC, PMMA, or polyimide. The thickness of the second base material 221 is not specifically limited, and is for example several tens of μm to several hundreds of μm. The second wiring board 22 faces the first wiring board 21.

The plurality of second electrode wires 220 are formed similarly to the plurality of first electrode wires 210. In other words, the plurality of second electrode wires 220 are integrally formed on one surface of the second base material 221. The plurality of second electrode wires 220 are arrayed at predetermined intervals in the Y-axis direction, and are formed approximately linearly in the X-axis direction. Further, each of the plurality of second electrode wires 220 may be a single electrode wire. Alternatively, the second electrode wire 220 may be an electrode group 22w (see FIG. 11) including a plurality of electrodes arrayed in the Y-axis direction.

The second electrode wires 220 are drawn to the rim of the second base material 221 or the like, and connected with different terminals, respectively. Further, a plurality of electrode wires of each electrode group 22w may be connected to a common terminal, or connected to two or more different terminals separately. Further, the second electrode wires 220 are electrically connected with the control unit 50 via the terminals.

The first electrode wires 210 and the second electrode wires 220 may be formed by printing a conductive paste or the like by using a printing method such as screen printing, gravure offset printing, or ink-jet printing. Alternatively, the first electrode wires 210 and the second electrode wires 220 may be formed by a patterning method using a photolithography technique of a metal foil or a metal layer.

As shown in FIG. 3 and FIG. 4, the electrode board 20 includes a bond layer 231, a bond layer 232, and a bond layer 233. The bond layer 231 bonds the first wiring board 21 and the second wiring board 22. The bond layer 232 bonds the first wiring board 21 and the base material 311 of the first support layer 31 (described below). The bond layer 233 bonds the second wiring board 22 and the second conductor layer 40. Each bond layer 231, 232, or 233 is electrical-insulative, and is an adhesive material or the like such as a cured adhesive agent or an adhesive tape, for example.

According to this structure, the first electrode wires 210 face the second electrode wires 220 in the thickness direction of the electrode board 20, i.e., the Z-axis direction. Further, the electrode board 20 includes the plurality of capacitive elements 20s. The first electrode wires 210 intersect with the second electrode wires 220. The plurality of capacitive elements 20s are formed in the intersection areas.

FIG. 7A is a cross-sectional view schematically illustrating the structure of the capacitive elements 20s. The capacitive element 20s is a mutual-capacitive-type capacitive element. The capacitive element 20s includes the first electrode wire 210, the second electrode wire 220, and a dielectric layer. The first electrode wire 210 faces the second electrode wire 220 in the Z-axis direction. The dielectric layer is between the first and second electrode wires 210 and 220. Note that, in the following description, in FIGS. 7A and 7B, each of the first and second electrode wires 210 and 220 is a single electrode wire.

In the example of FIG. 7A, the first electrode wires 210 ($210x1$, $210x2$, and $210x3$) face the second electrode wire 220 ($220y$) in the Z-axis direction. In the example of FIG. 7A, the bond layer 231 bonds the first wiring board 21 and the second wiring board 22. The first base material 211 of the first wiring board 21 and the bond layer 231 function as the dielectric layer. In this case, the first electrode wires $210x1$, $210x2$, and $210x3$ capacitively-couple with the second electrode wire $220y$ at intersection areas. The capacitive elements $20s1$, $20s2$, and $20s3$ are formed in the intersection areas. The capacitive elements $20s1$, $20s2$, and $20s3$ have electrostatic capacitance C1, C2, and C3, respectively. The electrostatic capacitance C1, C2, and C3 are changed depending on capacitive-coupling of the first conductor layer 12 and the first electrode wires $210x1$, $210x2$, and $210x3$ and the second electrode wire $220y$, and depending on capacitive-coupling of the second conductor layer 40 and the first electrode wires $210x1$, $210x2$, and $210x3$ and the second electrode wire $220y$. Note that the initial capacitance of the capacitive elements 20s depends on, for example, the facing-area of the first and second electrode wires 210 and 220, the facing-distance between the first and second electrode wires 210 and 220, and the permittivity of the bond layer 231.

Further, FIG. 7B shows a modification example of the structures of the capacitive elements 20s, in which the first electrode wires 210 ($210x1$, $210x2$, and $210x3$) and the second electrode wires 220 ($220y1$, $220y2$, and $220y3$) are on the single plane on the first base material 211, and capacitively-couple with each other on the XY plane. In this case, the first electrode wires 210 face the second electrode wires 220 in an in-plane direction (for example X-axis direction) of the electrode board 20. For example, the first base material 211 functions as a dielectric layer of the capacitive elements 20s ($20s1$, $20s2$, and $20s3$). Also according to this arrangement, the electrostatic capacitance C11, C12, and C13 of the capacitive elements $20s1$, $20s2$, and $20s3$ are changeable depending on capacitive-coupling of the first conductor layer 12 and the first and the second electrode wires $210x$ and $220y$, and depending on capacitive-coupling of the second conductor layer 40 and the first and the second electrode wires $210x$ and $220y$. Further, according to this structure, it is not necessary to provide a second base material and a bond layer. As a result, the thickness of the input device 100 may be reduced.

In this embodiment, the plurality of capacitive elements 20s face the first columns 31a (described below) in the Z-axis direction. Alternatively, the plurality of capacitive elements 20s may face the second columns 32a (described below) in the Z-axis direction. Further, in this embodiment, the first wiring board 21 is layered on and is above the second wiring board 22. Alternatively, the second wiring board 22 may be layered on and may be above the first wiring board 21.

(Control Unit)

The control unit 50 is electrically connected with the electrode board 20. More specifically, the control unit 50 is connected with the plurality of first and second electrode wires 210 and 220 via terminals. The control unit 50 functions as a signal-processor circuit, and is capable of generating information on operation input in the front surface 110 based on output from the plurality of capacitive elements 20s. The control unit 50 scans the plurality of capacitive elements 20s at a predetermined frequency, obtains the amounts of capacitance change of the capacitive elements 20s at the same time, and generates information on input operation based on the amounts of capacitance change.

Typically, the control unit 50 is a computer including a CPU/MPU, a memory, and the like. The control unit 50 may be a single chip component, or may include a plurality of circuit components. The control unit 50 may be mounted on the input device 100. Alternatively, the control unit 50 may be mounted on the electronic apparatus 60, and the electronic apparatus 60 is mounted on the input device 100. In the former case, for example, the control unit 50 is mounted on a flexible wiring board connected to the electrode board 20. In the latter case, the control unit 50 may be integrally formed with the controller 610 configured to control the electronic apparatus 60.

As described above, the control unit 50 includes the calculator 51 and the signal generator 52, and executes various functions according to programs stored in storage (not shown). The calculator 51 calculates the operated position on the XY coordinate system of the front surface 110 (first surface 101) based on electric signals (input signals) output from the first and second electrode wires 210 and 220 of the electrode board 20. The signal generator 52 generates an operation signal based on the result. As a result, the flexible display 11 displays an image based on operation input in the front surface 110.

The calculator 51 of FIGS. 3 and 4 calculates the XY coordinate of the position on the front surface 110, which is operated by a stylus, based on output from the capacitive elements 20s. Each capacitive element 20s has its unique XY coordinate. Specifically, the calculator 51 calculates the amounts of change of electrostatic capacitance of the capacitive elements 20s based on the amounts of change of electrostatic capacitance obtained from the X electrodes 210 and the Y electrodes 220. The capacitive elements 20s are formed in the intersection areas of the X electrodes 210 and the Y electrodes 220. By calculating the ratio, the center of gravity, and the like of the amounts of change of electrostatic capacitance of the capacitive elements 20s, the XY coordinate of the position operated by a stylus may be calculated.

Further, the calculator 51 is capable of determining if operation is input in the front surface 110 of the flexible display 11 or not. Specifically, for example, it is determined that operation is input in the front surface 110 if the amount of change of electrostatic capacitance of the entire capacitive elements 20s is equal to or larger than a predetermined threshold, if the amount of change of electrostatic capacitance of each capacitive element 20s is equal to or larger than a predetermined threshold, or the like. Further, if the threshold has two or more levels, for example, it is possible to distinguish between touch operation and (conscious) push operation. Further, a pressure force may be calculated based on the amounts of change of electrostatic capacitance of the capacitive elements 20s.

Further, the calculator 51 is capable of detecting deformation of the front surface 110 and the first surface 101 in view of the amount of change of electrostatic capacitance between the plurality of adjacent capacitive elements 20s. As a result, the input device 100 is capable of detecting not only touch operation and push operation but also bending, distortion, and the like of the front surface 110 and the first surface 101. The input device 100 is capable of responding to various types of gesture operation.

The calculator 51 is capable of outputting the calculation results to the signal generator 52.

The signal generator 52 generates predetermined operation signals based on the calculation results of the calculator 51. Examples of the operation signals include, for example, an image-control signal output to the flexible display 11 to generate an image displayed thereon, operation signals corresponding to keys of a keyboard image displayed on the operated position of the flexible display 11, an operation signal of operation input in a GUI (Graphical User Interface), and the like.

Here, the input device 100 includes the support 30. The support 30 is configured to allow the distance between the first conductor layer 12 and the electrode board 20 (capacitive elements 20s) to change. Hereinafter, the support 30 will be described.

(Basic Structure of Support)

The support 30 is on the first main surface 20a of the electrode board 20. The support 30 connects the first surface 101 of the first conductor layer 12 and the electrode board 20. The support 30 may include a plurality of support layers. In this embodiment, the support 30 includes the first support layer 31, the second support layer 32, and a bond layer 34. The second support layer 32 is layered on the first support layer 31. The bond layer 34 bonds the first and second support layers 31 and 32.

Here, the situation "the support 30 is on the electrode board 20" means that the support 30 is on one of the first main surface 20a and the second main surface 20b of the electrode board 20. Further, the situation "the second support layer 32 is layered on the first support layer 31" means both the situation in which the second support layer 32 is layered on the first support layer 31 and is above the first support layer 31 in the Z-axis direction, and the situation in which the second support layer 32 is layered on the first support layer 31 and is below the first support layer 31 in the Z-axis direction. Further, the situation "the second support layer 32 is layered on the first support layer 31" also means the situation in which the bond layer 34 or the like is interposed between the first support layer 31 the second support layer 32.

The first support layer 31 is on the first main surface 20a of the electrode board 20. The first support layer 31 includes the plurality of first columns 31a, a first frame 31b, a first space 31c, and the base material 311. In this embodiment, the first support layer 31 is bonded to the electrode board 20, and the base material 311 is on the electrode board 20 (see FIG. 3).

As shown in FIG. 3, the base material 311 is on the electrode board 20. In the first support layer 31, the first columns 31a and the first frame 31b are directly formed on the base material 311. The base material 311 may be an electrical-insulative plastic sheet made of PET, PEN, PC, or the like. For example, the first columns 31a and the first frame 31b are made of an adhesive insulative resin material. The first columns 31a and the first frame 31b also function as bonds, and bond the second conductor layer 40 and the electrode board 20. The thickness of the first columns 31a and the first frame 31b is not specifically limited, and is several μm to several hundreds of μm, for example.

The elastic modulus of the first columns 31a is not specifically limited. In other words, the elastic modulus of the first columns 31a may be arbitrarily selected as long as desired operation feeling and desired detection sensitivity are achieved. The first columns 31a may be made of an elastic material such that the first columns 31a are deformable together with the electrode board 20 during input operation.

The plurality of first columns 31a are arranged corresponding to the capacitive elements 20s, respectively. In this embodiment, for example, the plurality of first columns 31a are between the plurality of adjacent capacitive elements 20s, respectively.

The first frame 31b surrounds the first support layer 31 along the rim of the electrode board 20s. The length of the first frame 31b in the short-side direction, i.e., the width, is not specifically limited as long as the first support layer 31 and the entire input device 100 have enough strength.

The first space 31c is around the plurality of first columns 31a. The first space 31c is a space area around the first columns 31a and the first frame 31b. In this embodiment, the capacitive elements 20s and the second columns 32a are in the first space 31c seen in the Z-axis direction.

Meanwhile, the bond layer 34 bonds the first support layer 31 and the second support layer 32. The bond layer 34 is deformable, and may be made of a resin film material or the like, for example. For example, the bond layer 34 may be an electrical-insulative plastic sheet made of PET, PEN, PC, or the like. The thickness of the bond layer 34 is not specifically limited, and is several μm to several hundreds of μm, for example.

The second support layer 32 may be bonded between the first support layer 31 and the first conductor layer 12. The second support layer 32 may include the plurality of second columns 32a, a second frame 32b, and a second space 32c.

As shown in FIG. 3, the second support layer 32 has a layer structure. The layer structure includes a structural layer 321 and a plurality of bonds 322. The structural layer 321 is on the front surface (top surface) of the bond layer 34. The plurality of bonds 322 are formed on predetermined positions of the structural layer 321.

The structural layer 321 is formed of an electric-insulative resin material such as UV-curable resin. The structural layer 321 on the bond layer 34 includes the plurality of first protrusions 321a, the second protrusion 321b, and the concaves 321c. Each first protrusion 321 is for example, a column, a prism, a truncated pyramid, or the like protruding in the Z-axis direction. The first protrusions 321a are arrayed on the bond layer 34 at predetermined intervals. The second protrusion 321b has a predetermined width and surrounds the rim of the bond layer 34.

Further, the structural layer 321 is made of a material having relatively high rigidity so that the electrode board 20 may be deformed in response to operation input in the operated member 10. Alternatively, the structural layer 321 may be made of an elastic material so that the structural layer 321 may be deformed together with the operated member 10 during an input operation. In other words, the elastic modulus of the structural layer 321 is not specifically limited, and may be arbitrarily selected as long as desired operation feeling and desired detection sensitivity are achieved.

The concaves 321c form a flat surface around the first and second protrusions 321a and 321b. In other words, the space zone above the concaves 321c is the second space 32c. Further, in this embodiment, an anti-adhesive layer (not shown) may be formed on the concaves 321c. The anti-adhesive layer is made of a low-adhesive UV-curable resin or the like. In this case, the shape of the anti-adhesive layer is not specifically limited. The anti-adhesive layer may have an island shape, or may be a flat film formed on the concaves 321c.

Further, the plurality of bonds 322 are provided on the first and second protrusions 321a and 321b, respectively, and are made of an adhesive resin material or the like. In other words, each second column 32a is a laminate including the first protrusion 321a and the bonds 322 formed thereon. Each second frame 32b is a laminate including the second protrusion 321b and the bond 322 formed thereon. With this structure, the thicknesses (heights) of the second columns 32a and the second frame 32b are approximately the same, and are for example several μm to several hundreds of μm in this embodiment.

Each of the plurality of second columns 32a is between the adjacent first columns 31a. In other words, the second columns 32a correspond to the capacitive elements 20s, respectively. In this embodiment, the second columns 32a face the capacitive elements 20s in the Z-axis direction, respectively. Meanwhile, the second frame 32b surrounds the first support layer 31 along the rim of the second conductor layer 40. The width of the second frame 32b is not specifically limited as long as the second support layer 32 and the entire input device 100 have enough strength. The width of the second frame 32b is approximately the same as the width of the first frame 31b, for example.

Note that the structure is not limited to the above. For example, a first support layer may have a layer structure including a base material, a structural layer, and bonds. A second support layer may be directly formed on the base material. Alternatively, both a first support layer and a second support layer may have the layer structures. Alternatively, each of a first support layer and a second support layer may be directly formed on the base material.

The first and second support layers 31 and 32 having the above-mentioned structures are formed as follows.

(Methods of Manufacturing First and Second Support Layers)

FIG. 8 is a cross-sectional view schematically and exemplarily showing a method of manufacturing the first support layer 31. In FIG. 8, a high-adhesive UV-curable resin or the like is applied directly on the base material 311 on the electrode board 20 by using a screen printing method, for example, such that a predetermined pattern of the high-adhesive UV-curable resin or the like is formed. As a result, the first columns 31a and the first frame 31b are formed. According to this method, the number of steps is reduced largely, and productivity may be increased.

Meanwhile, FIGS. 9A and 9B are cross-sectional views schematically and exemplarily showing a method of manufacturing the second support layer 32. Firstly, a UV-curable resin is applied on the bond layer 34, and a predetermined pattern is formed on the resin. According to this method, as shown in FIG. 9A, the structural layer 321 is formed. The structural layer 321 includes a plurality of first and second protrusions 321a and 321b, and the concaves 321c. The UV-curable resin may be a solid sheet material or a liquid UV-curable material. Further, the method of manufacturing a pattern is not specifically limited. For example, there may be employed a method including preparing a cylindrical die having a predetermined concavo-convex pattern, transferring the concavo-convex pattern of the die to a UV-curable resin, irradiating the UV-curable resin with UV from the bond layer 34 side, and thereby curing the UV-curable resin. Alternatively, a UV-curable resin may not be used. For example, a pattern may be formed by using a general thermoforming method (for example press forming or injection molding), or a method of discharging a resin material from a dispenser or the like.

Next, with reference to FIG. 9B, for example, by using a screen printing method, the bonds 322 made of a high-adhesive UV-curable resin or the like are formed on the protrusions 321a. The bonds 322 bond the second support layer 32 and the first conductor layer 12. According to the manufacturing method, the second columns 32a and the second frame 32b are formed and have desired shapes. Note that before forming the bonds 322, a low-adhesive UV-curable resin or the like may be applied on the concaves 321c by using a screen printing method, for example, such that a predetermined pattern of the low-adhesive UV-curable resin is formed. As a result, the above-mentioned anti-adhesive layer is formed (not shown).

The above-mentioned manufacturing method is merely an example. For example, the first support layer 31 may be formed by using the method of FIGS. 9A and 9B. For example, the second support layer 32 may be formed by using the method of FIG. 8. Further, the first and second support layers 31 and 32 may be formed by using the below-mentioned method of FIGS. 10A and 10B.

FIGS. 10A and 10B are cross-sectional views schematically showing a method of manufacturing the first or second support layer 31 or 32 according to a modification example. Note that with reference to FIGS. 10A and 10B, description will be made by using the referential symbols of the first support layer 31. In FIG. 10A, a UV-curable resin or the like is applied on the base material 311 by using a screen printing method, for example, such that a predetermined pattern of the UV-curable resin or the like is formed. As a result, first and second protrusions 311a and 311b are formed. Further, for example, by using a screen printing method, bonds 312 made of a high-adhesive UV-curable resin or the like are formed on the first and second protrusions 311a and 311b. As a result, the first columns 31a (second columns 32a) and the first frame 31b (or second frame 32b) are formed. Each first column 31a (second column 32a) includes the first protrusion 311a and the bond 312. The first frame 31b (or second frame 32b) includes the second protrusion 311b and the bond 312.

Next, the planer arrangement of the first and second columns 31a and 32a will be described. Also, the relation between the first and second columns 31a and 32a and the first and second electrode wires (X electrodes, Y electrodes) 210 and 220 will be referred to.

(Example of Arrangement of First and Second Columns)

Each of FIGS. 11A and 11B is a plan view schematically and exemplarily showing arrangement of the first and second columns 31a and 32a, the first electrode wires (X electrodes) 210, and the second electrode wires (Y electrodes) 220. In the examples of FIGS. 11A and 11B, each X electrode 210 has an electrode group 21w, and each Y electrode 220 has an electrode group 22w. Further, as described above, the capacitive elements 20s are in the intersection areas of the X electrodes 210 and the Y electrodes 220, respectively. In FIGS. 11A and 11B, for example, the four capacitive elements 20s are surrounded by bold dotted lines. Note that in FIGS. 11A and 11B, the white circles represent the first columns 31a, and the black circles represent the second columns 32a.

In the example of FIG. 11A, the number of the first columns 31a is approximately the same as the number of the second columns 32a. In other words, the first columns 31a surround each capacitive element 20s. The pitch of the first columns 31a in the X-axis direction is the same as the pitch D1x (not shown) of the capacitive elements 20s in the X-axis direction. The pitch of the first columns 31a in the Y-axis direction is the same as the pitch D1y of the capacitive elements 20s in the Y-axis direction. Note that for illustrative purposes, each of FIGS. 11A and 11B only shows the pitches in the Y-axis direction. The second columns 32a are on approximately the center of the capacitive elements 20s, respectively. The second columns 32a are arranged at a regular interval at the same pitches D1x (not shown) and D1y as those of the first columns 31a. The second columns 32a are between the first columns 31a adjacent in the oblique direction, the angle between the oblique direction and each of the X-axis and Y-axis directions being about 45°.

In the example of FIG. 11B, the number of the first columns 31a is different from the number of the second columns 32a. In other words, similarly to the example of FIG. 11A, the second columns 32a are on approximately the center of the capacitive elements 20s, respectively. The second columns 32a are arranged at the pitches D1x (not shown) and D1y. Meanwhile, the arrangement and the number of the first columns 31a are different from those of FIG. 11A. The pitches D2x (not shown) and D2y of the first columns 31a are half of the pitches D1x (not shown) and D1y of the second columns 32a. Seen in the Z-axis direction, the first columns 31a surround the second columns 32a and the capacitive elements 20s. If the number of the first columns 31a is larger than the number of the second columns 32a, strength of the entire input device 100 may be increased.

Further, the number and the arrangement (pitch) of the first and second columns 31a and 32a are adjusted. As a result, the amounts of change of the distance between the first conductor layer 12 and the capacitive elements 20s depending on a pressure force or the like may be adjusted. Further, the amounts of change of the distance between the second conductor layer 40 and the capacitive elements 20s depending on a pressure force or the like may be adjusted. As a result, desired operation feeling and desired detection sensitivity are achieved.

Note that in the above-mentioned structure, the second columns 32a face the capacitive elements 20s. Alternatively, the first columns 31a may face the capacitive elements 20s. In other words, in FIGS. 11A and 11B, the black circles may represent the first columns 31a, and the white circles may represent the second columns 32a.

As described above, in this embodiment, the first and second support layers 31 and 32 have the following structures. The second support layer 32 is layered on the first support layer 31. Seen in the Z-axis direction, the first columns 31a do not overlap with the second columns 32a. The first columns 31a are in the second space 32c. So, as described below, when a very small pressure force (even about several tens of grams) is applied to the first surface 101 during operation, the first surface 101 is deformed. In addition, deformability of the sensor device 1 (input device 100) in response to a predetermined pressure force may be uniform in the first surface 101. Hereinafter, effects of the support 30 will be described with reference to a comparative example.

(Effects of Supports)

Each of FIGS. 12A and 12B is a cross-sectional view schematically illustrating behavior of an input device 100A (sensor device 1A) of a comparative example of this embodiment. FIG. 12A shows that a stylus h presses a column 31Aa. FIG. 12B shows that the stylus h presses a space 31Ac. Similarly to the input device 100, the input device 100A includes the operated member 10 (flexible display 11 and first conductor layer 12) and the electrode board 20. The input device 100A further includes a support 30A, which is different from the support 30. The support 30A includes a single support layer 31A, and includes no second support layer. Similarly to the first support layer 31, the support layer 31A includes the columns 31Aa, the space 31Ac, and a frame (not shown). Note that if a user touches the input device 100A unconsciously, a very small pressure force is applied in fact. So in the following description, both conscious input operation and unconscious input operation will be collectively referred to as "pressing".

As shown in FIG. 12A, the stylus h presses a point PA1 above the column 31Aa in the Z-axis direction downward (hereinafter, simply referred to as "downward"). In this case, the column 31Aa beneath the point PA1 is elastically deformed slightly. As a result, as shown by the arrow of FIG. 12A, the first conductor layer 12 near the point PA1 is slightly displaced downward compared to the unpressed status.

Meanwhile, as shown in FIG. 12B, the stylus h presses a point PA2 above the space 31Ac downward. In this case, the space 31Ac is compressed without preventing the first conductor layer 12 from being displaced. As a result, as shown by the arrow of FIG. 12B, the first conductor layer 12 near the point PA2 is displaced downward largely compared to the unpressed status. The capacitive elements 20s near the point PA2 detect the pressure force and the operated position based on the displacement.

As described above, according to the input device 100A (sensor device 1A), the amount of deformation of the first conductor layer 12 is changed largely depending on operated positions even if an applied pressure force is approximately constant. Because of this, the amount of change of electrostatic capacitance of the capacitive element 20s corresponding to the point PA1 is small. The column 31Aa prevents the point PA1 from being deformed. As a result, the calculation accuracy of the coordinate of the operated position may be reduced. As a result, it may be difficult to detect the operated position accurately.

Each of FIGS. 13A and 13B is a cross-sectional view schematically illustrating behavior of the input device 100 (sensor device 1) of this embodiment. FIG. 13A shows that the stylus h presses the second column 32a. FIG. 13B shows that the stylus h presses the second space 32c.

As shown in FIG. 13A, the stylus h presses a point P1 above a second column 32a downward. In this case, as shown by the arrow of FIG. 13A, the first conductor layer 12 near the point P1 is flexibly-deformed downward. The reason is as follows. The second column 32a below the point P1 is above the deformable bond layer 34 and the first space 31c in the Z-axis direction (hereinafter, simply referred to as "above"), and is downwardly displaceable. As a result, the distance between the first conductor layer 12 and the capacitive element 20s is changed. The electrode board 20 is capable of detecting the pressure force and the operated position.

Meanwhile, as shown in FIG. 13B, the stylus h presses a point P2 near the second space 32c downward. Also in this case, the first conductor layer 12 near the point P2 is flexibly-deformed downward. The reason is as follows. The second space 32c is below the point P2. In addition, the second columns 32a in the second space 32c are also capable of being displaced downward. As a result, the distance between the first conductor layer 12 and the capacitive element 20s is changed. The electrode board 20 is capable of detecting the pressure force and the operated position.

As described above, in this embodiment, the first support layer 31 is layered on the second support layer 32, and the deformable bond layer 34 is interposed therebetween. In addition, the second columns 32a are between the first columns 31a. In other words, at least one of the first space 31c and the second space 32c is below the area-to-be-operated in the plane of the flexible display 11 and the first surface 101. The flexible display 11 and the first surface 101 are flexibly-deformable downward. So according to in this embodiment, the front surface 110 of the flexible display 11 and the first surface 101 may be deformed more uniformly in the plane. It is possible to keep the in-plane uniformity of the sensor sensitivity high.

Further, in the comparative example, if the columns 31Aa are made of an elastic material, when a column 31Aa is pressed, the columns 31Aa are elastically-deformed and compressed in the Z-axis direction. It takes a predetermined time for the columns 31Aa to return to the original shape after the pressure force is released. During this time, the first conductor layer 12 is kept displaced. As a result, the responsivity of the sensor may be deteriorated, and the operability may be reduced.

According to this embodiment, even if the second column 32a is pressed, the second column 32a is downwardly displaceable. The second column 32a is less affected by elastic deformation. As a result, the responsivity of the sensor may be increased, and the operability may be increased.

Hereinafter, a specific example of the amounts of change of electrostatic capacitance of the capacitive elements 20s during operation will be described.

(Example of Output from Capacitive Elements)

Each of FIGS. 14A and 14B includes a partial cross-sectional view and a diagram exemplarily showing output signals. The partial cross-sectional view schematically shows the behavior of the input device 100 when the front surface 110 of the flexible display 11 is operated by a stylus h. The latter diagram shows signals output from the capacitive elements 20s at this time. The bar chart of FIG. 14A along the X axis schematically shows the amounts of change of electrostatic capacitance of the capacitive elements 20s (20s11, 20s12, 20s13) from the reference value. The bar chart of FIG. 14B along the X axis schematically shows the amounts of change of electrostatic capacitance of the capacitive elements 20s (20s21, 20s22) from the reference value. Further, FIG. 14A shows that the stylus h presses a second column 32a. FIG. 14B shows that the stylus h presses the second space 32c.

In FIG. 14A, the second column 32a beneath the operated position receives the largest force. The second column 32a compresses the first space 31c, and is displaced downward at the same time. The distance between the capacitive element 20s12 and the first conductor layer 12 is changed greatly. As a result, the amount of change C12 of the electrostatic capacitance of the capacitive element 20s12 is attained. Meanwhile, the electrostatic capacitance of each of the capacitive elements 20s11 and 20s13 is not changed so much. As a result, the small amount of change C11 of the electrostatic capacitance of the capacitive element 20s11 and the small amount of change C13 of the electrostatic capacitance of the capacitive element 20s13 are attained.

In other words, as shown in FIG. 14A, the amounts of change C11, C12, and C13 of electrostatic capacitance have an angle distribution, in which C12 is the peak. The calculator 51 calculates the center of gravity and the like based on the ratio of C11, C12, and C13. The calculator 51 is capable of calculating the XY coordinate of the capacitive elements 20s12 as the operated position.

Meanwhile, in FIG. 14B, the first conductor layer 12 near the operated position is flexibly-deformed. As a result, the distance between the capacitive element 20s21 beneath the second column 32a1 and the first conductor layer 12 is changed. Further, the distance between the capacitive element 20s22 beneath the second column 32a2 and the first conductor layer 12 is changed. As a result, the amount of change C21 of electrostatic capacitance of the capacitive element 20s21 and the amount of change C22 of electrostatic capacitance of the capacitive element 20s22 are attained.

In the example of FIG. 14B, C21 is approximately the same as C22. Because of this, the calculator 51 is capable of calculating the XY coordinate of the operated position between the capacitive elements 20s21 and 20s22.

As described above, according to this embodiment, the support 30 has approximately uniform deformability irrespective of an operated position. As a result, it is possible to calculate the XY coordinate of an operated position accurately. As a result, the detection accuracy in the front surface 110 of the flexible display 11 is less variable. The detection accuracy may be kept high in the entire front surface 110.

Further, a general electrostatic capacitance sensor detects an operated position or the like based on capacitive-coupling of a stylus and X and Y electrodes. According to this method, if a conductor is provided between a stylus and X and Y electrodes, it is difficult to detect an input operation because of capacitive-coupling of the conductor and the X and Y electrodes. Further, if the distance between a stylus and X and Y electrodes is large, the capacitive-coupling amount thereof is small and detection sensitivity is reduced, which are problematic. In view of those circumstances, it is necessary to provide a sensor device on the display-surface of a display. In this case, the display-quality of the display is deteriorated, which is problematic.

According to the input device 100 (sensor device 1) of this embodiment, capacitive-coupling of the first conductor layer 12 and the X and Y electrodes 210 and 220 is used. So even if a conductor is provided between a stylus and the sensor device 1, detection sensitivity is not affected. Further, a larger range of the distance between a stylus and the X and Y electrodes is acceptable as long as the first conductor layer 12 is deformable in response to a pressure force applied by the stylus. So even if the sensor device 1 is on the back surface 120 of the flexible display 11, it is possible to detect an operated position and a pressure force accurately. It is possible to prevent the display properties of the flexible display 11 from being deteriorated.

Further, an insulator (dielectric material) is provided between a stylus and X and Y electrodes, and a larger range of the thickness of the insulator (dielectric material) is acceptable. So, for example, even if a user wearing a glove or the like (insulator) operates the input device 100, detection sensitivity is not reduced. So user-friendliness may be improved.

[Electronic Apparatus]

Each of FIGS. 15A and 15B is a diagram showing that the input device 100 of this embodiment is mounted on the electronic apparatus 60. In FIG. 15A, the electronic apparatus 60a includes a case 620a. The case 620a includes an opening 621a, in which the input device 100 is arranged. Further, a support 622a is formed in the opening 621a. The support 622a supports the rim of the second conductor layer 40 by using a bond 623a such as an adhesive tape. Further, the second conductor layer 40 may be bonded to the support 622a in a different manner. For example, the second conductor layer 40 may be bonded to the support 622a by using screws or the like.

Further, according to the input device 100 of this embodiment, the first and second frame 31b and 32b are formed along the rim. Because of this, the input device 100 has constant strength when the input device 100 is mounted on the electronic apparatus 60a.

The structure of the electronic apparatus 60b of FIG. 15B is approximately the same as the structure of the electronic apparatus 60a of FIG. 15A. The electronic apparatus 60b includes a case 620b. The case 620b includes the opening 621a and the support 622a. The electronic apparatus 60b is different from the electronic apparatus 60a in that the electronic apparatus 60b includes at least one auxiliary support 624b. The at least one auxiliary support 624b supports the back surface of the second conductor layer 40. The auxiliary support 624b may be or may not be bonded to the second conductor layer 40 by using an adhesive tape or the like. With this structure, the input device 100 may be supported more stably.

Hereinafter, modification examples of this embodiment will be described. The structures similar to the above-mentioned structures are denoted by the same referential symbols, and description thereof will be omitted. Note that in the following schematically cross-sectional views, part (bond layer 13, etc.) of the structures will be omitted appropriately.

Modification Example 1-1

Each of FIGS. 16A and 16B is a cross-sectional view schematically showing the input device 100 (sensor device 1) of Modification Example 1-1. As shown in FIGS. 16A and 16B, in the input device 100 (sensor device 1), the second support layer 32 may have various kinds of structure.

FIG. 16A shows one structural example of Modification Example 1-1. As shown in FIG. 16A, each second column 32a may include a plurality of adjacent second columnar members 32d. In other words, the second column 32a may be defined as a group of the plurality of second columnar members 32d. In this case, the second columnar members 32d may be structured similar to the above-mentioned second columns 32a. Further, the number of the second columnar members 32d of each second column 32a is not specifically limited.

If the number of the second columnar members 32d of one second column 32a is larger, deformability of the bond layer 34 may be increased in response to a predetermined pressure force or the like. The number of the second columnar members 32d of one second column 32a is selected depending on deformability of the bond layer 34. As a result, according to this structure, substantially uniform in-plane deformability may be attained in the front surface 110 of the flexible display 11 (first surface 101).

FIG. 16B shows another structural example of Modification Example 1-1. As shown in FIG. 16B, the second support layer 32 may include an elastically-deformable portion 325 made of an elastic material. For example, the elastically-deformable portion 325 may have a layered structure, and may fill the entire second support layer 32. The elastically-deformable portion 325 may be made of an elastic material such as, for example, a sponge material, a micro-cell polymer sheet, a porous sheet, a cushion material, a rubber material, a gel material including shock-absorbing gel, or the like. Further, the second support layer 32 may partially have the elastically-deformable portion 325. In this case, second columns or the like may be arranged in the rest area.

Note that if the elastically-deformable portion 325 is made of a bonding or adhesive material, the elastically-deformable portion 325 may also function as the bond layer 13 (not shown in FIGS. 16A and 16B). In this case, the bond layer may not be provided.

Also according to the elastically-deformable portion 325, substantially uniform in-plane deformability may be attained in the front surface 110 of the flexible display 11 and the first surface 101.

Modification Example 1-2

FIG. 17 is a partial cross-sectional view schematically showing the input device 100 (sensor device 1) of Modification Example 1-2. As shown in FIG. 17, the first conductor layer 12 may be provided between the first support layer 31 and the second support layer 32. In this case, the support 30 may not include a bond layer. The first support layer 31 may be bonded to the second support layer 32, and the first conductor layer 12 may be interposed therebetween. The first conductor layer 12 may be any deformable conductive sheet material. For example, the first conductor layer 12 may be an oxide conductor such as conductive ITO (indium tin oxide), an organic conductor such as carbon nanotube, a resin sheet with a metal thin film, a metal foil such as for example Cu (copper), Al (aluminum), or stainless steel (SUS), a mesh material, a conductive rubber sheet, or the like. Further, as described above, the first conductor layer 12 may be connected with a ground potential.

According to this modification example, the input device 100 (sensor device 1) behaves as follows. For example, when the operated member 10 above a second column 32a is pressed, the first conductor layer 12 is flexibly-deformed downward. The distance between the first conductor layer 12 and the electrode board 20 is changed. Meanwhile, when the operated member 10 above the second space 32c is pressed, the second columns 32a adjacent to the second space 32c are displaced downward. The distance between the first conductor layer 12 and the electrode board 20 is changed. Because the input device 100 (sensor device 1) behaves as described above, the electrode board 20 is capable of detecting the operated position on the front surface 110 of the flexible display 11.

According to this modification example, the distance between the first conductor layer 12 and the capacitive elements 20s may be reduced, and electrostatic capacitance thereof may be increased. As a result, the sensor sensitivity of the electrode board 20 may be increased.

Further, the first conductor layer 12 may include two first conductor layers (see FIG. 6), i.e., the first conductor layer 12a and the first conductor layer 12b. The first conductor layer 12a is formed on the back surface 120 of the flexible display 11. The first conductor layer 12b is between the first support layer 31 and the second support layer 32. As a result, the electromagnetic-shield effect may be increased.

Note that in this modification example, the "first surface" may be the back surface 120 of the flexible display 11. Alternatively, a metal film, an adhesive film, or the like may be formed on the back surface 120 of the flexible display 11. In this case, the surface of the film, which is in contact with the back surface 120, may be referred to as the "first surface".

Modification Example 1-3

FIG. 18 is a partial cross-sectional view schematically showing the input device 100 (sensor device 1) of Modification Example 1-3. As shown in FIG. 18, the arrangement of the support 30 and the electrode board 20 may be different from the above-mentioned arrangement. In other words, the support 30 may connect the second surface 102 and the electrode board 20. The electrode board 20 may be on the first conductor layer 12, and may be deformable. Further, the second surface 102 may be formed on the second conductor layer (conductor layer 40).

In this modification example, the electrode board 20 may be flexible as a whole. For example, a first base material and a second base material (not shown) may be made of a flexible sheet material.

In this modification example, the first support layer 31 of the support 30 is on the second main surface 20b of the electrode board 20. The second support layer 32 is layered on the first support layer 31, the bond layer 34 is interposed therebetween, and the second support layer 32 may be connected with the second conductor layer 40.

In this modification example, the input device 100 (sensor device 1) behaves as follows. In other words, for example, if the first column 31a is pressed, the first column 31a and the electrode board 20 thereabove are displaced downward. The distance between the second conductor layer 40 and the electrode board 20 is changed. Meanwhile, when the operated member 10 above the first space 31c is pressed, the first columns 31a adjacent to the first space 31c are displaced downward. The distance between the second conductor layer 40 and the electrode board 20 is changed. So, also according to this modification example, it is possible to detect deformation of the flexible display 11 and the first surface 101 effectively.

Modification Example 1-4

Each of FIGS. 19A and 19B is a partial cross-sectional view schematically showing the input device 100 (sensor device 1) of Modification Example 1-4. Similarly to Modification Example 1-3, in the input device 100 (sensor device 1) of Modification Example 1-4, the support 30 connects the second surface 102 and the electrode board 20, and the electrode board 20 is on the first conductor layer 12. Further, the second conductor layer (conductor layer) 40 may be between the first support layer 31 and the second support layer 32.

In this modification example, the second conductor layer 40 may be any deformable conductive sheet material. For example, the first conductor layer 12 may be an oxide conductor such as conductive ITO (indium tin oxide), an organic conductor such as carbon nanotube, a resin sheet with a metal thin film, a metal foil such as for example Cu (copper), Al (aluminum), or stainless steel (SUS), a mesh material, a conductive rubber sheet, or the like.

As shown in FIG. 19A, the input device 100 (sensor device 1) may include a back plate 42. The back plate 42 has the second surface 102. The back plate 42 is connected with the second support layer 32. The back plate 42 may be made of an insulative material or a conductive material. The back plate 42 is necessary to have enough stiffness as a support plate for the input device 100 (sensor device 1).

Alternatively, as shown in FIG. 19B, the second conductor layer 40 may include a plurality of second conductor layers. In other words, the second conductor layer 40 may include a second conductor layer 40a and a second conductor layer 40b. The second conductor layer 40a is between the first support layer 31 and the second support layer 32. The second conductor layer 40b is below the second support layer 32. The second surface 102 is formed on the second conductor layer 40b. With this structure, the electromagnetic-shield effect may be increased.

According to the above-mentioned structure, similarly to Modification Example 1-3, the electrode board 20 is capable of detecting deformation of the flexible display 11 and the first surface 101. Further, the distance between the second conductor layer 40 and the capacitive elements 20s is reduced. The sensor sensitivity of the electrode board 20 may be increased. Further, as shown in FIGS. 20A and 20B and FIGS. 21A and 21B, the second support layer 32 of this modification example may have various kinds of structure.

(Structural Example of Second Support Layer of Modification Example 1-4)

Each of FIGS. 20A and 20B and FIGS. 21A and 21B is a partial cross-sectional view schematically showing the second support layer 32 according to each structural example of this modification example. As shown in FIG. 20A, as described in the second structural example of the support 30, the second support layer 32 may include the elastically-deformable portion 325 made of an elastic material. Also according to such an elastically-deformable portion 325, substantially uniform in-plane deformability may be attained in the front surface 110 of the flexible display 11 and the first surface 101.

Further, as shown in FIG. 20B, the second support layer 32 may include a structural material 326 and a plurality of holes 327. For example, the structural material 326 may be made of a gluing agent, an adhesive agent, another resin material, a film material, or the like. The structural material 326 may be formed on part of the second support layer 32. In this case, second columns or the like may be arranged in the rest area.

For example, the holes 327 are opened in the thickness direction (for example Z-axis direction) of the structural material 326. The holes 327 penetrate through the structural material 326. The shape of the hole 327 is not specifically limited. The holes 327 may not penetrate through the structural material 326. The holes 327 may be in parallel with the layer-surface of the structural material 326 (second support layer 32). Further, many holes 327 may be formed inside the structural material 326, and the structural material 326 may be a porous sheet as a whole.

Alternatively, as shown in FIG. 21A, the second support layer 32 may include a conductive film (structural material) 328 and the plurality of holes 327. The conductive film 328 functions as a structural material made of a conductive material. The conductive film 328 may be bonded to the second conductor layer 40 by using an adhesive agent, a gluing agent, or the like. Also according to the second support layer 32, the support 30 may be deformed easily. Further, the shield effect may be increased by using the second conductor layer 40 and the conductive film 328. Note that the input device 100 (sensor device 1) may not include the back plate 42. In this case, the second surface 102 may be the lower surface of the conductive film 328.

Further, as shown in FIG. 21B, the conductive film (structural material) and the second conductor layer 40 may be integrally structured. In other words, the second support layer 32 may include protrusions 329. The protrusions 329 protrude from the second conductor layer 40. The protrusions 329 function as a structural material made of a conductive material. The second conductor layer 40 and the protrusions 329 are integrally structured as one conductive material plate. The second conductor layer 40 and the protrusions 329 may be formed by preparing a conductive material plate having thin portions. Also according to such a second support layer 32, the support 30 may be deformed easily. Further, according to the second conductor layer 40 and the protrusions 329, the electromagnetic-shield effect may be increased.

Modification Example 1-5

In the above description, a metal foil (first conductor layer 12) is formed on an adhesive resin film (bond layer 13), and the bond layer 13 is attached to the flexible display 11. Alternatively, for example, the first conductor layer 12 may be a metal foil or the like having no resin film. In this case, the bond layer 13 may be a gluing agent, an adhesive agent, or the like, which is used to attach the first conductor layer 12 to the flexible display 11.

In this case, similarly to FIG. 3, the bond layer 13 may be provided on the entire surface of the flexible display 11. With this structure, the entire surface of the first conductor layer 12 is adhered to the entire surface of the flexible display 11 tightly. In addition, uniform sensitivity may be obtained.

Meanwhile, the bond layer 13 may only be formed on the rim of the flexible display 11 and the first conductor layer 12. For example, the bond layer 13 may be formed above the first frame 31b and the second frame 32b. With this structure, the first conductor layer 12 is bonded to the flexible display 11 above the first frame 31b and the second frame 32b. The bonding area of the first frame 31b and the second frame 32b in the Z-axis direction is larger than the bonding area of the first columns 31a and the second columns 32a in the Z-axis direction. In addition, the first frame 31b and the second frame 32b are layered in the Z-axis direction. With this structure, even if a pull-out force is applied to the operated member 10, it is possible, for example, to prevent the first and second columns 31a and 32a from being damaged, and to prevent the electrode board 20 and the columns 31a and 32a from being peeled off.

Alternatively, the bond layer 13 may be formed in the display area of the flexible display 11, i.e., the area including the center portion and excluding the rim. Wiring, a driver, or the like may be mounted on the rim of the flexible display 11, and the rim therefore may have bumps and steps. In this case, if the rim is bonded forcedly, the rim may be damaged. Further, a gap may be generated at the border between the rim and the rest area, and detection sensitivity may be abnormal.

Further, a seal material (not shown) or the like may be provided on the front surface of the flexible display 11, and the flexible display 11 may warp, for example. Also in this case, if the rim is bond forcedly, the flexible display 11 may be damaged. Alternatively, the flexible display 11 may float, and detection sensitivity may be therefore abnormal. In other words, if the flexible display is not bonded to the rim forcedly, it is possible to prevent the flexible display 11 from being damaged, and to prevent detection sensitivity from being abnormal.

Further, the bond layer 13 may have a predetermined plane pattern such as a columnar pattern, a striped pattern, or a lattice pattern, for example. If the bond layer 13 have such a pattern, it is possible to prevent air bubbles from being trapped in the bond layer 13 when the flexible display 11 is bonded to the first conductor layer 12. The yield rate may thus be increased.

Further, if the bond layer 13 has a predetermined plane pattern, the thickness of the bond layer 13 in the Z-axis direction may be smaller than the thickness of the first conductor layer 12. With this structure, the flexible display 11 is bonded to the first conductor layer 12 more reliably. Further, the above-mentioned predetermined pattern may be finer than the arrangement pattern of the first columns 31a. Specifically, the distance between the columns (columnar pattern) or the distance between the adjacent lines (striped pattern, lattice pattern) may be smaller than the distance between the adjacent first columns 31a. For example, the distance between the columns (columnar pattern) or the distance between the adjacent lines (striped pattern, lattice pattern) may be equal to or less than one-tenth of the distance between the adjacent first columns 31a. With this structure, the pattern of the bond layer 13 may not interfere with the size of the first columns 31a, and vice versa. The detection sensitivity may not be ununiform or periodic.

Modification Example 1-6

In the above description, each of the plurality of first electrode wires 210 and the plurality of second electrode wires 220 may be a single electrode wire. In the above description, alternatively, each first electrode wire 210 may be the electrode group 21w including a plurality of electrodes, and each second electrode wire 220 may be the electrode group 22w including a plurality of electrodes. The plurality of first electrode wires 210 and the plurality of second electrode wires 220 may have alternative structures as follows.

FIG. 22A is a plan view schematically showing the structure of the first electrode wires 210. For example, the first electrode wire 210 includes a plurality of electrode units 210m and a plurality of couplers 210n. Each of the plurality of couplers 210n couples the plurality of electrode units 210m. Each electrode unit 210m includes a plurality of sub-electrodes (electrode elements) 210w. The plurality of sub-electrodes 210w are a plurality of electrode elements made of a branched electrode wire. The plurality of sub-electrodes 210w form a regular or irregular pattern. FIG. 22A shows an example in which the plurality of sub-electrodes 210w form a regular pattern. In this example, the plurality of sub-electrodes 210w are linear conductive members extending in the Y-axis direction. The conductive members are arrayed in stripes. The coupler 210n extends in the Y-axis direction, and couples the adjacent electrode units 210m.

FIG. 22B is a plan view schematically showing the structure of the second electrode wire 220. For example, the second electrode wire 220 includes a plurality of electrode units 220m and a plurality of couplers 220n. Each of the plurality of couplers 220n couples the plurality of electrode units 220m. Each electrode unit 220m includes a plurality of sub-electrodes (electrode elements) 220w. The plurality of sub-electrodes 220w form a regular or irregular pattern. FIG. 22B shows an example in which the plurality of sub-electrodes 220w form a regular pattern. In this example, the plurality of sub-electrodes 220w are linear conductive members extending in the X-axis direction. The conductive members are arrayed in stripes. The coupler 220n extends in the X-axis direction, and couples the adjacent electrode units 220m.

Seen in the Z-axis direction, the first electrode wires 210 intersect with the second electrode wires 220 so that the electrode units 210m may face and overlap with the electrode units 220m in the Z-axis direction. The intersection areas are configured to function as the capacitive elements 20s. Note that the structure of each of the electrode units 210m and 220m is not limited to the above-mentioned structure, and the electrode units 210m and 220m may have various kinds of structure.

Each of FIG. 23A to FIG. 23P is a diagram schematically and exemplarily showing the shape of the electrode unit 210m or 220m. Each of FIG. 23A to FIG. 23P shows an example of the electrode unit 210m. The electrode unit 220m may also have such a shape.

In the example of FIG. 23A, the electrode unit 210m is a group of a plurality of linear electrode patterns extending radially from the center. In the example of FIG. 23B, the width of one of the radial linear electrodes of FIG. 23A is larger than the other linear electrodes. With this structure, the amount of change of electrostatic capacitance of the bold linear electrode may be larger than those of the other linear electrodes. Further, in each example of FIG. 23C and FIG. 23D, an annular linear electrode is provided at the approximate center, and linear electrodes extend radially from the annular linear electrode. With this structure, the linear electrodes may not be provided in the center densely, and a low-sensitivity area may not be generated.

Each of FIG. 23E to FIG. 23H shows an example in which a group includes a plurality of annular or hollow-rectangular linear electrodes in combination. With each structure, it is possible to control the density of electrodes, and a low-sensitivity area may not be generated. Further, each of FIG. 23I to FIG. 23L shows an example in which a group includes a plurality of linear electrode arrayed in the X-axis direction or the Y-axis direction in combination. Desired electrode density may be obtained by selecting the shape, the length, the pitch, and the like of the linear electrodes. Further, each of FIG. 23M to FIG. 23P shows an example in which linear electrodes are arranged asymmetrically in the X-axis direction or the Y-axis direction.

The shape of the electrode units 210m of the first electrode wires 210 may be the same as or different from the shape of the electrode units 220m of the second electrode wires 220. The shape of each of the first and second electrode units 210m and 220m is one of the shapes shown in FIG. 22A to FIG. 22B and FIG. 23A to FIG. 23P. Note that the shape of the portion (e.g., couplers 210n and 220n) other than the electrode units 210m and 220m is not specifically limited, and may be linear, for example.

Modification Example 1-7

FIG. 24 is a cross-sectional view schematically showing the input device 100 (sensor device 1) of Modification Example 1-7. As shown in FIG. 24, the operated member 10 may include the protective film 14. The protective film 14 faces the second support layer 32, and is on the first conductor layer 12. In other words, the protective film 14 faces the electrode board 20. The protective film 14 may be an antioxidant resin film or the like. For example, the protective film 14 is applied to the first conductor layer 12, and is thereby formed. Such a protective film 14 may function as a damage-proof and anticorrosion film for the first conductor layer 12. With this structure, the first conductor layer 12 may be more reliable, and the detection accuracy may be kept high.

Modification Example 1-8

In the above description, the electrode board 20 is a laminate including the first wiring board 21, the second wiring board 22, and the bond layer 231 therebetween. The base material 311 of the first support layer 31 is arranged on the first wiring board 21, and the bond layer 232 is interposed therebetween. Alternatively, for example, the following structure may be employed.

Structural Example 1

The input device 100 (sensor device 1) may include an insulative cover layer instead of the base material 311 and the bond layer 232. Such a cover layer may be made of an insulative UV-curable resin or heat-curable resin or the like, for example. The thickness of such a cover layer may be several μm to several hundreds of μm. The cover layer may be a single layer, or may include a plurality of layers. Further, the first columns 31a, the first frame 31b, and the first space 31c of the first support layer 31 are on the cover layer. The first columns 31a and the first frame 31b may be formed by using a screen printing method or a UV molding method, for example. According to this structure, the thickness of the electrode board 20 and the first support layer 31 may be reduced, and the thickness of the entire input device 100 may be reduced.

Structural Example 2

FIG. 25 is a partial cross-sectional view schematically showing Structural Example 2 of this modification example.

As shown in FIG. 25, in this structural example, the insulative layer 24 is provided instead of the first base material 211 and the bond layer 231. In other words, the insulative layer 24 is formed on the second wiring board 22 including the second electrode wires 220, and the first electrode wires 210 are formed on the insulative layer 24. The insulative layer 24 may be made of an insulative UV-curable resin or heat-curable resin, or the like, for example. The thickness of the insulative layer 24 may be several μm to several hundreds of μm. According to this structure, the thickness of the electrode board 20 may be reduced, and the thickness of the entire input device 100 may be reduced. Note that as described above in Structural Example 1, the input device 100 of this structural example may include a cover layer instead of the base material 311 and the bond layer 232.

Structural Example 3

Each of FIGS. 26A and 26B is a partial cross-sectional view schematically showing Structural Example 3 of this modification example. As shown in FIG. 26A, the electrode board 20 of this structural example includes one base material 211. The first electrode wires 210 and the second electrode wires 220 are formed on both the surfaces of the base material 211. In other words, two electrode layers are formed on the base material 211 by means of double-side printing. In this case, as shown in FIG. 26A, the second electrode wires 220 are formed on the base material 211, and the cover layer 25 may be formed on the surface (lower surface) of the base material 211. The cover layer 25 may be made of an insulative UV-curable resin or heat-curable resin or the like, for example. The thickness of the cover layer 25 may be several μm to several hundreds of μm. Alternatively, as shown in FIG. 26B, the first and second electrode wires 210 and 220 are formed on both the surfaces of the first base material 211, respectively, the second base material 221 may be formed on the lower surface of the first base material 211, and the bond layer 231 is interposed therebetween. Further, the bond layer 233 may not be provided, and the second conductor layer 40 may be formed on the lower surface of the second base material 221 directly (not shown). Note that as described above in Structural Example 1, the input device 100 of this structural example may include a cover layer instead of the base material 311 and the bond layer 232.

Structural Example 4

Each of FIGS. 27A and 27B is a partial cross-sectional view schematically showing Structural Example 4 of this modification example. As shown in FIGS. 27A and 27B, the electrode board 20 of this structural example includes the first wiring board 21, the second wiring board 22, and the bond layer 231. The first wiring board 21 includes the first electrode wires 210 and the first base material 211. The second wiring board 22 includes the second electrode wires 220 and the second base material 221. The structures of FIGS. 27A and 27B are similar to the structure of FIG. 3 or the like except for the direction of the second wiring board 22 with respect to the first wiring board 21. In other words, the second electrode wires 220 faces not the bond layer 231 but the second conductor layer 40. In this case, as shown in FIG. 27A, the insulative cover layer 25 may be formed on the lower surface of the second base material 221. Alternatively, as shown in FIG. 27B, the third base material 251 may be formed on the lower surface of the second base material 221, and the bond layer 234 may be interposed therebetween. Further, the bond layer 233 bonding the third base material 251 and the second conductor layer 40 may not be provided, and the second conductor layer 40 may be formed on the lower surface of the third base material 251 directly (not shown). Note that, as described above in Structural Example 1, the input device 100 of this structural example may include an insulative cover layer instead of the base material 311 and the bond layer 232.

Modification Example 1-9

FIG. 28 is a partial cross-sectional view schematically showing the input device 100 (sensor device 1) of Modification Example 1-9. The electrode board 20 may electrostatically detect change of the distance between the first conductor layer 12 and the second conductor layer 40 based on the amount of change of capacitively-coupling on the XY plane. In this case, the electrode board 20 includes the one base material 211. The plurality of first electrode wires (X electrodes) 210 and the plurality of second electrode wires (Y electrodes) 220 are arranged on the base material 211. The plurality of X electrodes 210 and Y electrodes 220 are on the same plane.

With reference to FIG. 29A, an example of the structure of the X electrodes 210 will be described. With reference to FIG. 29B, an example of the structure of the Y electrodes 220 will be described. In this example, each X electrode 210 includes a plurality of pectinate electrode units (first electrode units) 210m. Each Y electrode 220 includes a plurality of pectinate electrode units (second electrode units) 220m. One electrode unit 210m and one electrode unit 220m forms one capacitive element 20s.

As shown in FIG. 29A, the X electrode 210 includes the plurality of electrode units 210m, the electrode wire 210p, and the plurality of connectors 210z. The electrode wire 210p extends in the Y-axis direction. The plurality of electrode units 210m are arranged in the Y-axis direction at a regular interval. The electrode wire 210p is distant from the electrode unit 210m at a predetermined interval. The connector 210z connects the electrode wire 210p and the electrode unit 210m.

As described above, the electrode unit 210m is pectinate as a whole. Specifically, the electrode unit 210m includes the plurality of sub-electrodes 210w and the coupler 210y. The plurality of sub-electrodes 210w extend in the X-axis direction. A sub-electrode 210w is distant from the adjacent sub-electrode 210w at a predetermined interval. One end of each of the plurality of sub-electrodes 210w is connected to the coupler 210y. The coupler 210y extends in the X-axis direction.

As shown in FIG. 29B, the Y electrode 220 includes the plurality of electrode units 220m, the electrode wire 220p, and the plurality of connectors 220z. The electrode wire 220p extends in the X-axis direction. The plurality of electrode units 220m are arranged in the X-axis direction at a regular interval. The electrode wire 220p is distant from the electrode unit 220m at a predetermined interval. The connector 220z connects the electrode wire 220p and the electrode unit 220m. Note that the connectors 220z may not be provided, and the electrode units 220m may be provided on the electrode wire 220p directly.

As described above, the electrode unit 220m is pectinate as a whole. Specifically, the electrode unit 220m includes the plurality of sub-electrodes 220w and the coupler 220y. The plurality of sub-electrodes 220w extend in the X-axis direction. A sub-electrode 210w is distant from the adjacent the sub-electrodes 220w at a predetermined interval. One end of each of the plurality of sub-electrodes 220w is connected to the coupler 220y. The coupler 220y extends in the Y-axis direction.

As shown in FIG. 30A, each electrode unit 210m is in combination with each electrode unit 220m. Each capacitive element 20s is formed in the combination area. The plurality of sub-electrodes 210w of the electrode unit 210m and the plurality of sub-electrodes 220w of the electrode unit 220m are alternately arrayed in the Y-axis direction. In other words, each sub-electrode 210w faces each sub-electrode 220w in the in-plane direction (for example Y-axis direction) of the electrode board 20.

FIG. 30B is a cross-sectional view seen in the A-A direction of FIG. 30A. Similarly to the first embodiment, the Y electrodes 220 intersect with the X electrodes 210. The Y electrodes 220 and the X electrodes 210 are on the same plane. In view of this, as shown in FIG. 30B, in the area in which the X electrode 210 intersects with the Y electrode 220, each X electrode 210 does not directly touch each Y electrode 220. In other words, the insulative layer 220r is on the electrode wire 210p of the X electrode 210. Further, the jumper wiring 220q crosses the insulative layer 220r. The jumper wiring 220q couples the electrode wires 220p together.

FIG. 31 is a cross-sectional view schematically illustrating the structure of the capacitive elements 20s of this embodiment. In the example of FIG. 31, in the capacitive elements 20s, the sub-electrodes 210w1 capacitively-couples with the sub-electrode 220w1, the sub-electrode 220w1 capacitively-couples with the sub-electrode 210w2, the sub-electrode 210w2 capacitively-couples with the sub-electrode 220w2, the sub-electrode 220w2 capacitively-couples with the sub-electrode 210w3, and the sub-electrode 210w3 capacitively-couples with the sub-electrode 220w3. In other words, the base material 211 functions as a dielectric layer. Each electrostatic capacitance C11, C12, C13, C14, and C15 of each sub-electrode is changeable depending on capacitively-coupling between at least one of the first conductor layer 12 and the second conductor layer 40 and the first and second electrode wires 210 and 220 including the sub-electrodes.

With this structure, it is not necessary to provide a second base material and a bond layer of an electrode board, and the thickness of the input device 100 may be reduced. Further, many sub-electrodes capacitively-couple with each other, and the distance between the capacitively-coupling sub-electrodes may be reduced. As a result, the capacitive-coupling amount of the input device 100 as a whole may be increased, and detection sensitivity may be increased.

Modification Example 1-10

According to the input device 100 of Modification Example 1-10, one of the X electrode 210 and the Y electrode 220 may be an electrode group including a plurality of electrodes, and the other may be a plate electrode.

The support 30 connects the first surface 101 with the electrode board 20. According to this structure, ones of the X electrodes 210 and the Y electrodes 220, which are at the second surface 102 side (for example Y electrodes 220), may be a plate electrode. In this case, the input device 100 (sensor device 1) may not include a second conductor layer. Further, the input device 100 may include a back plate made of an insulating or conductive material instead of a second conductor layer. With this structure, stiffness of the entire device may be kept higher.

Alternatively, the support 30 connects the second surface 102 to the electrode board 20. According to this structure, ones of the X electrodes 210 and the Y electrodes 220, which are at the first surface 101 side (for example X electrodes 210) may be a plate electrode. In this case, the input device 100 (sensor device 1) may not include a first conductor layer.

The plate X electrode 210 or Y electrode 220 is connected to a drive (pulse-input side) terminal of the controller 610, for example. The electrode may be switched between a drive-pulse potential (detecting mode) and for example a ground potential (standby mode). As a result, the input device 100 may shield external noise (external electric field). In short, the input device 100 is capable of shielding external noise even if it does not include a first conductor layer or a second conductor layer. As a result, the structure may be simplified, and productivity may be increased. Note that the X electrodes 210 or the Y electrodes 220 may be connected to the ground potential irrespective of the detecting mode or the standby mode.

Modification Example 1-11

Each of FIGS. 32A and 32B is a partial cross-sectional view schematically showing the input device 100 (sensor device 1) of Modification Example 1-11. As shown in FIGS. 32A and 32B, the second support layer 32 may include the structural material 326 and the plurality of holes 327. The structural material 326 may be made of a gluing agent, an adhesive agent, another resin material, a film material, or the like, for example.

For example, the holes 327 open in the thickness direction (for example Z-axis direction) of the structural material 326. The holes 327 may penetrate through the structural material 326. The shape of each of the plurality of holes 327 is not specifically limited. The plurality of holes 327 may be independent of each other. Alternatively, the plurality of holes 327 may be connected to each other. For example, if the plurality of holes 327 are independent of each other, when the operated member 10 and the like are touched or the like and deformed, the operated member 10 and the like are return to the original shape more rapidly, affected by atmospheric pressure of the holes 327. Responsivity of the sensor is high. If the plurality of holes 327 are connected to each other, when the operated member 10 is pushed or the like and largely deformed, the atmospheric pressure of the holes 327 does not rise. Sensor sensitivity or the like may not be reduced.

As shown in FIG. 32A, each first column 31a and each hole 327 may be between the adjacent capacitive elements 20s. With this structure, the structural material 326, which has relatively high permittivity, may be above each capacitive element 20s. Sensor sensitivity may be high.

Alternatively, as shown in FIG. 32B, each first column 31a and each hole 327 may be above each capacitive element 20s. Further, the first support layer 31 may include a structural material and a plurality of holes, and the second support layer 32 may include a second support (not shown).

The Second Embodiment

FIG. 33 is a partial cross-sectional view schematically showing the input device 100B (sensor device 1B) of a second embodiment of the present technology. According to this embodiment, the input device 100B is different from the input device 100 in that the support 30B includes not only the first support layer 31B and the second support layer 32B but also the third support layer 33B. Further, the electrode board 20B is flexible as a whole. The structure is similar to the structure of the first embodiment except for the support 30B and the electrode board 20B. So description thereof will be omitted arbitrarily. FIG. 33 corresponds to FIG. 3 of the first embodiment.

(Entire Structure)

The input device 100B of this embodiment includes the flexible display 11 similar to that of the first embodiment, and the sensor device 1B. The sensor device 1B includes the first surface 101B, the second surface (third surface) 102B, the electrode board 20B, the support 30B, the first conductor layer (conductor layer) 12, and the second conductor layer 40. In this embodiment, the flexible display 11 is part of the operated member 10 of the input device 100B. In other words, the input device 100B includes the operated member 10, the second surface (third surface) 102B, the electrode board 20B, the support 30B, and the second conductor layer 40. Similar to the first embodiment, the input device 100B may include the control unit 50, and may be mounted on the electronic apparatus 60.

The first surface 101B is deformable. The second surface 102B faces the first surface 101B. The electrode board 20 is between the first surface 101B and the second surface 102B. The plurality of capacitive elements 20Bs are arranged in a matrix. The support 30B includes the first support layer 31B, the second support layer 32B, the third support layer 33B, and the bond layer 34B. The first support layer 31B includes the plurality of first columns 31Ba. The second support layer 32B includes the plurality of second columns 32Ba, and is layered on the first support layer 31B. The third support layer 33B includes the plurality of third columns 33Ba. The support 30B is deformable following deformation of the first surface 101B. The support 30B connects the first surface 101B to the electrode board 20B, and connects the second surface 102B to the electrode board 20B.

(Electrode Board)

The schematic structure of the electrode board 20B is similar to that of the electrode board 20. In other words, the electrode board 20B is a laminate including the first wiring board 21B and the second wiring board 22B. As a whole, the electrode board 20B includes the first main surface 20Ba and the second main surface 20Bb, and has a board shape. The first main surface 20Ba is the top surface in the Z-axis direction, and may be formed on the bond layer 232B (described below). The second main surface 20Bb is the lower surface in the Z-axis direction, and may be formed on the bond layer 233B.

The first wiring board 21B includes the flexible first base material 211B and the plurality of first electrode wires (X electrodes) 210 similar to those of the first embodiments. The first base material 211B is made of a flexible sheet material, for example, and is specifically an electric-insulation plastic sheet (film) or the like made of PET, PEN, PC, PMMA, polyimide, or the like.

The second wiring board 22B includes the flexible second base material 221B, and the plurality of second electrode wires (Y electrodes) 220 similar to those of the first embodiments. Similarly to the first base material 211B, the second base material 221B is made of a flexible sheet material, for example, and is specifically an electric-insulation plastic sheet (film) or the like made of PET, PEN, PC, PMMA, polyimide, or the like.

Similarly to the first embodiment, the first electrode wires 210 and the second electrode wires 220 may have various kinds of structure. For example, similarly to Modification Example 1-9, the X electrodes 210 and the Y electrodes 220 may be on the same plane. Alternatively, similarly to Modification Example 1-10, one of the X electrode 210 and Y electrode 220 may be an electrode group including a plurality of electrodes, and the other may be a plate electrode. In this embodiment, irrespective of the structure of the support 30B, one of the X electrode 210 and the Y electrode 220 may be a plate electrode. Alternatively, both the X electrode 210 and the Y electrode 220 may be plate electrodes.

Further, the electrode board 20B includes the bond layer 231B and the bond layer 232B. The bond layer 231B bonds the first wiring board 21B and the second wiring board 22B. The bond layer 232B bonds the first wiring board 21B and the base material 331B of the third support layer 33B (described below). Each bond layer 231B, 232B is electrical-insulative, and is made of an adhesive material or the like such as a cured adhesive agent or an adhesive tape, for example.

(Second Conductor Layer)

The structure of the second conductor layer 40 may be similar to that of the first embodiment except that the second conductor layer 40 is connected to the support layer 30B. With this structure, for example, the second conductor layer 40 may also function as a support plate for the input device 100B, and may have bending stiffness higher than that of the operated member 10 and the electrode board 20B, for example.

(Support)

The support 30B includes the first support layer 31B, the second support layer 32B, the third support layer 33B, and the bond layer 34B. The support 30B connects the first surface 101B to the electrode board 20, and connects the second surface 102B to the electrode board 20.

The first support layer 31B and the second support layer 32B are on the electrode board 20B. Here, the situation "the first support layer 31B and the second support layer 32B are on the electrode board 20B" means that the first support layer 31B and the second support layer 32B are layered on one of the first main surface 20Ba and the second main surface 20Bb of the electrode board 20B. In the following description, the first support layer 31B and the second support layer 32B are layered on the second main surface 20Bb.

The first support layer 31B is on the second main surface 20Bb of the electrode board 20B. The first support layer 31B includes the plurality of first columns 31Ba, the first frame 31Bb, and the second space 31Bc. The structure of the first support layer 31B may be similar to that of the first support layer 31. For example, the first columns 31Ba and the first frame 31Bb may be formed on the second wiring board 22B of the electrode board 20B directly.

The second support layer 32B is between the first support layer 31B (bond layer 34B) and the second conductor layer 40. The second support layer 32B includes the plurality of second columns 32Ba, the second frame 32Bb, and the second space 32Bc. For example, the structure of the second support layer 32B may be similar to that of Structural Example 1 of Modification Example 1-1 of the first embodiment. In other words, the second columns 32Ba may include a plurality of adjacent second columnar members (not shown).

The bond layer 34B bonds the first support layer 31B and the second support layer 32B, and is deformable.

The third support layer 33B faces the first support layer 31B and the second support layer 32B. The electrode board 20B is interposed between the third support layer 33B and the first and second support layers 31B and 32B. For example, the third support layer 33B is on the first main surface 20Ba of the electrode board 20B. The third support layer 33B includes the plurality of third columns 33Ba, the third frame 33Bb, and the third space 33Bc.

For example, the structure of the third support layer 33B is similar to that of the second support layer 32 of the first embodiment. In other words, the third support layer 33B has a layer structure including the base material 331B, the structural layer 332B, and the plurality of bonds 333B. The structural layer 332B is on the front surface (top surface) of the base material 331B. The plurality of bonds 333B are on the predetermined positions of the structural layer 332B. The structure of the base material 331B is similar to that of the base material 311. The structure of the structural layer 332B is similar to that of the structural layer 321. The structure of the bonds 333B is similar to that of the bonds 322.

The first and second columns 31Ba, 32Ba are arranged similarly to the first embodiment. For example, as shown in FIGS. 11A and 11B, each second column 32Ba may face each capacitive element 20Bs, and may be between the adjacent first columns 31Ba. Alternatively, each first column 31Ba may face each capacitive element 20Bs, and may be between the adjacent second columns 32Ba.

Each third column 33Ba may be between the adjacent first columns 31Ba. For example, each third column 33Ba may face each capacitive element 20Bs and each second column 32Ba in the Z-axis direction.

(Effect of Support)

When the third column 33Ba is pressed downward, the third column 33Ba is displaced downward largely, and the electrode board 20B is also flexibly-deformed downward. The reason is as follows. The first column 31Ba is below the electrode board 20B, and is above the bond layer 34B and the second space 32Bc. The first column 31Ba is therefore downwardly displaceable. Accordingly, the distance between the first conductor layer 12 and the second conductor layer 40, and the capacitive elements 20Bs is changed. The electrode board 20B is capable of detecting the pressure force and the operated position.

Meanwhile, when the third space 33Bc is pressed downward, the first conductor layer 12 near the operated position is flexibly-deformed downward. Along with that, the third columns 33Ba around the third space 33Bc are displaced downward, and the electrode board 20B is also flexibly-deformed downward. So, also in this case, the distance between the first conductor layer 12 and the second conductor layer 40, and the capacitive elements 20Bs is changed. The electrode board 20B is capable of detecting the pressure force and the operated position.

As described above, also in this embodiment, the first support layer 31B is layered on the second support layer 32B, and the deformable bond layer 34B is interposed therebetween. In addition, each first column 31Ba is between the adjacent second columns 32Ba, and between the adjacent third columns 33Ba. In other words, at least one of the first space 31Bc, the second space 32Bc, and the third space 33Bc is below the area-to-be-operated in the plane of the flexible display 11 and the first surface 101B. The flexible display 11 and the first surface 101B are flexibly-deformable downward. So also according to in this embodiment, the front surface 110 of the flexible display 11 and the first surface 101B may be deformed more uniformly in the plane. It is possible to keep the in-plane uniformity of the sensor sensitivity high.

Further, in this embodiment, the support 30B connects the first surface 101B to the electrode board 20B, and connects the second surface 102B to the electrode board 20B. So the electrode board 20B is capable of detecting the pressure force and the operated position based on both change of the distance from the first conductor layer 12 and change of the distance from the second conductor layer 40. With this structure, sensor sensitivity of the sensor device 1B (input device 100B) may be high.

Hereinafter, modification examples of this embodiment will be described. The structures similar to the above-mentioned structures are denoted by the same referential symbols, and description thereof will be omitted.

Modification Example 2-1

Each of FIGS. 34A and 34B is a partial cross-sectional view schematically showing the input device 100B (sensor device 1B) of Modification Example 2-1. As shown in FIGS. 34A and 34B, the second conductor layer (conductor layer) 40 may be between the first support layer 31B and the second support layer 32B, and may be deformable. In this case, the support 30B may not include a bond layer. The first support layer 31B may be bonded to the second support layer 32B, and the second conductor layer 40 may be interposed therebetween. The second conductor layer 40 may be any deformable conductive sheet material. For example, the second conductor layer 40 may be an oxide conductor such as conductive ITO (indium tin oxide), an organic conductor such as carbon nanotube, a resin sheet with a metal thin film, a metal foil such as for example Cu (copper), Al (aluminum), or stainless steel (SUS), a mesh material, a conductive rubber sheet, or the like.

Further, as shown in FIG. 34A, the input device 100B (sensor device 1) may include the back plate 42B. The back plate 42B has the second surface 102B, and is connected to the second support layer 32B. The back plate 42B may be made of an insulative material or a conductive material. The back plate 42 is necessary to have enough stiffness as a support plate for the input device 100B (sensor device 1B).

Alternatively, as shown in FIG. 34B, the second conductor layer 40 may include a plurality of second conductor layers. In other words, the second conductor layer 40 may include a second conductor layer 40a and a second conductor layer 40b. The second conductor layer 40a is between the first support layer 31B and the second support layer 32B. The second conductor layer 40b is below the second support layer 32B. The second conductor layer 40b has the second surface 102B. With this structure, the electromagnetic-shield effect may be increased.

The input device 100B (sensor device 1B) of this modification example behaves as follows. For example, when the operated member 10 above the third column 33Ba is pressed, the electrode board 20B is flexibly-deformed downward. Further, the first column 31Ba is also displaced downward. As a result, the second conductor layer 40 (second conductor layer 40a) is deformed. The distance between the first conductor layer 12 and the electrode board 20B is changed, and the distance between the second conductor layer 40 (second conductor layer 40a) and the electrode board 20B is changed. Meanwhile, when the operated member 10 above the third space 33Bc is pressed, the third columns 33Ba is also displaced downward. In addition, the electrode board 20B is also deformed and displaced downward. As a result, the first columns 31Ba are displaced downward, and the second conductor layer 40 (second conductor layer 40a) is deformed. As a result, the distance between the second conductor layer 40 and the electrode board 20B is changed.

According to this modification example, the distance between the second conductor layer 40 and the capacitive elements 20Bs may be reduced, and electrostatic capacitance thereof may be increased. As a result, sensor sensitivity of the electrode board 20B may be increased. Further, in this modification example, similarly to the first embodiment, the second support layer 32B may have various kinds of structure.

(Structural Examples of Second Support Layer of Modification Example 2-1)

Each of FIGS. 35A and 35B and FIGS. 36A and 36B is a partial cross-sectional view schematically showing the second support layer 32B according to each structural example of this modification example. As shown in FIG. 35A, the second support layer 32B may include the elastically-deformable portion 325B made of an elastic material similar to the elastically-deformable portion 325 of the first embodiment. Also according to the elastically-deformable portion 325B, substantially uniform in-plane deformability may be attained in the front surface 110 of the flexible display 11 and the first surface 101B.

Further, as shown in FIG. 35B, the second support layer 32B may include the structural material 326B and the plurality of holes 327B similar to the structural material 326 and the plurality of holes 327 of the first embodiment. For example, the structural material 326B may be made of a gluing agent, an adhesive agent, another resin material, a film material, or the like. The structural material 326B may be formed on part of the second support layer 32B. In this case, second columns or the like may be arranged in the rest area. For example, the holes 327B are opened in the thickness direction (for example Z-axis direction) of the structural material 326B (second support layer 32B). The holes 327B penetrate through the structural material 326B. The shape of the hole 327B is not specifically limited. The holes 327B may not penetrate through the structural material 326B. The holes 327B may be in parallel with the layer-surface of the second support layer 32B. Further, many holes 327B may be formed inside the structural material 326B, and the structural material 326B may be a porous sheet as a whole.

Alternatively, as shown in FIG. 36A, the second support layer 32B may include a conductive film 328B and the plurality of holes 327B similar to the conductive film 328 and the plurality of holes 327 of the first embodiment. The conductive film 328B may be bonded to the second conductor layer 40 by using an adhesive agent, a gluing agent, or the like. Also according to the second support layer 32B, the support 30B may be deformed easily. Further, the shield effect may be increased by using the second conductor layer 40 and the conductive film 328B.

Further, as shown in FIG. 36B, the second support layer 32B may include protrusions 329B similar to the protrusions 329 of the first embodiment. The protrusions 329B protrude from the second conductor layer 40. In other words, the second conductor layer 40 and the protrusions 329B are integrally structured as one conductive material plate. The second conductor layer 40 and the protrusions 329B may be formed by preparing a conductive material plate having thin portions. Also according to such a second support layer 32B, the support 30B may be deformed easily. Further, according to the second conductor layer 40 and the protrusions 329B, the electromagnetic-shield effect may be increased.

Modification Example 2-2

In Modification Example 2-2, the third support layer 33B may have various kinds of structure similar to the second support layer 32B. For example, the third columns of the third support layer 33B may be a plurality of third columnar members. Alternatively, the third support layer 33B may have an elastically-deformable portion similar to the elastically-deformable portion 325B, or may have a structural material and holes similar to the structural material 326B and the holes 327B.

Modification Example 2-3

In Modification Example 2-3, the support 30B may be arranged differently from the above description. In other words, the first support layer 31B and the second support layer 32B are at the first main surface 20Ba side of the electrode board 20B, and the third support layer 33B may be at the second main surface 20Bb side.

Modification Example 2-4

FIG. 37 is a partial cross-sectional view schematically showing the input device 100B (sensor device 1B) of Modification Example 2-4. As shown in FIG. 37, the arrangement of the input device 100B (sensor device 1B) is similar to that of Modification Example 2-3. In addition, the first conductor layer 12 may be between the first support layer 31B and the second support layer 32B. Further, each first column 31Ba of the first support layer 31B may be above each capacitive element 20s, for example. Each third column 33Ba of the third support layer 33B may be between the adjacent capacitive elements 20s, for example. Further, each first column 31Ba may include a plurality of columnar members (not shown). Alternatively, each first column 31Ba may be between the adjacent capacitive elements 20s, and each third column 33Ba may be above each capacitive element 20s (not shown). Further, as shown in FIG. 37, the second support layer 32B may include the elastically-deformable portion 325B.

In this modification example, the input device 100B (sensor device 1B) behaves as follows. In other words, for example, when the flexible display 11 between the adjacent first columns 31Ba is pressed, the elastically-deformable portion 325B is deformed, the first columns 31Ba therearound are displaced downward, and the electrode board 20B is flexibly-deformed. As a result, the distance between the second conductor layer 40 and the electrode board 20B is changed, and the electrode board 20B may detect deformation of the front surface 110 (first surface 101B). Meanwhile, for example, when the front surface 110 (first surface 101B) above a first column 31Ba is pressed, the first columns 31Ba is displaced downward, and the electrode board 20B is flexibly-deformed. As a result, the distance between the second conductor layer 40 and the electrode board 20B is changed, and the electrode board 20B may detect deformation of the front surface 110 (first surface 101B).

Modification Example 2-5

In Modification Example 2-5, the second conductor layer 40 may be structured as follows.

Figure 38A:
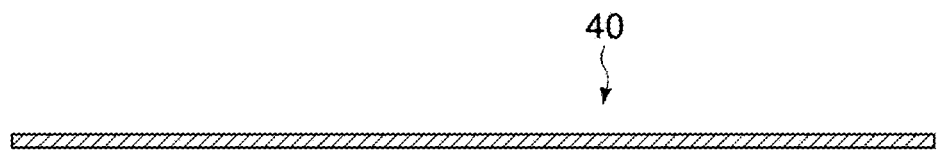
Figure 38B:
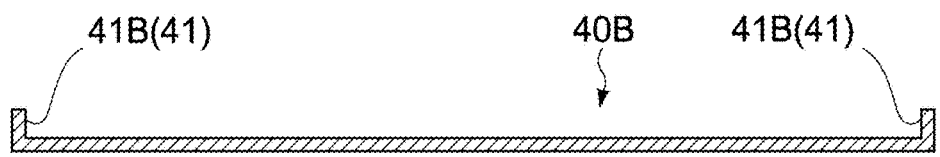
Figure 38C:
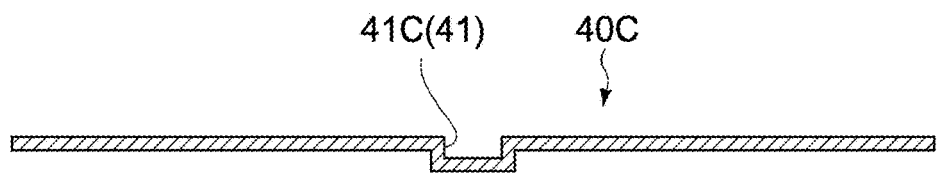
Figure 38D:
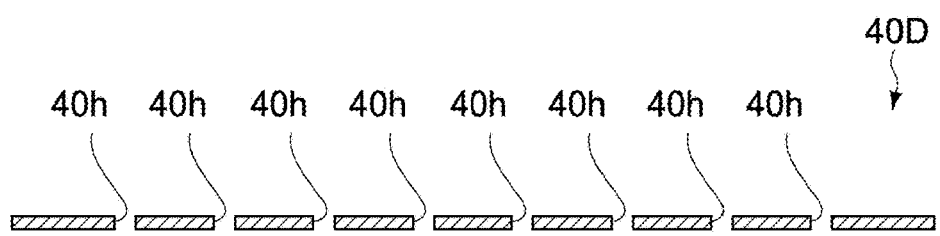
Figure 38E:
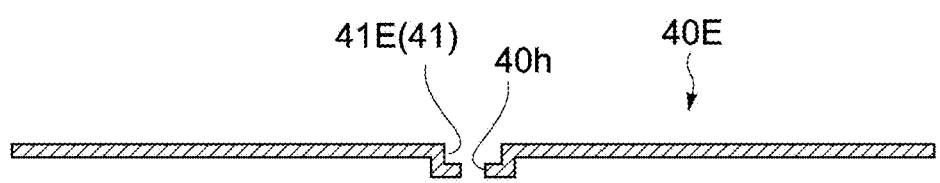

Each of FIGS. 38A to 38E is a cross-sectional view schematically showing the second conductor layer 40 according to each structural example. As shown in FIG. 38A, the second conductor layer 40 may be a flat plate. Alternatively, as shown in FIGS. 38B, 38C, and 38E, the second conductor layer 40 may include the steps 41. Alternatively, as shown in FIG. 38D, the second conductor layer 40 may be a mesh including the openings 40h.

For example, as shown in FIG. 38B, the second conductor layer 40B includes the steps 41B. The rims are bent upward in the Z-axis direction, and the steps 41B are thereby formed. As shown in each of FIGS. 38C and 38E, the second conductor layer 40C, 40E includes the steps 41C, 41E at the center. The steps 41C, 41E are depressed downward. Such steps 41 may increase bending stiffness of the second conductor layer 40 in the Z-axis direction.

Further, as shown in each of FIG. 38D and FIG. 38E, the second conductor layer 40D, 40E includes the opening(s) 40h. Because the second conductor layer 40 includes the opening(s) 40h, both stiffness and heat-radiation performance may be high. As a result, the input device 100 may have a less trouble, reliably may be increased. Further, because the second conductor layer 40 includes the opening(s) 40h, the volume of the second conductor layer 40 is reduced and the weight of the input device 100 is reduced. Further, when the volume of the second space 32c is changed due to deformation, air is likely to flow in the opening(s) 40h. As a result, a response time of the electrode board 20B is reduced. Here, the response time means a time between change of weight applied to the operated member 10 and actual change of the capacitance of the sensor device 1.

The planer shape of each opening 40h is a polygon such as a triangle or a rectangle, a circle, an ellipse, an oval, an irregular shape, a slit, or the like. All the openings 40h may have the same kind of shape. Alternatively, the openings 40h may have two or more kinds of shapes.

Further, if the second conductor layer 40 has the plurality of openings 40h, the arrangement pattern of the plurality of openings 40h is not specifically limited. For example, the arrangement pattern of the plurality of openings 40h may be a regular pattern. With this structure, detection sensitivity may be more uniform. Further, the regular pattern may be one of a one-dimensional arrangement and a two-dimensional arrangement. For example, the pattern may be a mesh of FIG. 38D. Alternatively, the plurality of openings 40h may be arrayed in stripes, or may be arrayed in a geometric pattern as a whole. Specifically, the plurality of openings 40h are arranged as follows.

Each of FIGS. 39A and 39B is a plan view schematically and exemplarily showing the arrangement of the openings 40h of the second conductor layer 40, the first, second, and third columns 31Ba, 32Ba, and 33Ba, and the first and second electrode wires 210 and 220. Further, each opening 40h is an oval in the example of FIG. 39A, and each opening 40h is a circle in FIG. 39B. In FIGS. 39A and 39B, the plurality of openings 40h surround each capacitive element 20Bs, seen in the Z-axis direction. Further, the plurality of openings 40h are shifted from the second and third columns 32Ba and 33Ba in the in-plane (XY plane) direction. With this structure, the plurality of openings 40h are not overlapped with the first, second, and third columns 31Ba, 32Ba, and 33Ba and the capacitive elements 20Bs in the Z-axis direction.

Further, as shown in FIGS. 39A and 39B, for example, the openings 40h do not face the capacitive elements 20Bs. In other words, the openings 40h are shifted from the capacitive elements 20Bs in the in-plane (XY plane) direction. With this structure, the openings 40h are not overlapped with the capacitive elements 20Bs in the Z-axis direction. With this structure, the capacitance-change rate and the initial capacitance of the capacitive elements 20Bs are less changed than the arrangement in which the openings 40h of the second conductor layer 40 face the capacitive elements 20Bs. Detection sensitivity of the input device 100B may be more uniform.

The openings 40h may be arranged approximately at the same interval as that of the capacitive elements 20Bs. For example, the openings 40h are symmetric about the center of each capacitive element 20Bs. Specifically, the openings 40h are axisymmetric about the center line of each of the first and second electrode wires 210, 220. Also with this structure, detection sensitivity of the input device 100B may be uniform.

Other Modification Examples

This embodiment may employ not only the structures of Modification Examples 2-1 to 2-5, but also the structures similar to those of Modification Examples 1-5, 1-6, 1-7, 1-8, 1-9, and 1-10 of the first embodiment.

Third Embodiment

FIG. 40 is a partial cross-sectional view schematically showing the input device 100C (sensor device 1C) of a third embodiment of the present technology. The input device 100C of this embodiment is different from the input device 100 of the first embodiment in that the second support layer 32C of the support 30C is in the electrode board 20C. Note that in the following description, the structures similar to the structures of the first embodiment are denoted by the same referential symbols, and description thereof will be omitted.

The input device 100C includes a flexible display 11 and a sensor device 1C. The flexible display 11 receives operation input by a user. The sensor device 1 is configured to detect operation input by a user. The input device 100C is structured as for example a flexible touchscreen display, and built in the above-mentioned electronic apparatus. Each of the sensor device 1 and the flexible display 11 is a plate extending in the directions orthogonal to the Z axis.

In this embodiment, the flexible display 11 is part of the operated member 10C of the input device 100C. In other words, the input device 100C includes the operated member 10C, the second surface (third surface) 102C, the electrode board 20C, the support 30C, and the second conductor layer 40.

Further, the sensor device 1C includes a first surface 101C, a second surface (third surface) 102C, an electrode board 20C, a support 30C, a first conductor layer (conductor layer) 12, and a second conductor layer 40. The sensor device 1C is at the back surface 120 side of the flexible display 11.

The first surface 101C is deformable. The second surface 102C faces the first surface 101C. The electrode board 20C is between the first surface 101C and the second surface 102C. A plurality of capacitive elements 20Cs are arranged in a matrix in the electrode board 20C. The support 30C includes a first support layer 31C and a second support layer 32C. The first support layer 31C includes a plurality of first columns 31Ca. The second support layer 32C is layered on the first support layer 31C. The support 30C is deformable following deformation of the first surface 101C. The support 30C connects at least one of the first surface 101C and the second surface 102C, and the electrode board 20C.

In this embodiment, the sensor device 1C (input device 100C) is characterized in that the second support layer 32C of the support 30C is arranged in the electrode board 20C, and in that the support 30C connects one of the first surface 101C and the second surface 102C, and the electrode board 20C. In the following description, the support 30C connects the first surface 101C and the electrode board 20C.

(Electrode Board)

The electrode board 20C is a laminate including a first wiring the board 21C and a second wiring board 22C. The first wiring the board 21C includes the plurality of first electrode wires 210C. The second wiring board 22C includes a plurality of second electrode wires 220C. As a whole, the electrode board 20C is a board including a first main surface 20Ca and a second main surface 20Cb. The first main surface 20Ca is the top surface in the Z-axis direction, and may be formed on a bond layer 232C (described below). The second main surface 20Cb is the lower surface in the Z-axis direction, and may be formed on the bond layer 233C (described below).

The structure of the first wiring the board 21C is similar to the structure of the first wiring board 21. The first wiring the board 21C includes a first base material 211C and a plurality of first electrode wires (X electrodes) 210C. The first base material 211C is for example a sheet material made of a resin material or the like. Note that the structure of the plurality of first electrode wires 210C is not specifically limited, as described in the first embodiment. For example, each of the plurality of first electrode wires 210C may be a single electrode wire. Alternatively, the first electrode wire 210C may be an electrode group (see FIGS. 28 to 31) including a plurality of electrodes arrayed in the X-axis direction.

Meanwhile, the structure of the second wiring board 22C is similar to the structure of the second wiring board 22. The second wiring board 22C includes a second base material 221C and a plurality of second electrode wires (Y electrodes) 220C. Similarly to the first base material 211C, for example, the second base material 221C is made of a sheet material made of a resin material or the like. Note that the structure of the plurality of second electrode wires 220C is not specifically limited, as described in the first embodiment. For example, each of the plurality of second electrode wires 220C may be a single electrode wire. Alternatively, the second electrode wire 220C may be an electrode group (see FIGS. 28 to 31) including a plurality of electrodes arrayed in the Y-axis direction.

The capacitive elements 20Cs are formed in the intersection areas of the first electrode wires 210C and the second electrode wires 220C. The capacitive element 20Cs is a mutual-capacitive-type capacitive element. The capacitive element 20Cs includes the first electrode wires 210C, the second electrode wires 220C, and a dielectric layer. The first electrode wires 210C face the second electrode wires 220C in the Z-axis direction. The dielectric layer is between the first and second electrode wires 210C and 220C.

The electrode board 20C includes a bond layer 231C, a bond layer 232C, and a bond layer 233C. The bond layer 231C bonds the first wiring the board 21C and the second wiring board 22C. The bond layer 232C bonds the first wiring the board 21C and the base material 311C of the first support layer 31C (described below). The bond layer 233C bonds the second wiring board 22C and the second conductor layer 40C. Each bond layer 231C, 232C, or 233C is electrical-insulative, and is an adhesive material or the like such as a cured adhesive agent or an adhesive tape, for example.

Here, in this embodiment, the bond layer 232C functions as the second support layer 32C. Hereinafter, the support 30C will be described.

(Support)

The support 30C is on the first main surface 20Ca of the electrode board 20C. The support 30C connects the first surface 101C of the first conductor layer 12C and the electrode board 20C. The support 30C may include a plurality of support layers. In this embodiment, the support 30C includes the first support layer 31C and the second support layer 32C. The second support layer 32C is layered on the first support layer 31C. Note that the situation "the second support layer 32C is layered on the first support layer 31C" also means the situation in which the second support layer 32C is layered on the first support layer 31C and is below the first support layer 31C in the Z-axis direction.

The first support layer 31C is on the first main surface 20Ca of the electrode board 20C. In this embodiment, the first support layer 31C is layered on the second support layer 32C in the electrode board 20C. The schematic structure of the first support layer 31C is similar to the schematic structure of the first support layer 31. The first support layer 31C includes the plurality of first columns 31Ca, a first frame 31Cb, a first space 31Cc, and the base material 311C. In this embodiment, the first support layer 31C is bonded to the electrode board 20C, and the base material 311C is on the electrode board 20C).

The plurality of first columns 31Ca are arranged corresponding to the capacitive elements 20Cs, respectively. In this embodiment, for example, the plurality of first columns 31Ca are between the plurality of adjacent capacitive elements 20Cs, respectively.

The first frame 31Cb surrounds the first support layer 31C along the rim of the electrode board 20Cs. The length of the first frame 31Cb in the short-side direction, i.e., the width, is not specifically limited as long as the first support layer 31C and the entire input device 100C have enough strength.

Further, the first space 31Cc is around the plurality of first columns 31Ca. The first space 31Cc is a space area around the first columns 31Ca and the first frame 31Cb. In this embodiment, the capacitive elements 20Cs and the second columns 32Ca are in the first space 31Cc seen in the Z-axis direction.

The specific structure of the first support layer 31C is not specifically limited. The structure of the first support layer 31C may be similar to that of the first support layer 31 or the second support layer 32 of the first embodiment.

The second support layer 32C includes the second space 32Cc. The second space 32Cc is in the bond layer 232C of the electrode board 20C. For example, the second space 32Cc includes holes of the bond layer 232C. The holes are between the plurality of first electrode wires 210C. Each hole faces each first column 31Ca in the Z-axis direction.

(Effect of Support)

For example, when the front surface 110 above a first column 31Ca is pressed, the second space 32Cc is compressed, and the first column 31Ca is displaced downward largely. As a result, the distance between the first conductor layer 12 and the capacitive elements 20Cs is changed. It is therefore possible to detect the operated position, the pressure force, and the like.

Meanwhile, when the front surface 110 above the first space 31Cc is pressed, also, the first surface 101C (first conductor layer 12) is deformed, and the first columns 31Ca are then displaced downward. As a result, the distance between the first conductor layer 12 and the capacitive elements 20Cs is changed. It is therefore possible to detect the operated position, the pressure force, and the like.

As described above, also according to this embodiment, substantially uniform in-plane deformability may be attained in the front surface 110 of the flexible display (first surface 101). It is possible to keep the in-plane uniformity of the sensor sensitivity high.

Further, in this embodiment, the second support layer 32C is in the electrode board 20C. So the total thickness of the sensor device 1C may be smaller. As a result, the sensor device 1C (input device 100C) may be downsized.

Further, electrostatic capacitance of the first conductor layer 12 and the capacitive elements 20Cs is in inverse proportion to the distance between the first conductor layer 12 and the capacitive elements 20Cs of the electrode board 20C. According to this embodiment, the distance between the first conductor layer 12 and the capacitive elements 20Cs of the electrode board 20C may be reduced, and the electrostatic capacitance may be high. So sensor sensitivity may be increased.

Note that the arrangement of the second space 32Cc of the second support layer 32C is not limited to the above as long as the second space 32Cc is around the plurality of capacitive elements 20Cs of the electrode board 20C and faces the first columns 31Ca. Hereinafter, a modification example of this embodiment will be described.

Modification Example

A layer other than the bond layer 232C may include the second space 32Cc of the second support layer 32C. The bond layer 231C or the board 21C may include the second space 32Cc. Further, two of or all of the bond layer 232C, the bond layer 231C, and the board 21C may include the second space 32Cc. In this case, the electrode board 20C may be flexible.

Alternatively, the electrode board 20C may include an insulative layer instead of the first base material 211C and the bond layer 231C (see Structural Example 2 of Modification Example 1-8). In this case, the insulative layer may include the second space 32Cc of the second support layer 32C.

Further, an elastic material may fill the second space 32Cc of the second support layer 32C. In this case, the elastic material is any kind of deformable material, whose stiffness is lower than that of the adhesive material or the like of the bond layer 232Cc. For example, a sponge material, a microcell polymer sheet, a porous sheet, a cushion material, a rubber material, a gel material including shock-absorbing gel or the like, or the like may be used.

Further, the support 30C may include a third support layer (not shown). The third support layer is on the second main surface 20Cb of the electrode board 20C. The third support layer may include third columns, a third space, and a third frame. The third columns may face the first columns 31Ca and the second space 32Cc in the Z-axis direction. With this structure, also, as described in the second embodiment, the front surface 110 of the flexible display 11 and the first surface 101 may be deformed more uniformly in the plane. It is possible to keep the in-plane uniformity of the sensor sensitivity high. Further, sensor sensitivity of the sensor device 1C (input device 100C) may be high.

Fourth Embodiment

FIG. 41 is a cross-sectional view schematically showing the input device 100D according to a fourth embodiment of the present technology. The structure of the input device 100D of this embodiment is similar to that of the first embodiment except for the operated member 10D. Description thereof will be omitted arbitrarily. FIG. 41 is a diagram corresponding to FIG. 1 of the first embodiment.

(Entire Structure)

The input device 100D of this embodiment includes not a flexible display, but the flexible sheet 11D and the sensor device 1 similar to that of the first embodiment. The flexible sheet 11D includes the plurality of key areas 111D (described below). The input device 100A is used as a keyboard device as a whole.

(Input Device)

The flexible sheet 11D is a flexible insulative plastic sheet made of PET (polyethylene terephthalate), PEN (polyethylene naphthalate), PMMA (polymethylmethacrylate), PC (polycarbonate), PI (polyimide), or the like, for example. The thickness of the flexible sheet 11D is not specifically limited, and is about several tens of μm to several hundreds of μm, for example.

Note that the flexible sheet 11D may not be a single layer, but may include two or more layered sheets. In this case, the flexible sheet 11D may include not only the plastic sheet, but also a flexible insulative plastic sheet (base material) layered thereon, for example. The plastic sheet may be made of PET, PEN, PMMA, PC, PI, or the like.

The flexible sheet 11D includes the front surface (first surface) 110D and the back surface (second surface) 120D. The front surface (first surface) 110D is a surface-to-be-operated. The back surface (second surface) 120D is opposite to the front surface 110D. The plurality of key areas 111D are arrayed on the front surface 110D. Meanwhile, the first conductor layer 12 is layered on the back surface 120D.

For example, a metal foil may be previously attached to the front surface of a resin sheet, and this composite sheet may function as the flexible sheet 11D and the first conductor layer 12. Alternatively, a vapor-deposited film, a sputtered film, or the like may be formed on the back surface 120D, as the first conductor layer 12. Alternatively, a coated film made of a conductive paste or the like may be printed on the back surface 120D, as the first conductor layer 12.

Each key area 111D is a key top, and is to be pressed by a user. The shape and the size of each key area 111D depends on the kind of the key. An arbitrary key symbol may be printed on each key area 111D. Each key symbol may show one or both of the kind and the position (shape) of each key. The key symbols may be printed by using arbitrary printing method such as screen printing, flexographic printing, or gravure printing, for example.

The front surface 110D includes the grooves 112D around the key areas 111D. The concavo-convex surface as the key areas 111D may be formed by an arbitrary processing technology such as press forming, etching, or laser processing. Alternatively, the flexible sheet 11D having the concavo-convex surface may be formed by a molding technology such as injection molding.

Further, the structure of the flexible sheet 11D is not limited to the above-mentioned example. For example, each of FIGS. 42A and 42B is a diagram schematically showing the flexible sheet 11D according to each modification example. In the example of FIG. 42A, the flexible sheet 11Da includes the flat front surface 110D. In this case, key areas (not shown) may be formed by printing or the like. Alternatively, the front surface 110D may not include key areas but function as a touch sensor. Further, as shown in FIG. 42B, the flexible sheet 11D is pressed (press molding) or the like, and the flexible sheet 11Db is thereby formed. The key areas 111Db are deformable in the vertical direction (thickness direction of sheet) independently.

Further, the flexible sheet 11D may be made of a conductive material such as metal. With this structure, it is not necessary to provide the first conductor layer 12, and the thickness of the operated member 10D may be reduced. In this case, the flexible sheet 11D also functions as the first conductor layer 12, and is connected to the ground potential, for example.

In this embodiment, a user presses the center of each key area 111D to operate each key. In view of this, the first and second columns 31a and 32a and the capacitive elements 20s may be arranged as follows.

Arrangement Example 1

For example, as shown in FIG. 41, each second column 32a may be below each key area 111D, and each first column 31a may be below each groove 112D. Each second column 32a is between the adjacent first columns 31a. In this case, the capacitive elements 20s overlap with the second columns 32a seen in the Z-axis direction.

In Arrangement Example 1, a user presses the position above each second column 32a, i.e., above the first space 31c (see FIG. 3), to operate a key. As a result, as described with reference to FIG. 14A, the first conductor layer 12 comes close to the capacitive elements 20s. Electrostatic capacitance of the capacitive elements 20s may be changed.

Further, each first column 31a is not necessarily a cylinder or the like. For example, each first column 31a may form a wall along each groove 112D. In this case, the first column 31a is along the border between the plurality of key areas 111D.

Arrangement Example 2

Further, as shown in FIG. 43, each second column 32a may be below each groove 112D, and each first column 31a may be below each key area 111D. The first columns 31a are between the adjacent second columns 32a. In this case, the capacitive elements 20s overlap with the first columns 31a seen in the Z-axis direction.

Also according to Arrangement Example 2, as described with reference to FIG. 14B, a user presses the second space 32c (see FIG. 3) when he operates a key. Then the first conductor layer 12 comes close to the capacitive elements 20s. Electrostatic capacitance of the capacitive elements 20s may be changed. Note that the arrangement of the capacitive elements 20s is not limited to the above. For example, the capacitive elements 20s may overlap with the second columns 32a.

Arrangement Example 3

Further, as shown in FIG. 44, the first columns 31a and the second columns 32a may be arranged irrespective of the key areas 111D or the grooves 112D. In this case, the capacitive elements 20s are arranged irrespective of the key areas 111D seen in the Z-axis direction.

Also according to Arrangement Example 3, as described with reference to FIG. 14B, a user presses each key area 111D to operate the key. Then the first conductor layer 12 comes close to the capacitive elements 20s. Electrostatic capacitance of the capacitive elements 20s may be changed. The operated position on the XY coordinate system is calculated, and the key area 111D allocated to the operated position is determined. As a result, the pressed position is determined, and information input by pressing the key is determined.

As described above, the control unit 50 includes the calculator 51 and the signal generator 52. The control unit 50 is electrically connected to the electrode board 20. Further, in this embodiment, the control unit 50 is capable of generating information on operation input in each key area 111D based on output from the plurality of capacitive elements 20s. In other words, the calculator 51 calculates the operated position on the XY coordinate system of the front surface 110 (first surface 101) based on electric signals (input signals) output from the first and second electrode wires 210 and 220 of the electrode board 20. The calculator 51 determines the key area 111D allocated to the operated position. The signal generator 52 generates the operation signal corresponding to the detected pressed key area 111D.

The input device 100D is embedded in an electronic apparatus such as a laptop personal computer or a mobile phone. In this case, the input device 100D may be used as a keyboard device, as described above. Further, the input device 100D may include a communication unit (not shown). In this case, the input device 100D may be electrically connected to another electronic apparatus such as a personal computer wiredly or wirelessly. A user may input operation in the input device 100D to control the electronic apparatus.

Further, as described in the first embodiment, the input device 100D may be also used as a pointing device. In other words, the calculator 51 distinguishes between touch operation and push operation based on two or more levels of threshold of output from each capacitive element 20s. With this configuration, the input device may function as both a pointing device and a keyboard.

Modification Examples

FIG. 45A is a plan view showing an arrangement example of the first columns 31a. FIG. 45B is a plan view showing an arrangement example of the second columns 32a. In this modification example, the plurality of first columns 31a and the plurality of second columns 32a are arranged depending on the plurality of key areas 111D (described below). Further, the shapes of the plurality of first columns 31a are different from each other depending on the arrangement of the plurality of first columns 31a. Also, the shapes of the plurality of second columns 32a are different from each other depending on the arrangement of the plurality of second columns 32a. Further, the first columns 31ae out of the first columns 31a of FIG. 45A overlap with the second columns 32ae out of the second columns 32a of FIG. 45B, seen in the Z-axis direction.

FIG. 46A is a plan view showing a structural example of the plurality of X electrodes 210. FIG. 46B is a plan view showing a structural example of the plurality of Y electrodes 220. As shown in FIG. 46A, each X electrode 210 includes the plurality of electrode units 210m. The electrode units 210m are connected to each other in the Y-axis direction by using electrode wires. Each electrode unit 210m includes a plurality of sub-electrodes, and corresponds to each key area 111D. Meanwhile, as shown in FIG. 46B, each Y electrode 220 includes the electrode group 22w. The electrode group 22w includes a plurality of electrode wires extending in the X-axis direction. The intersection areas between the electrode units 210m of the X electrodes 210 and the electrode groups 22w of the Y electrodes 220 function as the capacitive elements 20s. Each capacitive element 20s corresponds to each key area 111D. Note that, alternatively, each X electrode 210 may be an electrode group including a plurality of electrodes, and each Y electrode 220 may include a plurality of electrode units.

In this modification example, the intersections of the sub-electrodes of the electrode unit 210m and the electrode wires of the electrode groups 22w concentrate on the centers of the key areas 111D. With this structure, detection sensitivity may be increased when each key area 111D is pressed.

FIG. 47 is an enlarged plan view showing an arrangement example of the first columns 31a and the second columns 32a, and showing one key area 111D. In FIG. 47, for convenience, the first columns 31a are denoted by referential symbols s1 to s9, and the second columns 32a are denoted by referential symbols u1 to u10.

As shown in FIG. 47, the first column s8 faces the second column u9 in the Z-axis direction, and they are on one side (chain double-dashed line) in the Y-axis direction around the key area 111D. The first column s4 faces the second column u10 in the Z-axis direction, and they are on the other side (chain double-dashed line) in the Y-axis direction around the key area 111D. As described above, the first columns 31a overlap with the second columns 32a in the Z-axis direction. In this overlapping area, the distance between the first conductor layer 12 (second conductor layer 40) and the electrode board 20 is changed less, and detection sensitivity of the sensor is low. Further, in this area, when one key area 111D is pressed, deformation of the flexible sheet 11D (first conductor layer 12) and the electrode board 20 is not likely to be transmitted to the other key areas 111D. In view of the above, the first column s8 and the second column u9, which face each other in the Z-axis direction, and the first column s4 and the second column u10, which face each other in the Z-axis direction, are arranged around the key area 111D. With this structure, malfunction of the key areas 111D specifically adjacent in the X-axis direction may be prevented from occurring.

Note that first columns and second columns, which are on the sides in the X-axis direction around the key area 111D, may face each other. Specifically, second columns may be provided above the first columns s1 to s3 and s5 to s7, respectively. In this case, malfunction of the key areas 111D adjacent in the Y-axis direction may be prevented from occurring.

Further, as shown in FIG. 47, the plurality of second columns u5 to u8 are arranged in the key area 111D. The second columns u5 to u8 do not overlap with the first columns. As described above, such second columns u5 to u8 deform the flexible sheet 11D (key area 111D) and the electrode board 20 effectively. With this structure, detection sensitivity inside the key area 111D may be increased.

If only one second column is arranged in the key area 111D, when a user presses an area distant from the second column, the flexible sheet 11D and the electrode board 20 may not be deformed effectively. Especially if a user presses the key area 111D with a fingernail, a stylus, or the like, sensitivity may be variable depending on the pressed position of the key area 111D because the touched area is small. To the contrary, according to this modification example, the plurality of second columns u5 to u8 are arranged symmetrically in the key area 111D. So detection sensitivity may be kept high irrespective of an operated position in the key area 111D or irrespective of the area touched with a stylus.

Further, the intersections of the sub-electrodes of the electrode unit 210m and the electrode wires of the electrode groups 22w may concentrate on the area (area surrounded by chain dashed line of FIG. 47) defined by the second columns u5 to u8 and the vicinity thereof. With this structure, detection sensitivity may be further increased when a user presses the key area 111D.

The first column s9 is arranged at the approximate center of the key area 111D. If no column is arranged at the center of the key area 111D, the amount of deformation of the flexible sheet 11D and the electrode board 20 at the center may be larger than that of the rim. As a result, detection sensitivity at the center of the key area 111D may be different from that of the rim. In view of this, if the first column s9 is arranged at the approximate center of the key area 111D, detection sensitivity at the center of the key area 111D may be the same as that of the rim.

Meanwhile, the first columns s1 to s3 and s5 to s7 do not overlap with the second columns u1 to u4 around the key area 111D. The first and second columns s1 to s3, s5 to s7, and u1 to u4 are larger than the first and second columns s9 and u5 to u8 inside the key area 111D. With this structure, the first and second columns are bonded to the electrode board 20, the flexible sheet 11D, and the like more strongly. Strength of the entire input device 100D may be increased. Further, the portion around the key area 111D is deformed less, and malfunction of the key area 111D may be prevented from occurring.

Further, as shown in FIG. 47, preferably, the first and second columns around the key area 111D are distant from each other. If first and second columns surround the key area 111D with no space therebetween, the inner pressure of the first space 31c and the second space 32c inside the key area 111D may be increased. The flexible sheet 11D and the electrode board 20 may recover from deformation slowly, or detection sensitivity may be decreased. In view of this, the first and second columns are arranged separately. With this structure, air may move freely in the first space 31c and the second space 32c, and detection sensitivity may not be decreased.

Note that, in the above description, the input device 100D includes the flexible sheet 11D, and the sensor device 1 similar to that of the first embodiment. Alternatively, the input device 100D may include the sensor device 1B similar to that of the second embodiment or the sensor device 1C similar to that of the third embodiment instead of the sensor device 1.

Fifth Embodiment

FIG. 48 is a cross-sectional view schematically showing the electronic apparatus 60E, which includes the input device 100E of a fifth embodiment of the present technology. The structure of the input device 100E of this embodiment is similar to that of the first embodiment except for the operated member 10E. Description thereof will be omitted arbitrarily.

According to the input device 100E of this embodiment, part of the case 620E of the electronic apparatus 60E functions as part of the operated member 10E. In other words, the input device 100E includes the operation area 625E and the sensor device 1 similar to that of the first embodiment. The operation area 625E shares part with the case 620E. For example, the electronic apparatus 60E may be a personal computer or the like including a touch sensor.

The operated member 10E has a layer structure including the operation area 625E and the first conductor layer 12. The operation area 625E is deformable, and includes the front surface (first surface) 110E and the back surface (second surface) 120E. In other words, the front surface 110E is one front surface of the case 620E, and the back surface 120E is the back surface (inner surface) opposite to the front surface.

The operation area 625E may be made of a material same as the material of the rest part of the case 620E, for example. For example, the operation area 625E may be made of a conductive material such as an aluminum alloy or a magnesium alloy, or a plastic material. In this case, the thickness of the operation area 625E may be selected such that it is deformable when a user touches or pushes the operation area 625E. Alternatively, the material of the operation area 625E may be different from the material of the rest part of the case 620E. In this case, stiffness of the material of the operation area 625E may be smaller than that of the rest part.

Further, the first conductor layer 12 is formed on the back surface 120E, and the adhesive bond layer 13 is interposed therebetween. The first conductor layer 12 is a metal foil or the like. Note that if the operation area 625E is made of a conductive material, it is not necessary to provide the first conductor layer 12, and the thickness of the operated member 10E may be reduced. In this case, the operation area 625E also functions as the first conductor layer 12, and is connected to the ground potential, for example.

As described above, according to this embodiment, the input device 100E is part of the case 620E made of a conductive material or the like. Such an input device 100E is realized because, as described above, the input device 100E detects input operation not based on capacitively-coupling of a stylus and X and Y electrodes, but based on capacitively-coupling of the first conductor layer 12 pressed by a stylus and the capacitive elements 20s. With this structure, according to the input device 100E, the number of parts of the electronic apparatus 60E is reduced, and productivity may be further increased.

Further, the input device 100E of this embodiment includes the sensor device 1 similar to that of the first embodiment. With this structure, the input device 100E may detect the operated position and the pressure force accurately even if the pressure force is very small. So according to this embodiment, the operation area 625E may be made of a large variety of materials, and detection sensitivity of the input device 100E may be high.

Note that, in the above description, the input device 100E includes the sensor device 1 similar to that of the first embodiment. Alternatively, the input device 100E may include the sensor device 1B similar to that of the second embodiment or the sensor device 1C similar to that of the third embodiment instead of the sensor device 1.

Sixth Embodiment

FIG. 49A is a perspective view exemplarily showing the outer appearance of the input device 100F (sensor device 1F) of a sixth embodiment of the present technology. FIG. 49B is an enlarged cross-sectional view of the input device 100F (sensor device 1F) seen in the B-B direction of FIG. 49A. The input device 100F of the sixth embodiment is a cylinder as a whole. So the front surface 110F (operation input surface) is a cylindrical surface. The structure of the input device 100F is similar to that of the input device 100 of the first embodiment except for the front surface 110F.

The electrode board 20F includes the plurality of capacitive elements 20Fs. The plurality of capacitive elements 20Fs are arrayed two-dimensionally in the in-plane direction of the cylinder. In the example of FIG. 49A, the plurality of capacitive elements 20Fs are arrayed two-dimensionally in the circumferential direction and the axial direction (height direction) of the cylindrical electrode board 20F. Further, in the example of FIG. 49A, the first and second frames 31Fb, 32Fb are arranged on the vertical edges of the cylinder in the circumferential direction. With this structure, strength of the entire input device 100F may be increased.

As shown in FIG. 49B, the front surface 110 (110F) of the input device 100 of FIG. 1 is bent outward, and the input device 100F of this embodiment is thereby formed. In other words, the input device 100F includes the operated member 10F, the second conductor layer 40F, the electrode board 20F, and the support 30F. The operated member 10F includes the first conductor layer 12F. The operated member 10F, the second conductor layer 40F, the electrode board 20F, and the support 30F are cylindrically bent, and the input device 100F is thereby formed.

Detection sensitivity of the input device 100F having this structure may be increased when operation is input in the front surface 110F. The input device 100F may be used as a touch sensor or a keyboard device. Note that the shape of the entire input device 100F may not be limited to a cylinder. Alternatively, for example, the entire input device 100F may be a flat cylinder or a rectangular parallelepiped. Further, in the example of FIG. 49A, the first and second frames 31Fb, 32Fb are only arranged on the vertical edges of the cylinder in the circumferential direction. Alternatively, the first and second frames 31Fb, 32Fb may be arranged along the vertical direction (height direction of cylinder). With this structure, the first and second frames 31Fb, 32Fb may support the input device 100F more tightly.

Further, the sensor device 1F is capable of detecting deformation (bending, distortion, and the like) of the first surface 101F. So the sensor device 1F may be used as a motion sensor. In other words, the sensor device 1F is capable of detecting motion of a user wearing the sensor device 1F and detecting behavior of an apparatus including the sensor device 1F. For example, if the sensor device 1F is a wearable sensor device such as a bracelet, a user can wear the sensor device 1F. In this case, the input device 100F is capable of detecting not only touch operation and push operation but also various types of gesture operation. As described above, according to this embodiment, a user may input a larger variety of operation in the input device 100F.

Modification Example 6-1

FIG. 50A is a perspective view exemplarily showing the structure of the input device 100F of Modification Example 6-1. The input device 100F of this modification example is curved as a whole. In other words, a rectangular input device is curved, and the input device 100F is thereby formed. So the front surface 110F (operation input surface) is curved. Further, the electrode board (not shown) includes the plurality of capacitive elements 20Fs arrayed two-dimensionally in the in-plane direction of the cylinder. Note that the shape of the entire input device 100F is not limited to the example of FIG. 50A, and the input device 100F may be curved in a desired manner.

Modification Example 6-2

FIG. 50B is a perspective view exemplarily showing the structure of the input device 100F of Modification Example 6-2. According to the input device 100F of this modification example, two semicircular sensor devices are connected, and one input device 100F is thereby formed. In other words, the input device 100F includes two detection areas 200, i.e., two sensor devices, and is a cylinder as a whole. Note that the number of the detection areas 200 is not limited. The input device 100F may include three or more detection areas 200. Further, the shape of the entire input device 100F is not limited to a cylinder. For example, the input device 100F may be a rectangular parallelepiped, and may include four detection areas 200 as the side surfaces.

Other Modification Examples

In the above description, the front surface 110 (110F) of the input device 100 of FIG. 1 is curved outward, and the input device 100F is thereby formed. Alternatively, the input device 100B of the second embodiment or the input device 100C of the third embodiment may be curved instead of the input device 100.

Embodiments of the present technology have been described above. The present technology is not limited to the above-mentioned embodiments. As a matter of course, the above-mentioned embodiments may be variously modified within the scope of the present technology.

For example, in the above-mentioned embodiments, the sensor device is capable of detecting operation input by pressing the front surface of the operated member. Alternatively, similarly to the sensor device 1F of Modification Example 6-3, the sensor device may detect deformation (bending, distortion, and the like) of the first surface of the sensor device. In other words, the sensor device is capable of detecting not only touch operation and push operation but also a larger variety of deformation of the first surface of the sensor device.

Further, the structure of the sensor device is not limited to a plate or the structure described in the sixth embodiment. Alternatively, for example, the first surface may be a plate having an irregular shape. In other words, the sensor device of the present technology may have a flexible shape as a whole. So the sensor device of the present technology has a high degree of freedom for implementation or mounting.

Further, in the above-mentioned embodiments, the capacitive elements are beneath the first columns. Alternatively, for example, the capacitive elements may face the second columns. Alternatively, the capacitive elements may not face both the first and second columns. Also with this structure, similar to the above-mentioned embodiments, the operated position and the pressure force may be detected with great accuracy.

In the above-mentioned embodiments, the capacitive elements are mutual-capacitive-type capacitive elements. Alternatively, the capacitive elements may be self-capacitive-type capacitive elements. In this case, it is possible to detect input operation based on the amount of change of electrostatic capacitance of the first conductor layer and the second conductor layer, and the electrode layer of the capacitive elements.

The structures of the first, second, and third support layers are not limited to the above-mentioned structures. For example, an elastic material or the like may be filled in all or part of the first, second, and third space. The filled elastic material or the like is not specifically limited as long as the electrode board, the operated member, and the like may be deformed freely. Alternatively, the first, second, and third support layers may not include the first, second, and third frames, respectively. Further, the shapes of the first, second, and third columns are not specifically limited. Each of the first, second, and third columns may be a cylinder, a rectangular parallelepiped, or a truncated cone, for example.

Further, the support may not include a bond layer. For example, the first column may be formed on the elastically-deformable portion of the second support layer directly.

Note that the present technology may employ the following structures.

(1) A sensor device, including:
    a deformable first surface;
    a second surface facing the first surface;
    an electrode board between the first surface and the second surface, the electrode board including a plurality of capacitive elements arranged in a matrix;
    a support including a first support layer and a second support layer, the first support layer including a plurality of first columns, the second support layer being layered on the first support layer, the support being deformable following deformation of the first surface, the support connecting at least one of the first surface and the second surface to the electrode board; and
    a conductor layer supported by the support.

(2) The sensor device according to (1), in which
    the support is on the electrode board.

(3) The sensor device according to (2), in which
    the support connects the first surface and the electrode board.

(4) The sensor device according to (2) or (3), in which
    the conductor layer is deformable.

(5) The sensor device according to (4), in which
    the conductor layer includes the first surface.

(6) The sensor device according to (4), in which
    the conductor layer is between the first support layer and the second support layer.

(7) The sensor device according to (2), further including:
    a conductor layer including the second surface, in which
    the support connects the second surface to the electrode board, and
    the electrode board is deformable.

(8) The sensor device according to any one of (2) to (7), in which
    the second support layer includes a plurality of second columns between the plurality of first columns.

(9) The sensor device according to any one of (2) to (8), in which
    the second support layer includes an elastically-deformable portion made of an elastic material.

(10) The sensor device according to any one of (2) to (9), in which
    the second support layer includes a structural material and a plurality of holes, the structural material including the plurality of holes.

(11) The sensor device according to (10), in which
    the structural material is made of a conductive material.

(12) The sensor device according to (1), in which
    the first support layer and the second support layer are on the electrode board,
    the electrode board is deformable, and
    the support further includes a third support layer, the third support layer facing the first support layer and the second support layer, the electrode board being interposed between the third support layer and the first and second support layers, the support connecting the first and second surfaces and the electrode board.

(13) The sensor device according to (12), in which
    the conductor layer is between the first support layer and the second support layer, the conductor layer being deformable.

(14) The sensor device according to (12) or (14), in which
    the third support layer includes a plurality of third columns, the plurality of third columns being capable of arranged between the plurality of first columns.

(15) The sensor device according to any one of (12) to (14), in which
the second support layer includes a plurality of second columns, the plurality of second columns being capable of arranged between the plurality of first columns.

(16) The sensor device according to any one of (12) to (15), in which
the second support layer includes an elastically-deformable portion made of an elastic material.

(17) The sensor device according to any one of (12) to (16), in which
the second support layer includes a structural material and a plurality of holes, the structural material including the plurality of holes.

(18) The sensor device according to (1), in which
the electrode board includes the second support layer.

(19) An input device, including:
an operated member including a first surface and a second surface, the first surface receiving operation from a user, the second surface being opposite to the first surface, the operated member being deformable, the operated member being a sheet;
a third surface facing the second surface;
an electrode board between the second surface and the third surface, the electrode board including a plurality of capacitive elements arranged in a matrix;
a support including a first support layer and a second support layer, the first support layer including a plurality of first columns, the second support layer being layered on the first support layer, the support connecting at least one of the second surface and the third surface to the electrode board, the support being deformable following deformation of the operated member; and
a conductor layer supported by the support.

(20) An electronic apparatus, including:
an operated member including a first surface and a second surface, the first surface receiving operation from a user, the second surface being opposite to the first surface, the operated member being deformable, the operated member being a sheet;
a third surface facing the second surface;
an electrode board between the second surface and the third surface, the electrode board including a plurality of capacitive elements arranged in a matrix;
a support including a first support layer and a second support layer, the first support layer including a plurality of first columns, the second support layer being layered on the first support layer, the support connecting at least one of the second surface and the third surface to the electrode board, the support being deformable following deformation of the operated member;
a conductor layer supported by the support; and
a controller including a control unit, the control unit being electrically connected to the electrode board, the control unit being capable of generating information on operation input in the operated member based on output from the electrode board.

It should be understood by those skilled in the art that various modifications, combinations, sub-combinations and alterations may occur depending on design requirements and other factors insofar as they are within the scope of the appended claims or the equivalents thereof.

What is claimed is:
1. A sensor device, comprising:
a deformable first surface;
a second surface facing the deformable first surface;
an electrode board between the deformable first surface and the second surface, the electrode board including a plurality of capacitive elements arranged in a matrix;
a support apparatus including a first support layer and a second support layer, the first support layer including a plurality of first columns, the second support layer being layered on the first support layer, the support apparatus being deformable following deformation of the deformable first surface, the support apparatus connecting at least one of the deformable first surface and the second surface to the electrode board, wherein the support apparatus connects the deformable first surface and the electrode board; and
a conductor layer supported by the support apparatus, wherein the support apparatus is between the electrode board and the conductor layer.

2. The sensor device according to claim 1, wherein
the support apparatus is on the electrode board.

3. The sensor device according to claim 2, wherein
the conductor layer is deformable.

4. The sensor device according to claim 3, wherein
the conductor layer includes the deformable first surface.

5. The sensor device according to claim 3, wherein
the conductor layer is between the first support layer and the second support layer.

6. The sensor device according to claim 2, further comprising:
a conductor layer including the second surface, wherein
the support apparatus connects the second surface to the electrode board, and the electrode board is deformable.

7. The sensor device according to claim 2, wherein
the second support layer includes a plurality of second columns between the plurality of first columns.

8. The sensor device according to claim 2, wherein
the second support layer includes an elastically-deformable portion made of an elastic material.

9. The sensor device according to claim 2, wherein
the second support layer includes a structural material and a plurality of holes, the structural material including the plurality of holes.

10. The sensor device according to claim 9, wherein
the structural material is made of a conductive material.

11. The sensor device according to claim 1, wherein
the first support layer and the second support layer are on the electrode board,
the electrode board is deformable, and
the support apparatus further includes a third support layer, the third support layer facing the first support layer and the second support layer, the electrode board being interposed between the third support layer and the first and second support layers, the support apparatus connecting the first and second surfaces and the electrode board.

12. The sensor device according to claim 11, wherein
the conductor layer is between the first support layer and the second support layer, the conductor layer being deformable.

13. The sensor device according to claim 11, wherein
the third support layer includes a plurality of third columns, the plurality of third columns being capable of arranged between the plurality of first columns.

14. The sensor device according to claim 11, wherein
the second support layer includes a plurality of second columns, the plurality of second columns being capable of arranged between the plurality of first columns.

15. The sensor device according to claim 11, wherein the second support layer includes an elastically-deformable portion made of an elastic material.

16. The sensor device according to claim 11, wherein the second support layer includes a structural material and a plurality of holes, the structural material including the plurality of holes.

17. The sensor device according to claim 1, wherein the electrode board includes the second support layer.

18. An input device, comprising:
an operated apparatus including a first surface and a second surface, the first surface receiving operation from a user, the second surface being opposite to the first surface, the operated apparatus being deformable, the operated apparatus being a sheet;
a third surface facing the second surface;
an electrode board between the second surface and the third surface, the electrode board including a plurality of capacitive elements arranged in a matrix;
a support apparatus including a first support layer and a second support layer, the first support layer including a plurality of first columns, the second support layer being layered on the first support layer, the support apparatus connecting at least one of the second surface and the third surface to the electrode board, the support apparatus being deformable following deformation of the operated apparatus, wherein the support apparatus connects the operated apparatus and the electrode board; and
a conductor layer supported by the support apparatus, wherein the support apparatus is between the electrode board and the conductor layer.

19. An electronic apparatus, comprising:
an operated apparatus including a first surface and a second surface, the first surface receiving operation from a user, the second surface being opposite to the first surface, the operated apparatus being deformable, the operated apparatus being a sheet;
a third surface facing the second surface;
an electrode board between the second surface and the third surface, the electrode board including a plurality of capacitive elements arranged in a matrix;
a support apparatus including a first support layer and a second support layer, the first support layer including a plurality of first columns, the second support layer being layered on the first support layer, the support apparatus connecting at least one of the second surface and the third surface to the electrode board, the support apparatus being deformable following deformation of the operated apparatus, wherein the support apparatus connects the operated apparatus and the electrode board;
a conductor layer supported by the support apparatus; and
a controller, the controller being electrically connected to the electrode board, the controller being capable of generating information on operation input in the operated apparatus based on output from the electrode board,
wherein the support apparatus is between the electrode board and the conductor layer.

20. The electronic apparatus according to claim 19, wherein
the second support layer is layered directly on the first support layer.

* * * * *